(12) United States Patent
Kodama et al.

(10) Patent No.: US 9,211,616 B2
(45) Date of Patent: Dec. 15, 2015

(54) METHOD OF CONSTRUCTING MANUFACTURE SYSTEM

(75) Inventors: Seigo Kodama, Yatomi (JP); Noriaki Iwaki, Hekinan (JP)

(73) Assignee: FUJI MACHINE MFG. CO., LTD., Chiryu-shi (JP)

(*) Notice: Subject to any disclaimer, the term of this patent is extended or adjusted under 35 U.S.C. 154(b) by 300 days.

(21) Appl. No.: 13/818,398

(22) PCT Filed: Jun. 29, 2011

(86) PCT No.: PCT/JP2011/064985
§ 371 (c)(1),
(2), (4) Date: Feb. 22, 2013

(87) PCT Pub. No.: WO2012/032833
PCT Pub. Date: Mar. 15, 2012

(65) Prior Publication Data
US 2013/0145597 A1    Jun. 13, 2013

(30) Foreign Application Priority Data

Sep. 8, 2010 (JP) ................ 2010-200622

(51) Int. Cl.
*G05B 19/418* (2006.01)
*B23P 21/00* (2006.01)
(Continued)

(52) U.S. Cl.
CPC ........... *B23P 21/00* (2013.01); *G05B 19/41805* (2013.01); *G05B 2219/31031* (2013.01);
(Continued)

(58) Field of Classification Search
CPC .............. B23P 21/00; G05B 19/41805; G05B 2219/31057; G05B 2219/31031; G05B 19/0426; Y10T 29/49826; Y10T 29/49828; Y10T 29/49829; Y10T 29/49831; Y10T 29/53; Y10T 29/53013; Y10T 29/5303; Y10T 29/53039; H05K 13/04; H05K 13/00
See application file for complete search history.

(56) References Cited

U.S. PATENT DOCUMENTS 4,591,983 A  *  5/1986  Bennett et al. ................... 706/53
5,353,490 A     10/1994  Kukuljan
(Continued)

FOREIGN PATENT DOCUMENTS

CN   101456128 A   6/2009
CN   100508721 C   7/2009
(Continued)

OTHER PUBLICATIONS

Sep. 3, 2014 Office Action issued in Chinese Patent Application No. 201180042172.X (with translation).
(Continued)

*Primary Examiner* — Sarang Afzali
*Assistant Examiner* — Ruth G Hidalgo-Hernandez
(74) *Attorney, Agent, or Firm* — Oliff PLC

(57) ABSTRACT

A method of constructing a manufacture system for manufacturing one product by sequential manufacture works each of which is performed by each of at least one manufacture work machine, the method including: a main-apparatus preparing step of preparing, for said each of the at least one manufacture work machine, a main apparatus including a main frame and a central control device; a work-element-performing-apparatus preparing step of preparing, for said each of the at least one manufacture work machine, a plurality of work-element performing apparatuses; a work-element-performing-apparatus installing step of installing the prepared plurality of work-element performing apparatuses on the main frame of the prepared main apparatus; and a central-control-device setting step of executing setting, with respect to the central control device of the prepared main apparatus, for controlling the prepared plurality of work-element performing apparatuses in a centralized manner.

13 Claims, 25 Drawing Sheets

(51) Int. Cl.
*H05K 13/00* (2006.01)
*H05K 13/04* (2006.01)

(52) U.S. Cl.
CPC ...... *G05B2219/31057* (2013.01); *H05K 13/00* (2013.01); *H05K 13/04* (2013.01); *Y10T 29/49826* (2015.01); *Y10T 29/53* (2015.01)

(56) References Cited

U.S. PATENT DOCUMENTS

| | | | |
|---|---|---|---|
| 7,111,390 B2* | 9/2006 | Shimamura et al. | 29/791 |
| 2003/0135991 A1* | 7/2003 | Nagao et al. | 29/739 |
| 2006/0085973 A1* | 4/2006 | Kodama et al. | 29/740 |
| 2007/0089113 A1* | 4/2007 | Kobayashi | 718/103 |
| 2009/0110858 A1* | 4/2009 | Backman et al. | 428/36.9 |
| 2009/0118858 A1 | 5/2009 | Wallace et al. | |

FOREIGN PATENT DOCUMENTS

| | | |
|---|---|---|
| DE | 102 21 032 A1 | 11/2003 |
| JP | A 2004-104075 | 4/2004 |
| JP | A 2008-254093 | 10/2008 |

OTHER PUBLICATIONS

Jul. 26, 2011 Written Opinion issued in International Patent Application No. PCT/JP2011/064985 (with translation).

Apr. 9, 2013 International Preliminary Report on Patentability issued in International Patent Application No. PCT/JP2011/064985 (with translation).

May 27, 2014 Office Action issued in Japanese Patent Application No. 2010-200622 (with translation).

* cited by examiner

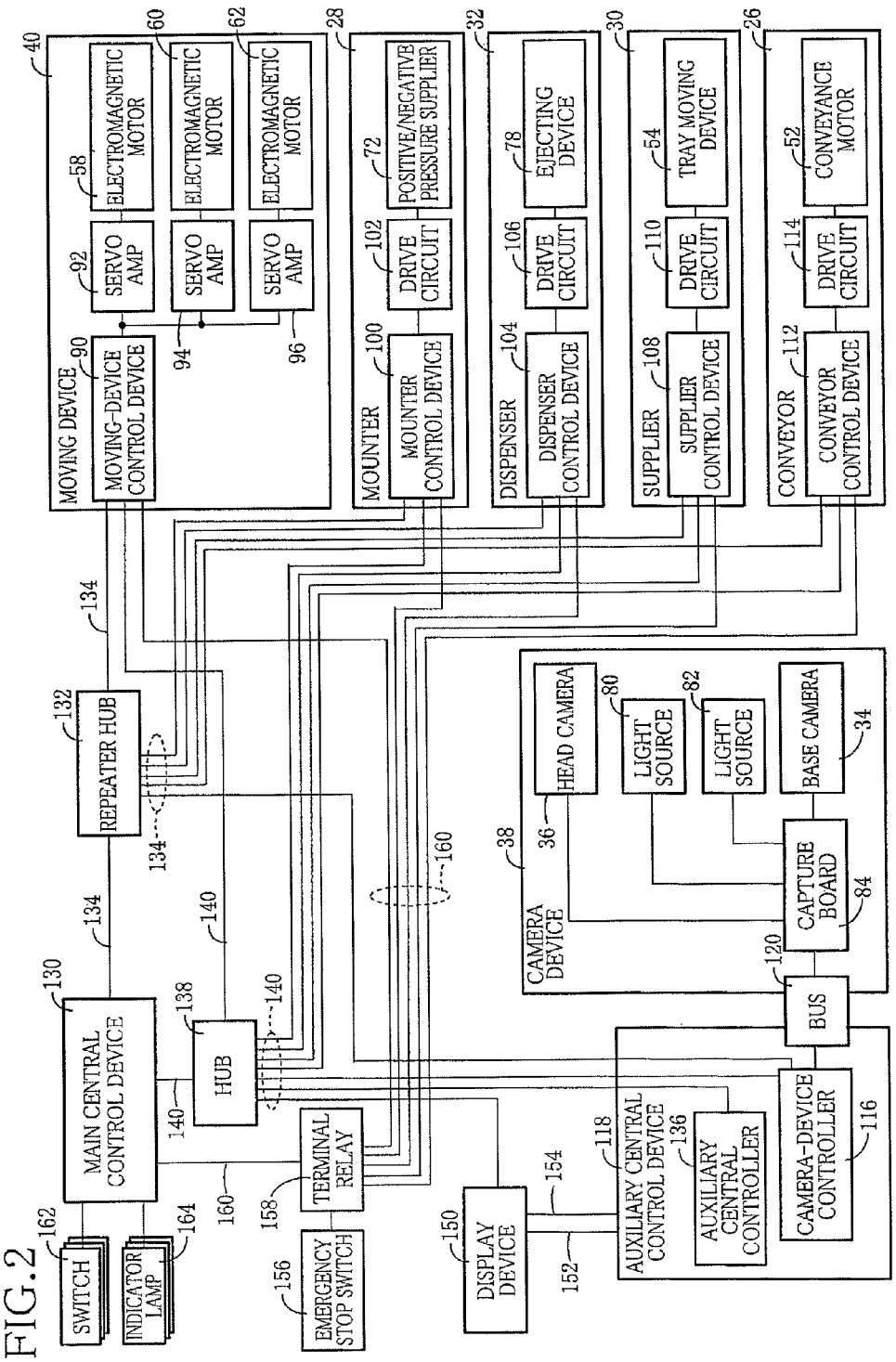

FIG.4

| BASIC CODE No. | BASIC CODE |
|---|---|
| (1) | PREPARATION WORK |
| (2) | SUBSTRATE-RELATED WORK |
| (3) | SUBSTRATE-RELATED WORK |
| (4) | SUBSTRATE-RELATED WORK |
| (5) | SUBSTRATE-RELATED WORK |
| (6) | SUBSTRATE-RELATED WORK |
| (7) | SUBSTRATE-RELATED WORK |
| (8) | SUBSTRATE-RELATED WORK |
| OMITTED ||
| (19) | SUBSTRATE-RELATED WORK |
| (20) | SUBSTRATE-RELATED WORK |
| (21) | SUBSTRATE-RELATED WORK |
| (22) | FINISHING WORK |

FIG.5

| PREPARATION WORK | |
|---|---|
| UNIT-WORK CODE No. | UNIT-WORK CODE |
| (1) | TRAY PREPARATION |

| SUBSTRATE-RELATED WORK | |
|---|---|
| UNIT-WORK CODE No. | UNIT-WORK CODE |
| (1) | SUBSTRATE-INFORMATION OBTAINING |
| (2) | ADHESIVE APPLICATION |
| (3) | COMPONENT MOUNTING |

| FINISHING WORK | |
|---|---|
| UNIT-WORK CODE No. | UNIT-WORK CODE |
| (1) | TRAY SEND-OUT |

FIG.6

| TRAY PREPARATION | |
|---|---|
| MOTION CODE No. | MOTION CODE |
| (1) | CONVEYOR: CONVEYANCE |
| (2) | SUPPLIER: SUPPLY |

| COMPONENT MOUNTING | |
|---|---|
| MOTION CODE No. | MOTION CODE |
| (1) | MOVING DEVICE: MOVEMENT |
| (2) | MOUNTER: HOLDING |
| (3) | MOVING DEVICE: MOVEMENT |
| (4) | BASE CAMERA: IMAGE TAKING |
| (5) | MOVING DEVICE: MOVEMENT |
| (6) | MOUNTER: RELEASE |

| SUBSTRATE-INFORMATION OBTAINING | |
|---|---|
| MOTION CODE No. | MOTION CODE |
| (1) | MOVING DEVICE: MOVEMENT |
| (2) | HEAD CAMERA: IMAGE TAKING |

| TRAY SEND-OUT | |
|---|---|
| MOTION CODE No. | MOTION CODE |
| (1) | CONVEYOR: CONVEYANCE |

| ADHESIVE APPLICATION | |
|---|---|
| MOTION CODE No. | MOTION CODE |
| (1) | MOVING DEVICE: MOVEMENT |
| (2) | DISPENSER: EJECTION |

FIG.7

| MOTION COMMAND No. | MAIN COMMAND | ASSOCIATED COMMAND | COMMAND STATE |
|---|---|---|---|
| (1) | CONVEYOR: CONVEYANCE | CONVEYANCE AMOUNT | COMMAND ISSUING OR COMMAND ABSENT |
| (2) | SUPPLIER: SUPPLY | COMPONENT TRAY No. | COMMAND ISSUING OR COMMAND ABSENT |
| (3) | MOVING DEVICE: MOVEMENT | MOVEMENT AMOUNT | COMMAND ISSUING OR COMMAND ABSENT |
| (4) | HEAD CAMERA: IMAGE TAKING | | COMMAND ISSUING OR COMMAND ABSENT |
| (5) | MOVING DEVICE: MOVEMENT | MOVEMENT AMOUNT | COMMAND ISSUING OR COMMAND ABSENT |
| (6) | DISPENSER: EJECTION | EJECTION AMOUNT | COMMAND ISSUING OR COMMAND ABSENT |
| (7) | MOVING DEVICE: MOVEMENT | MOVEMENT AMOUNT | COMMAND ISSUING OR COMMAND ABSENT |
| (8) | MOUNTER: HOLDING | | COMMAND ISSUING OR COMMAND ABSENT |
| (9) | MOVING DEVICE: MOVEMENT | MOVEMENT AMOUNT | COMMAND ISSUING OR COMMAND ABSENT |
| (10) | BASE CAMERA: IMAGE TAKING | | COMMAND ISSUING OR COMMAND ABSENT |
| (11) | MOVING DEVICE: MOVEMENT | MOVEMENT AMOUNT | COMMAND ISSUING OR COMMAND ABSENT |
| (12) | MOUNTER: RELEASE | | COMMAND ISSUING OR COMMAND ABSENT |
| (13) | MOVING DEVICE: MOVEMENT | MOVEMENT AMOUNT | COMMAND ISSUING OR COMMAND ABSENT |
| (14) | HEAD CAMERA: IMAGE TAKING | | COMMAND ISSUING OR COMMAND ABSENT |
| (15) | MOVING DEVICE: MOVEMENT | MOVEMENT AMOUNT | COMMAND ISSUING OR COMMAND ABSENT |
| (16) | DISPENSER: EJECTION | EJECTION AMOUNT | COMMAND ISSUING OR COMMAND ABSENT |
| (17) | MOVING DEVICE: MOVEMENT | MOVEMENT AMOUNT | COMMAND ISSUING OR COMMAND ABSENT |
| (18) | MOUNTER: HOLDING | | COMMAND ISSUING OR COMMAND ABSENT |
| (19) | MOVING DEVICE: MOVEMENT | MOVEMENT AMOUNT | COMMAND ISSUING OR COMMAND ABSENT |
| (20) | BASE CAMERA: IMAGE TAKING | | COMMAND ISSUING OR COMMAND ABSENT |
| OMITTED | | | |
| (199) | MOVING DEVICE: MOVEMENT | MOVEMENT AMOUNT | COMMAND ISSUING OR COMMAND ABSENT |
| (200) | BASE CAMERA: IMAGE TAKING | | COMMAND ISSUING OR COMMAND ABSENT |
| (201) | MOVING DEVICE: MOVEMENT | MOVEMENT AMOUNT | COMMAND ISSUING OR COMMAND ABSENT |
| (202) | MOUNTER: RELEASE | | COMMAND ISSUING OR COMMAND ABSENT |
| (203) | CONVEYOR: CONVEYANCE | CONVEYANCE AMOUNT | COMMAND ISSUING OR COMMAND ABSENT |

FIG.8

| OPERATION RESULT | COMMAND STATE | STATE OF WORK-ELEMENT PERFORMING APPARATUS |

FIG.15

| CONSTITUENT COMPONENT | WORK ELEMENT | WORK DETAILS | MANUFACTURE WORK | WORK-ELEMENT PERFORMING APPARATUS |
|---|---|---|---|---|
| TERMINAL SOCKET | SUPPLYING | SUPPLYING OF TERMINAL SOCKET | PLACING OF TERMINAL SOCKET ON CONVEYOR | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | PLACING OF TERMINAL SOCKET | | |
| TERMINAL | SUPPLYING | SUPPLYING OF TERMINAL | MOUNTING OF TERMINAL INTO TERMINAL SOCKET | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF TERMINAL | | |
| CASING | SUPPLYING | SUPPLYING OF CASING | FITTING OF CASING ONTO TERMINAL SOCKET | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF CASING | | |
| CIRCUIT BOARD | SUPPLYING | SUPPLYING OF CIRCUIT BOARD | MOUNTING OF CIRCUIT BOARD INTO CASING | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF CIRCUIT BOARD | | |
| HEAT SINK | APPLICATION | APPLICATION OF ADHESIVE | FIXING OF HEAT SINK TO UPPER END PORTION OF CASING BY ADHESIVE | WORK HEAD DEVICE: SUCTION-TYPE MOUNTER WORK HEAD DEVICE: DISPENSER CONVEYOR: DOUBLE CONVEYOR SUPPLIER: TRAY-UNIT TYPE SUPPLIER |
| | SUPPLYING | SUPPLYING OF HEAT SINK | | |
| | HOLDING · RELEASING | MOUNTING OF HEAT SINK | | |
| LED BOARD | DRYING | DRYING OF ADHESIVE | DRYING OF ADHESIVE AND MOUNTING OF LED BOARD ONTO UPPER END SURFACE OF HEAT SINK | WORK HEAD DEVICE: SUCTION-TYPE MOUNTER WORK HEAD DEVICE: HOT-AIR BLOWER CONVEYOR: DOUBLE CONVEYOR SUPPLIER: TRAY-UNIT TYPE SUPPLIER |
| | SUPPLYING | SUPPLYING OF LED BOARD | | |
| | HOLDING · RELEASING | MOUNTING OF LED BOARD | | |
| SCREW | SUPPLYING | SUPPLYING OF SCREW | SCREW FASTENING OF LED BOARD AND APPLICATION OF ADHESIVE TO UPPER END PORTION OF HEAT SINK | WORK HEAD DEV FASTENING DE WORK HEAD DEV CONVEYOR: DOU SUPPLIER: SCREW SCREW ATTACHING·SCREW DISPENSER CONVEYOR PPLIER |
| | HOLDING · SCREW FASTENING | SCREW ATTACHING · SCREW FASTENING | | |
| | APPLICATION | APPLICATION OF ADHESIVE | | |
| COVER | SUPPLYING | SUPPLYING OF COVER | MOUNTING OF COVER ONTO UPPER END PORTION OF HEAT SINK AND DRYING OF ADHESIVE | WORK HEAD DEVICE: SUCTION-TYPE MOUNTER WORK HEAD DEVICE: HOT-AIR BLOWER CONVEYOR: DOUBLE CONVEYOR SUPPLIER: TRAY-UNIT TYPE SUPPLIER |
| | HOLDING · RELEASING | MOUNTING OF COVER | | |
| | DRYING | DRYING OF ADHESIVE | | |

FIG.17

| BASIC CODE No. | BASIC CODE |
|---|---|
| (1) | PREPARATION WORK |
| (2) | PLACEMENT RELATED WORK |
| (3) | PLACEMENT RELATED WORK |
| (4) | PLACEMENT RELATED WORK |
| (5) | PLACEMENT RELATED WORK |
| (6) | PLACEMENT RELATED WORK |
| (7) | PLACEMENT RELATED WORK |
| (8) | PLACEMENT RELATED WORK |
| OMITTED ||
| (19) | PLACEMENT RELATED WORK |
| (20) | PLACEMENT RELATED WORK |
| (21) | PLACEMENT RELATED WORK |
| (22) | FINISHING WORK |

FIG.18

| PREPARATION WORK | |
|---|---|
| UNIT-WORK CODE No. | UNIT-WORK CODE |
| (1) | TERMINAL-SOCKET SUPPLY |

| PLACEMENT RELATED WORK | |
|---|---|
| UNIT-WORK CODE No. | UNIT-WORK CODE |
| (1) | TERMINAL-SOCKET PLACEMENT |

| FINISHING WORK | |
|---|---|
| UNIT-WORK CODE No. | UNIT-WORK CODE |
| (1) | TERMINAL-SOCKET SEND-OUT |

FIG.19

| TERMINAL-SOCKET SUPPLY | |
|---|---|
| MOTION CODE No. | MOTION CODE |
| (1) | SUPPLIER: SUPPLY |

| TERMINAL-SOCKET PLACEMENT | |
|---|---|
| MOTION CODE No. | MOTION CODE |
| (1) | MOVING DEVICE: MOVEMENT |
| (2) | MOUNTER: HOLDING |
| (3) | MOVING DEVICE: MOVEMENT |
| (4) | BASE CAMERA: IMAGE TAKING |
| (5) | MOVING DEVICE: MOVEMENT |
| (6) | MOUNTER: RELEASE |

| TERMINAL-SOCKET SEND-OUT | |
|---|---|
| MOTION CODE No. | MOTION CODE |
| (1) | CONVEYOR: CONVEYANCE |

FIG.21

| CONSTITUENT COMPONENT | WORK ELEMENT | WORK DETAILS | MANUFACTURE WORK | WORK-ELEMENT PERFORMING APPARATUS |
|---|---|---|---|---|
| BUSHING | SUPPLYING | SUPPLYING OF BUSHING | MOUNTING OF BUSHING ONTO BASE PLATE TO WHICH SUBSTRATE IS ATTACHED | WORK HEAD DEVICE: SUCTION-TYPE MOUNTER CONVEYOR: DOUBLE CONVEYOR SUPPLIER: BUSHING SUPPLIER |
| | HOLDING · RELEASING | MOUNTING OF BUSHING | | |
| CASING | SUPPLYING | SUPPLYING OF CASING | MOUNTING OF CASING ONTO BASE PLATE TO WHICH SUBSTRATE IS ATTACHED | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF CASING | | |
| PIN TERMINAL | SUPPLYING | SUPPLYING OF PIN TERMINAL | MOUNTING OF PIN TERMINAL INTO CASING | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF PIN TERMINAL | | |
| TERMINAL | SUPPLYING | SUPPLYING OF TERMINAL | MOUNTING OF TERMINAL INTO CASING | WORK HEAD DEVICE: SUCTION-TYPE MOUNTER CONVEYOR: DOUBLE CONVEYOR SUPPLIER: TRAY-UNIT TYPE SUPPLIER |
| | HOLDING · RELEASING | MOUNTING OF TERMINAL | | |
| CASING | EJECTION | EJECTION OF SILICONE GEL | EJECTION OF TWO KINDS OF AUXILIARY AGENTS INTO CASING | WORK HEAD DEVICE: DOUBLE DISPENSER CONVEYOR: DOUBLE CONVEYOR |
| | EJECTION | EJECTION OF EPOXY RESIN | | |
| LID | SUPPLYING | SUPPLYING OF LID | MOUNTING OF LID ONTO CASING | WORK HEAD DEVICE: SUCTION-TYPE MOUNTER CONVEYOR: DOUBLE CONVEYOR SUPPLIER: LID SUPPLIER |
| | HOLDING · RELEASING | MOUNTING OF LID | | |
| SEAL | SUPPLYING | SUPPLYING OF SEAL | ATTACHMENT OF SEAL TO CASING | WORK HEAD DEVICE: SUCTION-TYPE MOUNTER CONVEYOR: DOUBLE CONVEYOR SUPPLIER: TAPE FEEDER |
| | HOLDING · RELEASING | ATTACHMENT OF SEAL | | |

FIG.24

| CONSTITUENT COMPONENT | WORK ELEMENT | WORK DETAILS | MANUFACTURE WORK | WORK-ELEMENT PERFORMING APPARATUS |
|---|---|---|---|---|
| LOWER INTERCONNECTOR | SUPPLYING | SUPPLYING OF INTERCONNECTOR | PLACING OF LOWER INTERCONNECTOR ON CONVEYOR AND APPLICATION OF SOLDER CREAM | WORK HEAD DEVICE: SUCTION-TYPE MOUNTER WORK HEAD DEVICE: SOLDER CREAM PRINTER CONVEYOR: CONVEYOR SUPPLIER: INTERCONNECTOR SUPPLIER |
| | HOLDING · RELEASING | PLACING OF INTERCONNECTOR | | |
| | APPLICATION | APPLICATION OF SOLDER CREAM | | |
| SILICON CELL | SUPPLYING | SUPPLYING OF SILICON CELL | MOUNTING OF SILICON CELL ONTO LOWER INTERCONNECTOR AND APPLICATION OF SOLDER CREAM | WORK HEAD DEVICE: SUCTION-TYPE MOUNTER WORK HEAD DEVICE: SOLDER CREAM PRINTER CONVEYOR: CONVEYOR SUPPLIER: SILICON CELL SUPPLIER |
| | HOLDING · RELEASING | MOUNTING OF SILICON CELL | | |
| | APPLICATION | APPLICATION OF SOLDER CREAM | | |
| UPPER INTERCONNECTOR | SUPPLYING | SUPPLYING OF INTERCONNECTOR | APPLICATION OF SOLDER CREAM AND MOUNTING OF UPPER INTERCONNECTOR ONTO SILICON CELL | WORK HEAD DEVICE: SUCTION-TYPE MOUNTER WORK HEAD DEVICE: SOLDER CREAM PRINTER CONVEYOR:CONVEYOR SUPPLIER: SILICON CELL SUPPLIER |
| | HOLDING · RELEASING | PLACING OF INTERCONNECTOR | | |

METHOD OF CONSTRUCTING MANUFACTURE SYSTEM

TECHNICAL FIELD

The present invention relates to a method of constructing a manufacture system for manufacturing one product by sequential manufacture works each of which is performed by each of at least one manufacture work machine.

BACKGROUND ART

As an assembling system configured to perform an assembling work of an electric circuit as one kind of a manufacture work, there is known an assembling system described in the following Patent Literature. An assembling work machine that constitutes such an assembling system is configured to perform a work of mounting, on a circuit substrate as one component, a circuit component as another component. The assembling work machine includes: a plurality of work-element performing apparatuses such as an apparatus for conveying the circuit substrate, an apparatus for supplying the circuit components, and an apparatus for mounting the circuit component on the circuit substrate; a main frame on which the plurality of work-element performing apparatuses are installed; and a central control device for controlling the plurality of work-element performing apparatuses in a centralized manner.

CITATION LIST

Patent Literature

[Patent Literature 1] JP-A-2004-104075

SUMMARY OF INVENTION

Technical Problem

The assembling system described above can only perform a mounting work of mounting the circuit component onto the circuit substrate and therefore lacks versatility. Where a manufacture system is configured to perform not only the mounting work of mounting the circuit component onto the circuit substrate but also various sorts of works, it is possible to manufacture various products, thereby enhancing versatility of the manufacture system. The present invention has been made in view of the situations. It is therefore an object of the invention to provide a construction method capable of constructing a manufacture system with a high degree of versatility.

Solution to Problem

To solve the problem indicated above, the present invention provides a method of constructing a manufacture system comprising: (a) a main-apparatus preparing step of preparing, for each of at least one manufacture work machine, a main apparatus including a main frame and a central control device; (b) a work-element-performing-apparatus preparing step of preparing, for said each of the at least one manufacture work machine, a plurality of work-element performing apparatuses; (c) a work-element-performing-apparatus installing step of installing the plurality of work-element performing apparatuses prepared for said each of the at least one manufacture work machine, on the main frame of the main apparatus prepared for said each of the at least one manufacture work machine; and (d) a central-control-device setting step of executing setting, with respect to the central control device of the main apparatus prepared for said each of the at least one manufacture work machine, for controlling the plurality of work-element performing apparatuses prepared for said each of the at least one manufacture work machine in a centralized manner.

Advantageous Effects of Invention

In the method of constructing a manufacture system (manufacture system constructing method) according to the present invention, the number of the manufacture work machines may be determined on the basis of details of an overall work required for manufacturing the product, for instance. Further, the plurality of work-element performing apparatuses may be determined on the basis of details of the manufacture work to be performed by each of the at least one manufacture work machine. That is, it is possible to construct the manufacture system having the at least one manufacture work machine by which various works are performable, thereby enabling various products to be manufactured by the manufacture system. According to the present manufacture system constructing method, it is possible to construct a manufacture system with high versatility.

FORMS OF INVENTION

There will be explained various forms of an invention which is considered claimable (hereinafter referred to as "claimable invention" where appropriate). Each of the forms is numbered like the appended claims and depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following description of various forms and embodiments. It is to be further understood that, as long as the claimable invention is construed in this way, any form in which one or more constituent elements is/are added to or deleted from any one of the following forms may be considered as one form of the claimable invention.

In the following forms, the form (1) corresponds to claim 1. A form in which the technical features of the form (2) are added to claim 1 corresponds to claim 2. A form in which the technical features of the form (3) are added to claim 1 or 2 corresponds to claim 3. A form in which the technical features of the forms (4), (5), and (6) are added to any one of claims 1-3 corresponds to claim 4. A form in which the technical features of the forms (4), (9), and (10) are added to any one of claims 1-4 corresponds to claim 5. A form in which the technical features of the forms (31), (34), and (35) are added to any one of claims 1-5 corresponds to claim 6. A form in which the technical features of the form (37) are added to claim 6 corresponds to claim 7. A form in which the technical features of the form (38) are added to claim 7 corresponds to claim 8. A form in which the technical features of the form (39) are added to claim 7 or 8 corresponds to claim 9.

(1) A method of constructing a manufacture system for manufacturing one product by sequential manufacture works each of which is performed by each of at least one manufacture work machine, the method comprising:

a main-apparatus preparing step of preparing, for said each of the at least one manufacture work machine, a main apparatus including; (a) a main frame on which are to be installed a plurality of work-element performing apparatuses each of which is configured to perform a corresponding one of a plurality of work elements that constitute a manufacture work as one of the sequential manufacture works; and (b) a central control device configured to control the plurality of work-element performing apparatuses in a centralized manner;

a work-element-performing-apparatus preparing step of preparing, for said each of the at least one manufacture work machine, the plurality of work-element performing apparatuses;

a work-element-performing-apparatus installing step of installing the plurality of work-element performing apparatuses prepared for said each of the at least one manufacture work machine, on the main frame of the main apparatus prepared for said each of the at least one manufacture work machine; and a central-control-device setting step of executing setting, with respect to the central control device of the main apparatus prepared for said each of the at least one manufacture work machine, for controlling the plurality of work-element performing apparatuses prepared for said each of the at least one manufacture work machine in the centralized manner.

In the manufacture system constructing method described in this form, the number of manufacture work machines may be determined on the basis of details of an overall work required for manufacturing the product, and the main apparatus may be prepared by that number, for instance. Further, the plurality of work-element performing apparatuses may be determined on the basis of details of the manufacture work to be performed by each of the at least one manufacture work machine, and the determined plurality of work-element performing apparatuses may be prepared, for instance. Accordingly, the manufacture system constructing method described in this form enables construction of the manufacture system having at least one manufacture work machine by which various works are performable, whereby the manufacture system with high versatility can be constructed.

There exist no priority among the four steps described in this form, namely, the order in which the four steps are carried out is not particularly limited and any performable one of the four steps may be initially carried out. In other words, any one of the main apparatus and the plurality of work-element performing apparatuses may be initially prepared. For instance, the main apparatus is prepared after one work-element performing apparatus has been prepared, and another work-element performing apparatus may be prepared thereafter. Further, the setting with respect to the central control device may be executed after the plurality of work-element performing apparatuses have been installed on the main frame of the main apparatus. The installing step may be carried out after the setting with respect to the central control device has been executed. Moreover, the setting with respect to the central control device may be executed after the main apparatus has been prepared and before the work-element performing apparatuses are prepared.

In the "main-apparatus preparing step" and the "work-element-performing-apparatus preparing step" described in this form, the main apparatus and the work-element performing apparatuses may be prepared by any means. For instance, the main apparatus and the work-element performing apparatuses may be prepared by purchasing or by producing. Further, preparation means in the main-apparatus preparing step and preparation means in the work-element-performing-apparatus preparing step may be the same or may differ from each other. That is, the main apparatus may be prepared by purchasing in the main-apparatus preparing step, and the work-element performing apparatuses may be prepared by producing in the work-element-performing-apparatus preparing step. Where the main apparatus and the work-element performing apparatuses are prepared by purchasing, the main apparatus and the work-element performing apparatuses may be purchased from the same party or may be purchased from different parties. In the "work-element-performing-apparatus installing step" described in this form, it is preferable that the work-element performing apparatuses be easily installed on the main frame. To be more specific, each work-element performing apparatus is preferably installed on the main frame by fastening with several bolts, or each work-element performing apparatus is preferably attachable to and detachable from with one-touch action.

The "manufacture work" described in this form, namely, a target work to be performed by one of the at least one manufacture work machine, is not particularly limited, but may include an assembling work of assembling a plurality of components (parts) into an assembled article and various works in which certain processing, treatment or the like is performed on a work object (which is a concept that includes "component (part)", "assembled article", "object to be processed or treated", etc.,). More specifically, as the work in which certain processing is performed, a work, such as a press work, in which the work object is deformed, a work, such as a cut-off work, in which a part of the work object is cut off, and a work, such as a cutting work, in which the work object is shaped, may be the target work, for instance. As the work in which a certain treatment is performed, a surface modification work in which a surface of the work object is modified by laser, plasma or the like, a coating work in which an adhesive, a coloring agent or the like is applied to the work object, a heat treatment work in which the work object is heated, dried, cooled, etc., by hot air, cool air, etc., a surface finishing work such as grinding, a work of fixing, etc., by screwing, etc., other component mounted onto one component, and a work of irradiating the work object with a light, ultraviolet rays, an electromagnetic wave, etc., for the purpose of fixation, curing, etc., may be the target work, for instance. Further, an inspection work of inspecting work results of the assembling work and the works in which certain processing, treatment or the like is performed may be the target work.

The "work element" described in this form means one of a movement, rotation, a posture change, a treatment, processing and the like, to be performed on the work object, for instance. One manufacture work is performed by coordination of those work elements. The kind and the number of the work elements and the manner of coordination vary depending upon the target work. The "work-element performing apparatus" is an apparatus for performing one work element and may be considered as an apparatus having a single function in accordance with the work element, for instance. More specifically, where the target work is the assembling work, for instance, each of the following (a)-(d) that will be later explained is incorporated as the work-element performing apparatus into the manufacture work machine: (a) a conveyor configured to perform conveyance for conveying one component from an outside of the manufacture work machine and for conveying the assembled article out of the manufacture work machine; (b) a component supplier configured to supply another component; (c) a component holding head device (which is one kind of a "work head device" and is referred to as a "carry head") configured to perform holding of another component supplied by the component supplier for mounting onto the one component; and (d) a head moving device configured to move the component holding head device for moving the component held by the component holding head device. In the assembling work or in the inspection work for inspecting the result of the assembling work, an image taking device such as a camera for taking an image of the component or the assembled article to recognize the position and the posture thereof, the assembling accuracy, etc., may be the work-element performing apparatus configured to perform image taking processing as the work element. In the assembling work, an adhesive applying device for applying an adhesive to at least one of the two components for bonding thereof may be the work-element performing apparatus configured to perform adhesive application as the work element. Further, the device configured to perform certain processing, or treatment, etc., such as laser processing or plasma processing may be the work-element performing apparatus in the manufacture work in which the processing or treatment is performed.

(2) The method according to the form (1), wherein the main-apparatus preparing step is a step of preparing the main apparatus by a number corresponding to a required number of the at least one manufacture work machine that is determined based on details of an overall work required in manufacturing the one product.

In the manufacture system constructing method described in this form, it is possible to determine the number of the manufacture work machines that constitute the manufacture system, depending upon the product to be manufactured. Accordingly, the manufacture system constructing method described in this form enables construction of manufacture systems ranging from a manufacture system for a product manufactured by a small number of manufacture steps to a manufacture system of a product that requires a relatively large number of manufacture steps. The "overall work" described in this form includes all works to be performed upon manufacture of the product and includes all works to be performed by the plurality of work-element performing apparatuses of all of the at least one manufacture work machine.

(3) The method according to the form (1) or (2), wherein the work-element-performing-apparatus preparing step is a step of preparing, for said each of the at least one manufacture work machine, the plurality of work-element performing apparatuses that are required for said each of the at least one manufacture work machine and that are determined based on details of the manufacture work which is to be performed by said each of the at least one manufacture work machine.

In the manufacture system constructing method described in this form, it is possible to prepare the work-element performing apparatuses for each of the at least one manufacture work machine. Accordingly, the manufacture system constructing method described in this form enables each of the at least one manufacture work machine to perform various manufacture works, thereby constructing the manufacture system with high versatility.

(4) The method according to any one of the forms (1)-(3), wherein at least one of the at least one manufacture work machine is an assembling work machine configured to perform, as the manufacture work by the at least one of the at least one manufacture work machine, an assembling work of assembling a plurality of components into an assembled article, the assembling work machine being configured to perform, as at least a part of the assembling work, a work of mounting, onto a first component that is one of the plurality of components, a second component that is another one of the plurality of components.

In this form, the manufacture work machine is limited to the assembling work machine.

(5) The method according to the form (4), wherein the plurality of work-element performing apparatuses of each of the at least one of the at least one manufacture work machine that is the assembling work machine includes a conveying apparatus configured to perform, as one of the plurality of work elements, conveyance of at least one of the first component and the assembled article.

(6) The method according to the form (5), wherein the work-element-performing-apparatus preparing step is a step of preparing, for said each of the at least one of the at least one manufacture work machine that is the assembling work machine, the conveying apparatus determined on the basis of specifications of the at least one of the first component and the assembled article, as one of the plurality of work element performing apparatuses.

The above two forms relate to the conveying apparatus. The conveying apparatus is configured to perform conveyance of a certain component or the like into the manufacture work machine from an outside of the manufacture work machine and conveyance of the assembled article to the outside of the manufacture work machine. There are various sorts of mechanisms for conveying an object to be conveyed (conveyance object). To be more specific, the conveying apparatus of the so-called conveyor type includes a conveying mechanism configured to move the conveyance object on the same plane. Further, there exists a conveying apparatus having a conveying mechanism configured to lift the conveyance object and to convey the conveyance object in the lifted state. The conveying apparatus with such a mechanism is referred to as a lift and carry type, a pick and place type, or the like. The conveying apparatus of the lift and carry type has a conveying mechanism configured to lift a table on which the conveyance object is placed and is suitable for conveyance of the conveyance object having a comparatively large weight. The conveying apparatus of the pick and place type has a conveyance mechanism configured to suction-hold the conveyance object from above the conveyance object and to lift the conveyance object in the suction-held state. Such a conveying apparatus is suitable for conveyance of the conveyance object made of a relatively fragile material. That is, by selecting the conveying apparatus on the basis of the specifications of the conveyance object, the conveyance object can be properly conveyed. According to the manufacture system constructing method described in the latter form, it is possible to construct the manufacture system having the conveying apparatus capable of properly conveying the conveyance object. Here, the specifications of the conveyance object mean elements, factors and the like of the conveyance object and include the dimension, the weight, the material, the shape of the conveyance object per se, and the mode of the conveyance object when conveyed.

(7) The method according to any one of the forms (4)-(6), wherein the plurality of work-element performing apparatuses of each of the at least one of the at least one manufacture work machine that is the assembling work machine include a component supplier configured to perform, as one of the plurality of work elements, supplying of a plurality of second components each as the second component.

(8) The method according to the form (7), wherein the work-element-performing-apparatus preparing step is a step of preparing, for said each of the at least one of the at least one manufacture work machine that is the assembling work machine, the component supplier determined on the basis of specifications of the second component, as one of the plurality of work-element performing apparatuses.

The above two forms relate to the component supplier. The component supplier is an apparatus configured to perform supplying of the components in the assembling work, and various types of apparatuses are employable as the component supplier, such as a tray unit type component supplier configured to supply a plurality of components in a state in which the components are disposed on a tray and a feeder type component supplier configured to supply a plurality of components by sequentially feeding a tape on which the components are held or configured to supply a plurality of components which are accommodated in bulk by sequentially feeding the components while permitting the components to be placed in proper orientation. What kind of the component supplier is employed is preferably determined on the basis of the specifications of the components to be supplied. By employing the apparatus suitable for the components to be supplied, the supplying of the components can be properly performed. Therefore, according to the manufacture system constructing method described in the latter form, it is possible to construct the manufacture system with the component supplier capable of properly performing the supplying of the components. Here, the "specifications of the second component" described in the latter form mean elements, factors, and the like of the second component and include the dimension, the weight, the material, the shape of the second component per se, and the mode of the second component when supplied (the so-called packing type).

(9) The method according to any one of the forms (4)-(8), wherein the plurality of work-element performing apparatuses of each of the at least one of the at least one manufacture work machine that is the assembling work machine include at least one work head device for the assembling work each of which is a work head device and each of which is configured to perform a work necessary for mounting the second component onto the first component as one of the plurality of work elements.

The "work necessary for mounting the second component onto the first component" described in this form includes holding of the second component conducted for mounting, a work of fixing by screwing, etc., the second component into the first component, a work performed prior to mounting, a work performed on an article in which the second component has been mounted onto the first component.

(10) The method according to the form (9), wherein at least one of the at least one work head device for the assembling work is a holding and releasing head device configured to perform holding and releasing of the second component as the work necessary for mounting the second component onto the first component, and wherein the work-element-performing-apparatus preparing step is a step of preparing, for said each of the at least one of the at least one manufacture work machine that is the assembling work machine, the holding and releasing head device determined on the basis of specifications of the second component, as one of the plurality of work-element performing apparatuses.

The "holding and releasing head device" described in this form is an apparatus capable of holding and releasing the component, and various sorts of apparatuses are employable. To be more specific, there may be employed an apparatus for holding the component by grasping the component, an apparatus of the so-called mechanical chuck type, and a suction type apparatus for suction-hold the component by a negative pressure or the like. It is noted that the weight, the shape, etc., of the component that can be held differ depending upon performance capabilities of the apparatus. In view of this, where the holding and releasing head device is employed as the work-element performing apparatus, the holding and releasing head device is preferably selected on the basis of the specifications of the component. By employing an apparatus suitable for the component that is to be held, the holding and releasing of the component can be properly performed. Therefore, according to the manufacture system constructing method described in this form, it is possible to construct the manufacture system having the work head device capable of properly performing the holding and releasing the component. Here, the "specifications of the second component" described in this form means elements, factors, and the like of the second component and include the dimension, the weight, the material, the shape of the second component per se, and the mode of the second component when held.

(11) The method according to the form (9) or (10), wherein at least one of the at least one work head device for the assembling work is an auxiliary head device configured to perform, as the work necessary for mounting the second component onto the first component, one of; a work to be performed prior to the work of mounting the second component onto the first component; a work to be performed in a period in which the work of mounting the second component onto the first component is being performed; and a work to be performed on an article in which the second component has been mounted onto the first component, and wherein the work-element-performing-apparatus preparing step is a step of preparing, for said each of the at least one of the at least one manufacture work machine that is the assembling work machine, the auxiliary head device determined in consideration of performance capabilities thereof, as one of the plurality of work-element performing apparatuses.

The "work to be performed prior to the work of mounting the second component onto the first component" includes image taking of the first component for recognition of the position, the posture, etc., of the fixedly located first component and application of an adhesive, an auxiliary agent, etc., to at least one of the first component and the second component. The "work to be performed on an article in which the second component has been mounted onto the first component" includes drying of the applied auxiliary agent, etc., and image taking of the assembled article for recognition of the assembling accuracy. The "work of mounting the second component onto the first component" described in this form may be considered as a work that is continuously performed from a time point when the holding and releasing head device holds the second component to a time point when the holding and releasing head device releases the second component. A state in which the holding and releasing head device places the second component at a mounting position but it does not yet release the second component may be included in the "work of mounting the second component onto the first component". Accordingly, a work of performing certain processing, treatment, etc., on the second component while the second component is pressed onto the mounting position by the holding and releasing head device is included in the "a work to be performed in a period in which the work of mounting the second component onto the first component is being performed". To be more specific, the "work to be performed in a period in which the work of mounting the second component onto the first component is being performed" includes a work of performing laser processing or the like on the second component with the second component pressed onto the mounting position by the holding and releasing head device and a screw fastening work of the second component to the mounting position. That is, the "auxiliary head device" described in this form is configured to perform an auxiliary work that is auxiliary relative to the work of mounting the second component onto the first component. As the auxiliary head device, there may be employed an apparatus for performing image taking, an apparatus for applying the auxiliary agent, an apparatus for drying the adhesive, and so on.

Where the work is an application (coating) work, for instance, the apparatus to apply the auxiliary agent, etc., namely, the so-called dispenser is employed. The kind of the applicable auxiliary agent, the number on nozzles to eject the auxiliary agent, etc., vary from apparatus to apparatus. In the case of the image taking apparatus, the range of image taking, the resolution, etc., vary from apparatus to apparatus. In the case of the drying apparatus for drying the adhesive, etc., the temperature of the heat source for drying, the drying range, etc., vary from apparatus to apparatus. Therefore, by determining the auxiliary head device in consideration of performance capabilities thereof in employing the auxiliary head device as the work-element performing apparatus, the auxiliary work that is auxiliary relative to the mounting work can be properly performed. According to the manufacture system constructing method described in this form, therefore, it is possible to construct the manufacture system having the work head device capable of properly performing the auxiliary work of the mounting work.

(21) The method according to any one of the forms (1)-(11), wherein the plurality of work-element performing apparatuses of each of at least one of the at least one manufacture work machine includes a work head device, and wherein the main frame of the main apparatus prepared in the main-apparatus preparing step includes a head moving device configured to move the work head device.

The "work head device" described in this form is a work-element performing apparatus that plays a principal role in the manufacture work and is often installed on all of the manufacture work machines that constitute the manufacture system. More specifically, the work head device may be considered as an apparatus for performing a certain operation or a certain treatment on the work object generally from above the work object or from the side of the work object. The manufacture work machine on which the work head device is installed requires a device for moving the work head device to the vicinity of the work object. Unlike the above-described conveying apparatus, work head device, etc., the device for moving the work head device, namely, the head moving device, has low necessity to be selected in consideration of the conveyance object, the work object, etc. Accordingly, in the manufacture system constructing method described in this form, the head moving device is dealt with a constituent element of the main frame of the main apparatus, and the main apparatus in which the head moving device is provided is prepared in the main-apparatus preparing step.

(31) The method according to any one of the forms (1)-(22), wherein the central control device of the main apparatus of said each of the at least one manufacture work machine prepared in the main-apparatus preparing step is configured to control the plurality of work-element performing apparatuses in the centralized manner, by sequentially transmitting a plurality of motion commands each of which is a command for one motion to be performed by one of the plurality of work-element performing apparatuses.

According to this form, it is possible to flexibly deal with changes of the manufacture work simply by changing a matter of each motion command transmitted from the central control device.

(32) The method according to the form (31), wherein the central control device of the main apparatus of said each of the at least one manufacture work machine prepared in the main-apparatus preparing step has a central interface section configured to transmit, according to one protocol, the plurality of motion commands to each of the plurality of work-element performing apparatuses.

(33) The method according to the form (32), wherein each of the plurality of work-element performing apparatuses of said each of the at least one manufacture work machine prepared in the work-element-performing-apparatus preparing step has an individual control device configured to control an operation thereof, and wherein the individual control device has an individual interface section configured to receive, according to the one protocol, one of the plurality of motion commands that is sent to the individual control device.

In the above two forms, the communication protocol between the central control device of the main apparatus and the individual control device of the work-element performing apparatus are made common among all of the work-element performing apparatuses. According to the above two forms, therefore, the work-element performing apparatuses can be installed on the main frame in the work-element-performing-apparatus installing step without taking the communication protocol into consideration. The "protocol" described in the above two forms is for defining an agreement, a procedure, a rule or the like as to communication between the central control device and the individual control device. The "protocol" described in the above two forms includes not only an agreement of communication data itself, but also an agreement of a transmission path of data or the like between the central control device and the individual control device, more specifically, an agreement of the kind of cables and connectors in wired communication and an agreement of frequency bands in wireless communication.

(34) The method according to any one of the forms (31)-(33), wherein the central control device of the main apparatus of said each of the at least one manufacture work machine prepared in the main-apparatus preparing step includes:

a source-data storage section configured to store source data in which is encoded details of each of the plurality of work elements that is to be performed by each of the plurality of work-element performing apparatuses to perform the manufacture work;

a motion-command generating section configured to generate the plurality of motion commands on the basis of the source data; and a command-transmission processing section configured to perform transmission processing to transmit the plurality of motion commands generated by the motion-command generating section to said each of the plurality of work-element performing apparatuses.

The number of motion commands to be transmitted to the plurality of work-element performing apparatuses is comparatively large. Where details of the manufacture work are complicated, the number is considerably large, thereby taking a great deal of load for generating the motion commands. More specifically, the motion command corresponds to one motion to be performed by one work-element performing apparatus. Accordingly, where a specific number of motions, e.g., one hundred motions, each of which is performed by one work-element performing apparatus, are necessary in the manufacture work, the specific number of motion commands, namely, one hundred motion commands, are necessary. In this form, the "source data" is encoded. Accordingly, by putting techniques in encoding into full use, the source data can be made comparatively simple, whereby the load for generating the motion commands can be reduced according to this form.

While the "source data" described in this form may be encoded in any structure, it is preferable that the source data be encoded in a structure in which repetition is avoided, such as a hierarchical structure, a subroutine structure, or a module structure. The "motion-command generating section" described in this form may be configured not only to merely generate the plurality of motion commands, but also to generate the plurality of motion commands so as to be arranged in order in which the motion commands are transmitted to each of the plurality of work-element performing apparatuses. Where the motion-command generating section is thus configured, it is possible to construct the "command-transmission processing section" in this form so as to transmit the motion commands in the arranged order, so that the "command-transmission processing section" can be formed as a functional section in which the necessity to execute complicated processing is low.

(35) The method according to the form (34), wherein the central control device of the main apparatus of said each of the at least one manufacture work machine prepared in the main-apparatus preparing step has a source-data-input accepting section configured to accept input of the source data to be stored in the source-data storage section, and wherein the central-control-device setting step includes a step of inputting the source data to the source-data-input accepting section of the central control device of the main apparatus prepared for said each of the at least one manufacture work machine.

In the manufacture system constructing method described in this form, it is possible to construct the system by which a target product can be manufactured by inputting the source data in accordance with the manufacture work for each manufacture work machine, in the central-control-device setting step. According to the manufacture system constructing method described in this form, therefore, the manufacture system with high versatility can be constructed.

(36) The method according to the form (35), wherein the source data to be inputted to the source-data-input accepting section is encoded according to a structured programming technique.

The "structured programming technique" described in this form is a technique of describing, in stepwise, the work for performing the manufacture work into detailed units. More specifically, the structured programming technique is a technique of dividing the manufacture work into several rough units and further dividing each of several units into particulars. Accordingly, this form enables the source data to be encoded in the hierarchical structure, the sub routine structure or the like, whereby the source data can be made comparatively simple.

(37) The method according to the form (35) or (36), wherein the manufacture work performed by said each of the at least one manufacture work machine is constituted by a plurality of unit works each composed of a series of plurality of motions to be performed by at least one of the plurality of work-element performing apparatuses, and wherein the source data to be inputted to the source-data-input accepting section has a hierarchical structure in which are hierarchically arranged: a plurality of unit-work codes which correspond to the plurality of unit works and each of which indicates one of the plurality of unit works; and a plurality of motion-code groups including a plurality of motion codes each of which is associated with one of the plurality of unit-work codes and each of which indicates the series of plurality of motions that are to be performed by the at least one of the plurality of work-element performing apparatuses, the series of plurality of motions constituting one of the plurality of unit works indicated by the associated one of the plurality of unit-work codes.

In this form, the source data is concretely limited. The "source data" described in this form needs to have a hierarchical structure having at least two levels including the unit work codes and the motion-code groups. The source data may have a hierarchical structure having three or more levels. More specifically, the source data may have a structure having a superordinate code of the unit-work codes in which at least one of the plurality of unit works is collectively encoded. The "unit work" described in this form is obtained by dividing the manufacture work such that the motions performed by the respective work-element performing apparatuses are successive and is constituted by s series of a plurality of motions performed by at least one of the plurality of work-element performing apparatuses. That is, the "manufacture work" described in this form may be constituted only by the plurality of unit works or may be constituted by the plurality of unit works and a plurality of single works each of which is composed of one motion performed by one work-element performing apparatus.

(38) The method according to the form (37), wherein each of the plurality of motion codes includes: an apparatus-identifying code for identifying one of the plurality of work-element performing apparatuses that performs a motion indicated by each of the plurality of motion codes; and a work-element code in which is encoded one of the plurality of work elements to be performed by the one of the plurality of work-element performing apparatuses that is identified by the apparatus-identifying code, and wherein the step of inputting the source data to the source-data-input accepting section is a step of inputting, for said each of plurality of motion codes, at least the apparatus-identifying code and the work-element code.

In this form, the setting of the central control device can be executed by inputting at least the work element and the work-element performing apparatus. According to this form, therefore, the central-control-device setting step can be simplified. The "work-element code" described in this form may be the one in which the work element in accordance with the motion code is encoded. The "apparatus-identifying code" may be the one by which is identified the work-element performing apparatus to perform the work element in accordance with the motion code.

(39) The method according to the form (37) or (38), wherein one of the plurality of motion-code groups that is associated with one of the plurality of unit-work codes and another one of the plurality of motion-code groups that is associated with another one of the plurality of unit-work codes are made common except motion parameters for the series of plurality of motions which are indicated by the plurality of motion codes included in the one and said another one of the plurality of motion-code groups and which are to be performed by the at least one of the plurality of work-element performing apparatuses.

There exist a large number of manufacture works in which repeatedly performed works are included. More specifically, in a manufacture work wherein a substrate tray on which a plurality of circuit substrates are placed is conveyed into the manufacture work machine and components are mounted on each of the plurality of circuit substrates, a series of a plurality of works performed on each circuit substrate are substantially the same except for the position at which the mounting work is performed. In such a manufacture work, each of the repeatedly performed works is made as the unit work, whereby a series of a plurality of motions that constitute the unit work can be made common except for the motion parameter such as the position of the mounting work. In this form, each of the repeatedly performed works is made as the unit work, and the series of the plurality of motions of the unit work are made common except for the motion parameter. According to this form, therefore, a plurality of motion-code groups which are substantially similar can be made into one motion-code group, thereby rendering the source data simple.

The "motion parameter" described in this form is a parameter to be used when one work-element performing apparatus performs one motion and is the so-called argument. More specifically, the motion parameter includes a direction, an amount, a time, and a velocity of conveyance and movement, an amount, a time, and a velocity of emission of an auxiliary agent, an amount, a time, and a velocity of implementation of processing and treatment, etc. In the above-described work performed on the circuit substrates, for instance, the position of the mounting work can be changed by changing an amount of the movement of a mounter (mounting device).

(40) The method according to any one of the forms (31)-(39), wherein each of the plurality of work-element performing apparatuses of said each of the at least one manufacture work machine prepared in the work-element-performing-apparatus preparing step has an individual control device configured to control an operation of said each of the plurality of work-element performing apparatuses.

(41) The method according to the form (40), wherein said each of the plurality of work-element performing apparatuses of said each of the at least one manufacture work machine prepared in the work-element-performing-apparatus preparing step has at least one operating device for performing one of the plurality of work elements corresponding to said each of the plurality of work-element performing apparatuses, and wherein said each of the plurality of work-element performing apparatuses is configured such that the individual control device thereof controls an operation of the at least one operating device.

In the above two forms, each of the plurality of work-element performing apparatuses has an individual control device configured to control the operation of the corresponding work-element performing apparatus, and the individual control device can control the operation of the corresponding work-element performing apparatus on the basis of the motion command transmitted from the central control device. Accordingly, each work-element performing apparatus is formed as an intelligent apparatus. That is, since the central control device does not need to control the operation of each work-element performing apparatus, the central control device at least needs to have a functional section to merely transmit the motion command to the work-element performing apparatus. Therefore, the above two forms provide the central control device in which the necessity to execute complicated processing is low.

The "operating device" described in this form may be one controllable operating main element in one work-element performing apparatus or a drive source for the operating main element, such as a motor, for instance. Where the work-element performing apparatus is a conveying apparatus, for instance, a conveying device such as a conveyor is one operating device. It is noted that the operating device is not limited to an operating device functioning as the actuator. Where the plasma processing apparatus, the laser processing apparatus or the like is the work-element performing apparatus, for instance, a plasma generator, a laser generator or the like may be the operating device. Where the image taking apparatus is the work-element performing apparatus, an illuminator or the like is the operating device, in addition to the image taking device such as a camera. Where the work-element performing apparatus includes a plurality of operating devices, the plurality of operating devices are controlled by one individual control device, so that the work-element performing apparatus is formed as an intelligent apparatus.

(42) The method according to the form (40) or (41), wherein the central control device of the main apparatus of said each of the at least one manufacture work machine prepared in the main-apparatus preparing step is configured to transmit the plurality of motion commands in a specific programming language, and wherein the individual control device of each of at least one of the plurality of work-element performing apparatuses of the at least one of the at least one manufacture work machine prepared in the work-element-performing-apparatus preparing step has a command converting section configured to convert one of the plurality of motion commands that is transmitted to the individual control device into a motion command in a programming language by which the individual control device can recognize a matter of the motion command.

A considerably large number of programming languages are currently used, and the programming languages used in the respective work-element performing apparatuses often differ from each other. Accordingly, the programming languages which define a plurality of motion commands to be transmitted from the central control device often differ from each other so as to correspond to the respective work-element performing apparatuses to which the motion commands are to be transmitted. In this form, the individual control device of each work-element performing apparatus recognizes the matter of the motion command transmitted from the central control device, and the operation of the operating device is controlled on the basis of the recognized motion command. According to this form, therefore, it is not necessary to change the programming language that defines the motion command depending upon the work-element performing apparatuses to which the motion commands are transmitted, thereby permitting the central control device to have further reduced necessity to execute complicated processing. In other words, the central-control-device setting step can be simplified. It is noted that the "motion command in the programming language" described in this form is the motion command according to the programming language and means the motion command defined by a certain programming language, more plainly, the motion command described in a certain programming language.

(51) The method according to any one of the forms (31)-(42), wherein each of the plurality of work-element performing apparatuses of said each of the at least one manufacture work machine prepared in the work-element-performing-apparatus preparing step possesses identification information for identification thereof, and wherein the central control device of the main apparatus of said each of the at least one manufacture work machine prepared in the main-apparatus preparing step has a work-element-performing-apparatus identifying section configured to judge, on the basis of the identification information obtained from said each of the plurality of work-element performing apparatuses, whether the plurality of motion commands may be transmitted to said each of the plurality of work-element performing apparatuses.

According to this form, it is possible to render a work-element performing apparatus produced by a non-qualified third party invalid, thereby preventing distribution of the work-element performing apparatus produced by the non-qualified third party. Accordingly, this form enables formation of a network for constructing the manufacture system, whereby the manufacture system with high reliability can be constructed.

(52) The method according to any one of the forms (1)-(51), wherein the main frame of the main apparatus of said each of the at least one manufacture work machine prepared in the main-apparatus preparing step has a specific dimension.

In this form, the main apparatuses the respective manufacture work machines are made identical or the specifications of the main apparatuses are unified, thereby providing the manufacture system with high versatility.

(53) The method according to any one of the forms (1)-(52), wherein the work-element-performing-apparatus installing step is a step of installing each of the plurality of work-element performing apparatuses prepared for said each of the at least one manufacture work machine, onto a specific position of the main frame of the main apparatus prepared for said each of the at least one manufacture work machine, the specific position being determined in accordance with said each of the plurality of work-element performing apparatuses.

In this form, each work-element performing apparatus is installed onto the specific position (reference position), thereby ensuring a fiducial point of each work-element performing apparatus upon operating. The fiducial point upon operating is a fiducial point when the work-element performing apparatus is operated, and the operation of the work-element performing apparatus is controlled using the fiducial point as an origin.

(54) The method according to any one of the forms (1)-(53), wherein each of the plurality of work-element performing apparatuses of said each of the at least one manufacture work machine prepared in the work-element-performing-apparatus preparing step has a size within a certain dimension determined on the basis of a size of a space at a position of the main frame at which said each of the plurality of work-element performing apparatuses is installed.

In this form, the size of each work-element performing apparatus is determined on the basis of the dimension of the installation position of the main frame, thereby simplifying installation in the work-element-performing-apparatus installing step. The "space" described in this form is a space in the main frame occupied by each work-element performing apparatus when the work-element performing apparatus is installed on the main frame. The space may include not only an occupied space by the work-element performing apparatus when the work-element performing apparatus is not operated, but also an occupied space by the work-element performing apparatus when the work-element performing apparatus is operated.

(61) The method according to any one of the forms (1)-(54), wherein the main-apparatus preparing step is a step of preparing the main apparatus by purchasing the main apparatus of said each of the at least one manufacture work machine by a single certain party.

(62) The method according to the form (61), wherein the work-element-performing-apparatus preparing step includes a step of purchasing, from the certain party, at least one of the plurality of work-element performing apparatuses for at least one of the at least one manufacture work machine.

(63) The method according to the form (61) or (62), wherein the work-element-performing-apparatus preparing step includes a step of purchasing, from a party different from the certain party, at least one of the plurality of work-element performing apparatuses for at least one of the at least one manufacture work machine.

(64) The method according to any one of the forms (61)-(63), wherein the work-element-performing-apparatus preparing step includes a step of producing at least one of the plurality of work-element performing apparatuses for at least one of the at least one manufacture work machine.

(65) The method according to any one of the forms (1)-(64), wherein the work-element-performing-apparatus preparing step includes a step of purchasing, from a plurality of parties, the plurality of work-element performing apparatuses for at least one of the at least one manufacture work machine.

In the form (61), the preparation means in the main-apparatus preparing step is concretely limited. In each of the forms (62)-(65), the preparation means in the work-element-performing-apparatus preparing step is concretely limited. As mentioned above, there may be employed various work-element performing apparatuses as each work-element performing apparatus, and the work-element performing apparatuses that can be selected have wide variety. Therefore, it is preferable that a route for preparing the work-element performing apparatuses have wide variety. According to the forms (62)-(65), the work-element performing apparatuses can be prepared through various routes.

BRIEF DESCRIPTION OF DRAWINGS

FIG. 2 is a schematic view of a central control device and a plurality of work-element performing apparatuses of the manufacture system of FIG. 1.

FIG. 4 shows a table indicating basic codes of source data stored in the central control device of FIG. 2.

FIG. 5 shows tables indicating unit-work codes of the source data stored in the central control device of FIG. 2.

FIG. 6 shows tables indicating motion codes of the source data stored in the central control device of FIG. 2.

FIG. 7 shows a table indicating motion commands generated on the basis of the source data.

FIG. 8 is a view showing a reply to a motion command.

FIG. 15 is a table showing constituent components, work elements, work details, manufacture works, and work-element performing apparatuses required for assembling the LED lamp of FIG. 14.

FIG. 17 is a table indicating basic codes of source data stored in a central control device of a first manufacture work machine of the LED-lamp assembling system of FIG. 16.

FIG. 18 shows tables indicating unit-work codes of the source data stored in the central control device of the first manufacture work machine of the LED-lamp assembling system of FIG. 16.

FIG. 19 shows tables indicating motion codes of the source data stored in the central control device of the first manufacture work machine of the LED-lamp assembling system of FIG. 16.

FIG. 21 is a table indicating constituent components, work elements, work details, manufacture works, and work-element performing apparatuses required for assembling the power module of FIG. 20.

FIG. 24 is a table indicating constituent components, work elements, work details, manufacture works, and work-element performing apparatuses required for assembling the solar cell of FIG. 23.

DESCRIPTION OF EMBODIMENTS

There will be hereinafter explained in detail embodiments of the claimable invention with reference to the drawings. It is to be understood that the claimable invention may be embodied with various changes and modifications based on the knowledge of those skilled in the art, in addition to the following embodiments and various forms described in the FORMS OF INVENTION.

EMBODIMENTS

Structure of Manufacture System

Figure 1:
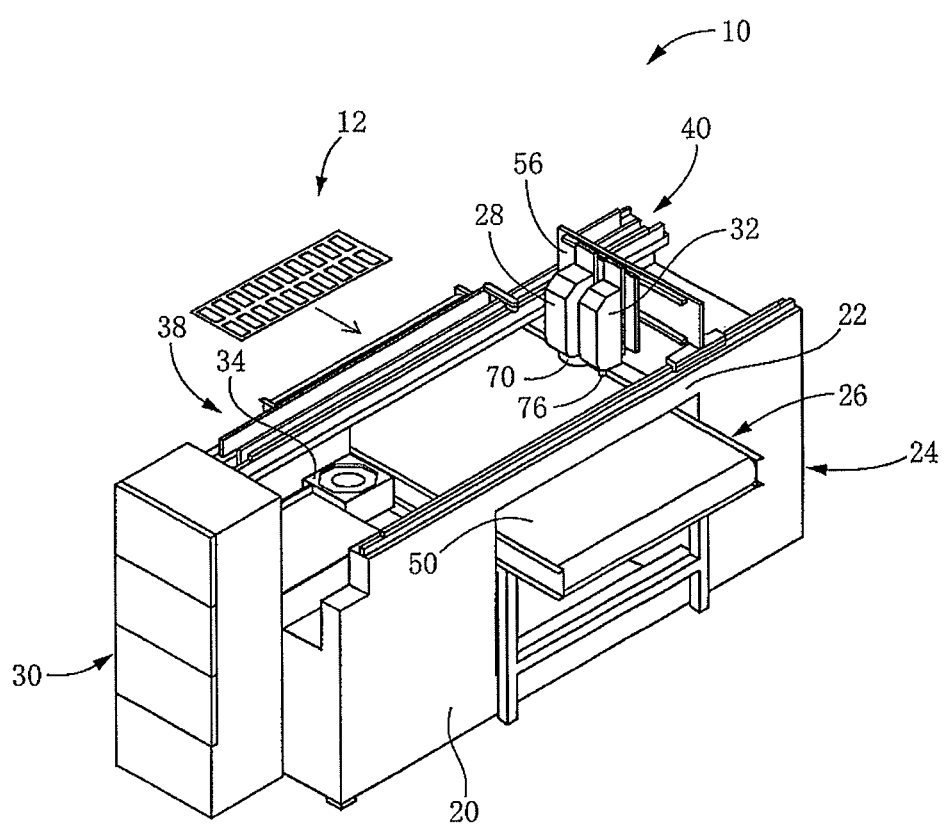
FIG. 1 is a perspective view showing a manufacture system constructed by a manufacture system constructing method according to one embodiment of the claimable invention.

FIG. 1 shows a manufacture system 10 constructed according to a method of constructing a manufacture system (manufacture system constructing method) of the claimable invention. The manufacture system 10 is for manufacturing circuit substrates on each of which an electronic circuit component or part (hereinafter abbreviated as "component" where appropriate) is mounted and is constituted by one manufacture work machine 12. The manufacture work machine 12 is configured to perform a manufacture work. More specifically, the manufacture work machine 12 is an assembling work machine configured to perform mounting of the component with respect to the circuit substrate and application of an adhesive. The manufacture work machine 12 includes: a machine main body 24, as a base, including a frame portion 20 and a beam portion 22 disposed over the frame portion 20; a conveyor (conveying apparatus) 26 configured to convey the circuit substrates; a mounter 28, as a work head device for an assembling work, configured to mount the component onto the circuit substrate; a component supplier (hereinafter abbreviated as "supplier" where appropriate) 30 disposed at one end of the frame portion 20 and configured to supply the component to the mounter 28; a dispenser 32, as a work head device for an assembling work, configured to apply an adhesive to the circuit substrate; a camera device 38 including a base camera 34 disposed between the supplier 30 and the conveyor 26 and a head camera 36 (FIG. 10) disposed rearward of the mounter 28; and a moving device 40 disposed in the beam portion 22 and configured to move the mounter 28, the dispenser 32, and the head camera 36 in a region. Here, a longitudinal direction of the manufacture work machine 12 is referred to as a front-rear direction, a horizontal direction perpendicular to the longitudinal direction is referred to as a left-right direction, and a vertical direction perpendicular to the longitudinal direction is referred to as an up-down direction. Since each of the apparatuses 26, 28, 30, 32, 38, 40 that constitute the manufacture work machine 12 is known, an explanation thereof will be made simply.

The conveyor 26 is configured to convey the circuit substrates placed on a conveyor belt 50 in the left-right direction by rotating the conveyor belt 50 by a conveyance motor 52 (FIG. 2). That is, the conveyor 26 functions as a work-element performing apparatus configured to perform conveyance of each circuit substrate to and from a specific position, as a work element. The supplier 30 is a tray unit type supplier and includes: a plurality of component trays (not shown) on each of which a plurality of components are placed; and a tray moving device 54 (FIG. 2) configured to move any of the plurality of component trays to a position at which the component can be supplied to the mounter 28. That is, the supplier 30 functions as a work-element performing apparatus configured to perform supplying of the components, as a work element.

The moving device 40 is an XYZ-robot-type moving device and includes: an electromagnetic motor 58 (FIG. 2) for permitting a slider 56 that holds the mounter 28, the dispenser 32, and the head camera 36 to slidingly move in the left-right direction; an electromagnetic motor 60 (FIG. 2) for permitting the slider 56 to slidingly move in the front-rear direction; and an electromagnetic motor 62 (FIG. 2) for permitting the slider 56 to slidingly move in the up-down direction. The operations of the electromagnetic motors 58, 60, 62 enable the mounter 28, the dispenser 32, and the head camera 36 to move to respective arbitrary positions. That is, the moving device 40 functions as a head moving device configured to perform a movement of the mounter 28 and the dispenser 32 each as the work head device. While the moving device 40 functions also as a work-element performing apparatus configured to perform movements of other work-element performing apparatuses, the moving device 40 in the present manufacture system 10 cooperates with the machine main body 24 to constitute a main frame.

The mounter 28 is fixedly held by the slider 56 as a head installing portion of the moving device 40 and includes, at its lower end, a component holder 70. The component holder 70 communicates with a negative-pressure air passage and a positive-pressure air passage via a positive/negative pressure supplier 72 (FIG. 2) and is configured to suction-hold the component by a negative pressure and to release the suction-held component by a slight positive pressure supplied thereto. That is, the mounter 28, as a holding and releasing head device, functions as a work-element performing apparatus configured to perform holding and releasing of the component, as a work element. The dispenser 32 is fixedly held by the slider 56 of the moving device 40 and includes: a dispenser nozzle 76 provided at a lower end of the dispenser 32 for ejecting an adhesive; and an ejecting device 78 (FIG. 2) for permitting ejection of an arbitrary amount of the adhesive from the dispenser nozzle 76. That is, the dispenser 32 functions as a work-element performing apparatus configured to perform ejection of the adhesive, as a work element.

The camera device 38 is constituted by: the head camera 36 fixedly disposed at a lower portion of the slider 56 so as to face downward; a light source 80 (FIG. 2) for the head camera 36;

the base camera 34 fixedly disposed between the supplier 36 and the conveyor 26 so as to face upward; a light source 82 (FIG. 2) for the base camera 34; and a capture board 84 (FIG. 2) connected to the head camera 36, the base camera 34, and the light sources 80, 82. The head camera 36 is capable of taking an image of the circuit substrate on the conveyor 26 while the base camera 34 is capable of taking an image of the component which is suction-held by the mounter 28. That is, the camera device 38 functions as a work-element performing apparatus configured to perform image taking of the circuit substrate and the component, as a work element.

The present manufacture work machine 12 is constituted by six apparatuses, namely, the conveyor 26, the mounter 28, the supplier 30, the dispenser 32, the camera device 38, and the moving device 40. The six apparatuses include respective individual control devices, as shown in FIG. 2. More specifically, the moving device 40 includes: a moving-device control device 90, as the individual control device, for controlling the operations of the respective three electromagnetic motors 58, 60, 62; and three servo amps 92, 94, 96 that correspond to the respective three electromagnetic motors 58, 60, 62. The moving-device control device 90 is configured to send a control signal to each servo amp 92, 94, 96, thereby controlling the operations of the respective electromagnetic motors 58, 60, 62. The mounter 28 includes: a mounter control device 100, as the individual control device, for controlling the operation of the positive/negative pressure supplier 72 as an operating device; and a drive circuit 102 for the positive/negative pressure supplier 72. The mounter control device 100 is configured to send a control signal to the drive circuit 102, thereby controlling the operation of the positive/negative pressure supplier 72.

The dispenser 32 includes: a dispenser control device 104, as the individual control device, for controlling the operation of the ejecting device 78 as an operating device; and a drive circuit 106 for the ejecting device 78. The dispenser control device 104 is configured to send a control signal to the drive circuit 106, thereby controlling the operation of the ejecting device 78. The supplier 30 includes: a supplier control device 108, as the individual control device, for controlling the operation of the tray moving device 54 as an operating device; and a drive circuit 110 for a motor as a drive source of the tray moving device 54. The supplier control device 108 is configured to send a control signal to the drive circuit 110, thereby controlling the operation of the tray moving device 54. The conveyor 26 includes: a conveyor control device 112, as the individual control device, for controlling the operation of the conveyance motor 52 as an operating device; and a drive circuit 114 for the conveyance motor 52. The conveyor control device 112 is configured to send a control signal to the drive circuit 114, thereby controlling the operation of the conveyance motor 52.

The camera device 38 includes, as the individual control device, a camera-device controller 116 for executing transmission of a control signal to perform image taking by the base camera 34 or the head camera 36 and for executing processing of image data obtained by the image taking. While the camera-device controller 116 is provided in an auxiliary central control device 118 which will be explained, the camera-device controller 116 is independent in the auxiliary central control device 118 and is connected to the capture board 84 of the camera device 38 via a bus 120. Therefore, the camera-device controller 116 is not treated as a constituent element of the auxiliary central control device 118, but is treated as a constituent element of the camera device 38.

The manufacture work machine 12 further includes a central control device constituted by: a main central control device 130 configured to control the six apparatuses 26, 28, 30, 32, 38, 40 in a centralized manner; and the auxiliary central control device 118. The main central control device 130 is mainly for transmitting motion commands to each of the individual control devices 90, 100, 104, 108, 112, 116 of the respective apparatuses 26, 28, 30, 32, 38, 40. The main central control device 130 is connected, via a repeater hub 132, to the individual control devices 90, 100, 104, 108, 112, 116 by respective serial communication cables 134 of the same kind for transmission of the motion commands. The auxiliary central control device 118 includes an auxiliary central controller 136. In the auxiliary central controller 136, there is stored a source program which is a basis of the motion commands to the individual control device 90, etc., namely, source data for performing a specific manufacture work. (Hereinafter, "the individual control device 90, etc." collectively refer to each of the individual control devices 90, 100, 104, 108, 112, 116 where appropriate.) In the stored source data, the operation of each of the six apparatuses 26, etc., is encoded. The auxiliary central controller 136 is configured to convert the source data into the motion commands in accordance with a certain specific programming language and to transmit the converted motion commands to the main central control device 130. The auxiliary central controller 136 and the main central control device 130 are connected to each other by a LAN cable 140 via a hub 138, and the motion commands converted in the auxiliary central controller 136 are transmitted to the main central control device 130 via the LAN cable 140. To the hub 138, one end of each of six LAN cables 140 which are identical in kind to the LAN cable 140 is connected, and another end of each of the six LAN cables 140 is connected to a corresponding one of the individual control devices 90, etc., of the respective apparatuses 26, etc. (Hereinafter, "the apparatus 26, etc." collectively refer to each of the apparatuses 26, 28, 30, 32, 38, 40 where appropriate.) Each of the serial communication cables 134 and the LAN cables 140 is constituted by a wire portion and connector portions, each of which may be a general-purpose item or a special item developed exclusively for the present manufacture system 10.

The manufacture work machine 12 further includes a display device 150 of a touch-panel type through which information as to the operation of the manufacture work machine 12 is inputted and outputted. The display device 150 is connected to: the main central control device 130 by a LAN cable 140 which is identical in kind to the LAN cables 140 via the hub 138; and the auxiliary central controller 136 by a serial communication cable 152 and an RGB analog cable 154. The manufacture work machine 12 further includes an emergency stop switch 156 which is connected to the main central control device 130 and the individual control device 90, etc., of the work-element performing apparatus 26, etc., by I/O cables 160 via a terminal relay 158. To the main central control device 130, there are connected: a plurality of switches 162 such as a power source switch and a startup switch of the manufacture work machine 12; and a plurality of indicator lamps 164 such as an indicator lamp indicating that the manufacture work machine 12 is in startup and an indicator lamp indicating that the manufacture work machine 12 is in an operable state.

<Operation of Manufacture System>

Figure 3A:
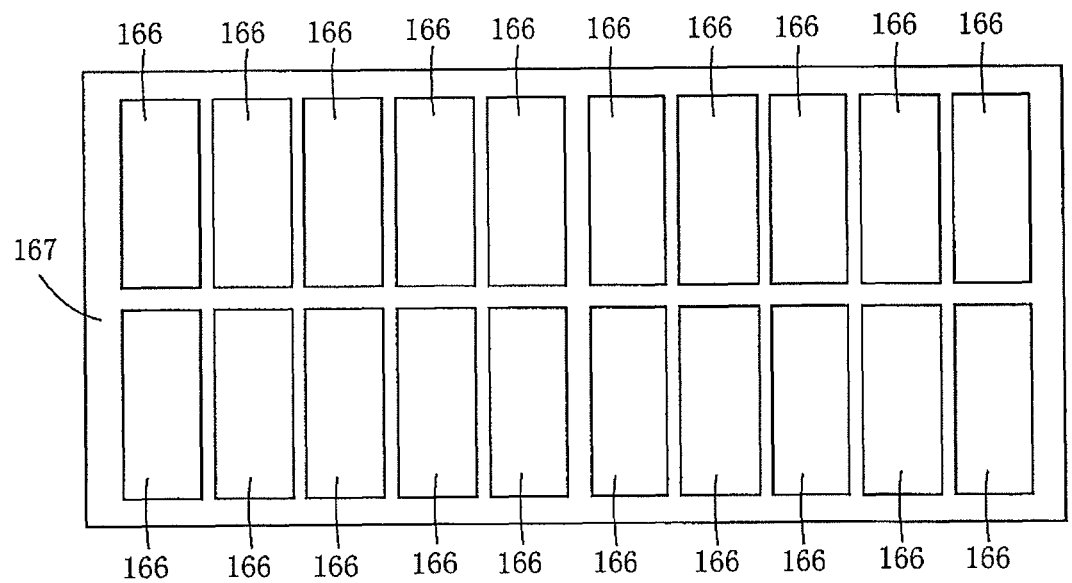
FIG. 3A is a view showing a substrate tray conveyed into the manufacture system of FIG. 1 and FIGS. 3B and 3C are views each showing a circuit substrate placed on the substrate tray.
Figure 3B:
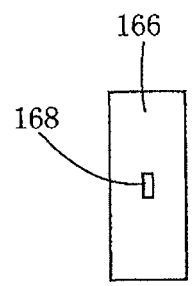
Figure 3C:
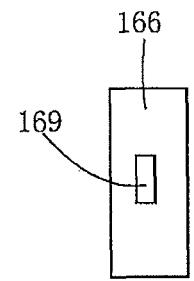

In the manufacture work machine 12 of the present manufacture system 10, the above-described respective six apparatuses 26, etc., perform respective works according to the source data stored in the auxiliary central controller 136, whereby a mounting work of the component onto the circuit substrate is performed. There will be concretely explained a manufacture work in which the component is fixed onto the circuit substrate by the adhesive. As shown in FIG. 3A, twenty circuit substrates 166, each as a first component, are placed in advance on a substrate tray 167, and the substrate tray 167 is conveyed into the present manufacture work machine 12. An adhesive 168 is applied to one of the circuit substrates 166 on the substrate tray 167, as shown in FIG. 3B. As shown in FIG. 3C, an electronic circuit component 169, as a second component, is mounted on the adhesive 168 applied as described above. The adhesive application work and the component mounting work are thus performed, whereby the work on one circuit substrate 166 is completed, and one circuit substrate on which the component has been mounted is manufactured as a product. Then the adhesive application work and the component mounting work are subsequently performed on another circuit substrate 166. When the works with respect to all of the twenty circuit substrates 166 are completed, the substrate tray 167 is conveyed out of the manufacture work machine 12.

The source data relating to the manufacture work has three kinds of basic codes given thereto, as shown in FIG. 4. The basic codes include a preparation work for performing a work with respect to the circuit substrate 166, a work with respect to the circuit substrate 166 (i.e., substrate-related work), and a finishing work performed after the work with respect to the circuit substrate 166. Since the work with respect to the circuit substrate 166 (the substrate-related work) needs to be performed on the twenty circuit substrates 166, twenty substrate-related works are included. While, in FIG. 4, names of the basic codes are described, there may be instances in which information as to work performance, such as positional information of each circuit substrate 166, is described, together with the names of the basic codes.

Each of the three kinds of basic codes is encoded as shown in FIG. 5 and is constituted by at least one unit-work code. More specifically, the preparation-work code is constituted by a unit-work code for performing preparation of the substrate tray 167 and the component trays on each of which the components to be mounted are placed (tray preparation). The finishing-work code is constituted by a unit-work code for performing sent-out of the substrate tray 167 (tray send-out). The substrate-related-work code is constituted by three kinds of unit-work codes including: obtaining of information relating to the circuit substrate 166 (substrate-information obtaining); application of the adhesive to the circuit substrate 166 (adhesive application); and mounting of the component on the circuit substrate (component mounting). There may be instances in which information as to work performance, such as a conveyance amount of the substrate tray 167, is described in any of the unit-work codes.

In each unit-work code, a unit work constituted by a series of a plurality of works is encoded as shown in FIG. 6 and is constituted by a plurality of motion codes, namely, a motion-code group. It is noted, however, that the tray-send-out code is constituted by only one motion code. More specifically, the tray-preparation code is constituted by a motion code for conveying the substrate tray 167 to a specific position and a motion code for supplying the component tray on which are placed the components to be mounted. The substrate-information-obtaining code is constituted by a motion code for moving the head camera 36 to a position at which the head camera 36 can take an image of the circuit substrate 166 and a motion code for taking an image of the circuit substrate 166 by the head camera 36 and obtaining the positional information of the circuit substrate 166. The adhesive application code is constituted by a motion code for moving the dispenser 32 to an application position of the adhesive on the basis of the obtained positional information and a motion code for applying the adhesive to the circuit substrate 166. The component-mounting code is constituted by a motion code for moving the mounter 28 to a supply position of the component, a motion code for holding the component, a motion code for moving the mounter 28 that holds the component above the base camera 34, a motion code for taking, by the base camera 34, an image of the component held by the mounter 28 and obtaining information about the hold state of the component, a motion code for moving the mounter 28 to a mounting position of the component on the basis of the positional information of the circuit substrate and the information about the hold state of the component, and a motion code for releasing the component. The tray-send-out code is constituted by a motion code for sending out the circuit substrate 166 on which the component has been mounted, namely, the substrate tray 167 on which assembled articles are placed. Here, each motion code indicates one work-element performing apparatus and one work element performed by the work-element performing apparatus, and is constituted by: a work-element code in which the work element in accordance with the motion code is encoded; and an apparatus-identifying code by which is identified the work-element performing apparatus capable of performing the work element.

The source data encoded so as to have the hierarchy structure described above is stored in the auxiliary central controller 136, and performable-motion information as to the motion that can be performed by each of the respective six apparatuses 26, etc., is also stored in the auxiliary central controller 136. The performable-motion information includes the motion that can be performed by each work-element performing apparatus 26, etc., when the apparatus performs the work. For instance, the performable-motion information includes the supply of the components where the work-element performing apparatus is the supplier 30. The performable-motion information includes the holding or the releasing of the component where the work-element performing apparatus is the mounter 28. The performable-Motion information further includes an operating range and dimensions of the work-element performing apparatus 26, etc., a fiducial point upon operating, and so on. Here, the fiducial point upon operating is a fiducial point when each of the apparatus 26, etc., operates, and the motion amount of each of the apparatus 26, etc., and so on are determined using the fiducial point as an origin.

In the present manufacture system 10, motion commands are generated in the auxiliary central controller 136 on the basis of the source data. Each motion command is a command which relates to the motion performed by each of the six work-element performing apparatuses 26, etc., and which is transmitted to each of the six work-element performing apparatuses 26, etc. When the motion commands are generated, the above-described performable-motion information is referred to, and, the motion commands including the operating manner, the motion amount, etc., of each of the work-element performing apparatuses 26, etc., are generated. More specifically, as shown in FIG. 7, the following motion commands are generated: (1) a motion command for conveying the circuit substrate by the conveyor 26 by a specific amount; (2) a motion command for supplying a specific component tray by the supplier 30; (3) a motion command for moving the head camera 36 by the moving device 40 by a specific amount; (4) a motion command for obtaining the positional information of the circuit substrate by image taking by the head camera 36; (5) a motion command for moving the dispenser 32 by the moving device 40 by a specific amount; (6) a motion command for ejecting the adhesive by the dispenser 32 by a specific amount; (7) a motion command for moving the mounter 28 by the moving device 40 by a specific amount; (8) a motion command for holding the component by the mounter 28; (9) a motion command for moving the mounter 28 by the moving device 40 by a specific amount; (10) a motion command for obtaining information as to the hold state of the component by image taking by the base camera 34; (11) a motion command for moving the mounter 28 by the moving device 40 by a specific amount; (12) a motion command for releasing the component by the mounter 28; and (203) a motion command for conveying the circuit substrate by the conveyor 26 by a specific amount. Here, the motion commands Nos. (3)-(12) are for performing the work with respect to one circuit substrate 166. In the motion commands No. (13)-(202), the motion commands substantially similar to the motion commands Nos. (3)-(12) are repeated nineteen times. It is noted, however, that the movement amounts of the moving device 40 in the respective motion commands Nos. (13)-(202) differ from each other for the respective circuit substrates 166.

As explained above, a group of two hundred and three motion commands shown in FIG. 7 is generated in the auxiliary central controller 136 on the basis of the source data in the format shown in FIGS. 4-6. In the present manufacture system 10, the source data is encoded according to a structured programming technique, namely, according to a technique of describing, in stepwise, the work for performing the manufacture work into detailed units. The source data described in the three-level hierarchy structure is comparatively simple, as compared with the motion command group shown in FIG. 7. More specifically, in each of the substrate-information-obtaining code, the adhesive application code, and the component-mounting code among the unit-work codes shown in FIG. 6, the motion codes are made common to all of the twenty circuit substrates 166, and it is considered that each of the three unit-work codes is constituted by common motion group codes. Since the motion group in each unit-work code is made common to all of the circuit substrates, it is required to only describe, in the source data, the substrate-information-obtaining code, the adhesive application code, and the component-mounting code for one circuit substrate 166, thereby eliminating a need to describe, repeatedly twenty times, the motion codes that constitute each of the three unit-work codes. Accordingly, in the present manufacture system 10, the source data can be easily formed. In this respect, even if the motion codes are the common motion group codes, the positions at which the respective circuit substrates 166 are placed differ from each other, and motion parameters of the moving device 40, etc., namely, the movement amounts of the moving device 40, etc., differ from each other. Accordingly, the motion parameters are adjusted for each circuit substrate when the motion commands are generated.

The above-described plurality of motion commands are transmitted from the auxiliary central controller 136 to the main central control device 130 via the LAN cable 140, and the plurality of motion commands are sequentially transmitted by the main central control device 130 to the individual control devices 90, etc., of the respective work-element performing apparatuses 26, etc., via the respective serial communication cables 134. The motion commands from the main central control device 130 are transmitted to the individual control devices 90, etc., of all of the work-element performing apparatuses 26, etc., without particularly specifying destination devices. However, as explained below, each motion command designates the work-element performing apparatus to be operated by the motion command. Therefore, the work-element performing apparatus to be operated operates in accordance with the motion command. Hereinafter, the operations of the work-element performing apparatuses according to the respective motion commands are concretely explained.

The main central control device 130 initially transmits, via the serial communication cable 134, a motion command for conveying the substrate tray 167 to a specific position. The motion command to be transmitted is in a format shown in the motion command No. (1) in FIG. 7. A main command in FIG. 7 is for commanding: the work-element performing apparatus which should perform one motion that corresponds to the motion command; and initiation or termination of the one motion to be performed by the work-element performing apparatus. The main command in this motion command is for commanding initiation of conveyance of the substrate tray 167 by the conveyor 26. An associated command in FIG. 7 is issued as needed and is for commanding the motion parameter for the one motion to be performed by the work-element performing apparatus. More specifically, the associated command in this motion command is for commanding a conveyance amount by the conveyor 26, namely, a moving distance. As the associated command, there may be employed various parameters such as a conveyance speed, a conveyance time, and a conveyance direction. A command state in FIG. 7 indicates presence or absence of the motion command. In a state in which the motion command is being issued, the command state is set to "command issuing". In a state in which the motion command is not issued, the command state is set to "command absent". That is, in this motion command, the command state is set to "command issuing".

The conveyor control device 112 which has received the motion command from the main central control device 130 needs to control the operation of the conveyance motor 52 on the basis of the motion command. However, the motion command transmitted from the main central control device 130 is based on a certain specific programming language and is not based on a programming language that the conveyor control device 112 can handle. Therefore, the motion command transmitted from the main central control device 130 cannot cause the conveyance motor 52 to operate. The conveyor control device 112 has a function of converting the motion command from the main central control device 130 into a motion command based on a programming language compatible thereto, namely, a programming language that the conveyor control device 112 can handle. The conveyor control device 112 is configured to control the operation of the conveyance motor 52 on the basis of the motion command converted by itself. The matter of the main command, the matter of the associated command, etc., indicated in FIG. 7, more specifically, "conveyor: conveyance", "conveyance amount", etc., in the motion command No. (1) are the motion commands according to the certain specific programming language.

It is noted that each of the individual control devices 100, 104, 108 of the mounter 28, the supplier 30, and the dispenser 32, respectively, has a similar function and can convert the motion command from the main central control device 130 into a motion command based on a programming language compatible thereto. However, the moving-device control device 90 of the moving device 40 and the camera-device controller 116 of the camera device 38 can handle the programming language that defines the motion command transmitted from the main central control device 130. Therefore, the moving-device control device 90 and the camera-device controller 116 do not have a function of converting the motion command from the main central control device 130.

When the operation of the conveyor 26 by the motion command from the main central control device 130 is terminated, namely, when the substrate tray 167 is conveyed to the specific position, a reply to the motion command is transmitted from the conveyor control device 112 to the main central control device 130 via the serial communication cable 134. The reply to be transmitted is in a format shown in FIG. 8. An operation result in FIG. 8 indicates whether or not the operation of the work-element performing apparatus by the motion command has been appropriately performed. In this reply, whether or not the substrate tray 167 has been conveyed to the specific position is indicated. The operation result in FIG. 8 may indicate, as needed, a parameter of the operation result such as the position to which the substrate tray 167 has been conveyed. A command state in FIG. 8 indicates completion of the operation of the work-element performing apparatus by the motion command. In this reply, the command state is set to "completion". When the main central control device 130 receives the reply as to termination, the command state is set to "command absent". Here, a state of the work-element performing apparatus in FIG. 8 indicates whether or not there is abnormality in the work-element performing apparatus. The state of the work-element performing apparatus is not utilized in the reply to the motion command, but is utilized in transmission when there is a risk that the work-element performing apparatus does not operate normally, as explained below.

The main central control device 130 transmits next motion command after it is confirmed that the substrate tray 167 has been conveyed to the specific position, namely, after the command state has been set to "command absent" by reception of the reply as to termination of the conveyance. The next motion command is in a format shown in the motion command No. (2) in FIG. 7 and is for supplying the component tray on which the components to be mounted are placed. In this motion command, the main command is for commanding supply of the component tray by the supplier 30 while the associated command is for designating the component tray on which the components to be mounted are placed. When the supplier control device 108 receives the motion command, the supplier control device 108 converts the motion command from the main central control device 130 into a motion command based on a programming language which the supplier control device 108 can handle, like the conveyor control device 112, and controls the operation of the tray moving device 54 on the basis of the motion command converted by itself. When the operation by the motion command is terminated, a reply to the motion command is transmitted from the supplier control device 108 to the main central control device 130 via the serial communication cable 134. Here, there may be an instance in which the positional information of the component to be mounted is attached to the operation result in the reply from the supplier control device 108.

Next, the main central control device 130 transmits the motion command (the motion command No. (3) in FIG. 7) for moving the head camera 36 to a position at which an image of the circuit substrate 166 on the substrate tray 167 can be taken, after the command state has been set to "command absent" by reception of the reply as to termination of the tray supply. In the present manufacture system 10, the reply as to termination of the tray supply is transmitted after supply of the specific component tray has been terminated. Where a termination time point of the tray supply is estimated, the reply as to termination of the tray supply may be transmitted prior to the termination time point. Even if the mounter 28 is moved by the moving device 40 in the midst of supplying of the component tray, the two works are not likely to mutually interfere. Accordingly, by moving the mounter 28 by the moving device 40 in the midst of supplying of the component tray, it is possible to reduce a time required for the manufacture work.

In the motion command for moving the head camera 36, the main command is for commanding initiation of the movement of the head camera 36 by the moving device 40 while the associated command is for commanding a movement amount in the front-rear direction, a movement amount in the left-right direction, and a movement amount in the up-down direction. In setting the associated command, it is possible to utilize the operation result in the reply from the conveyor control device 112, more specifically, information as to the position to which the substrate tray 167 has been conveyed. When the moving-device control device 90 receives the motion command, the moving-device control device 90 controls the operation of each of the three electromagnetic motors 58, 60, 62 on the basis of the received motion command, without converting the received motion command, because the moving-device control device 90 can recognize the programming language that defines the motion command transmitted from the main central control device 130 as explained above. When the operation of the moving device 40 by the motion command is terminated, the reply to the motion command is transmitted from the moving-device control device 90 to the main central control device 130 via the serial communication cable 134.

Subsequently, the main central control device 130 transmits a next motion command after the command state has been set to "command absent" by reception of the reply as to termination of the movement of the head camera 36. More specifically, the main central control device 130 transmits the motion command (the motion command No. (4) in FIG. 7) for taking an image of the substrate by the head camera 36 and obtaining the positional information of the substrate. In this motion command, the main command is for commanding the image taking of the circuit substrate 166 by the head camera 36 and initiation of processing of the image data obtained by the image taking. Like the moving-device control device 90, the camera-device controller 116 can recognize the programming language that defines the motion command transmitted from the main central control device 130. Accordingly, when the camera-device controller 116 receives the motion command, the camera-device controller 116 controls the head camera 36 and the light source 80 on the basis of the received motion command. The camera-device controller 116 processes the image data obtained by the image taking, thereby obtaining the positional information of the circuit substrate 166. When the operation by the motion command is terminated, a reply to the motion command is transmitted from the camera-device controller 116 to the main central control device 130. There is attached position data of the circuit substrate 166 obtained by the image taking to the operation result in the reply from the camera-device controller 116.

After the command state has been set to "command absent" by reception of the reply as to termination of obtaining of the positional information of the circuit substrate 166, the main central control device 130 transmits the motion command (the motion command No. (5) in FIG. 7) for moving the dispenser 32 to a position at which the adhesive is to be applied. In this motion command, the main command is for commanding initiation of the movement of the dispenser 32 by the moving device 40 while the associated command is for commanding movement amounts in the front-rear direction, the left-right direction, and the up-down direction, respectively. In setting the associated command, the operation result in the reply from the camera-device controller 116, more specifically, the positional information of the circuit substrate 166, is utilized. When the moving-device control device 90 receives the motion command, the moving-device control device 90 controls the operations of the respective electromagnetic motors 58, 60, 62 on the basis of the received motion command. When the operation by the motion command is terminated, a reply to the motion command is transmitted from the moving-device control device 90 to the main central control device 130.

After the command state has been set to "command absent" by reception of the reply as to termination of the movement of the dispenser 32, the main central control device 130 transmits the motion command (the motion command No. (6) in FIG. 7) for applying the adhesive to the circuit substrate 166. In this motion command, the main command is for commanding initiation of ejection of the adhesive by the dispenser 32 while the associated command is for commanding an ejection amount of the adhesive. As the associated command, there may be employed various motion parameters such as an ejection speed, an ejection time, an opening amount of an ejection hole through which the adhesive is ejected. Unlike the moving-device control device 90 and the camera-device controller 116, the dispenser control device 104 cannot handle the programming language that defines the motion command transmitted from the main central control device 130. Accordingly, when the dispenser control device 104 receives the motion command, the dispenser control device 104 converts the motion command from the main central control device 130 into a motion command according to a programming language which the dispenser control device 104 can handle and controls the operation of the ejecting device 78 on the basis of the motion command converted by itself. When the adhesive 168 is applied to the specific position on the circuit substrate 166 by the operation of the ejecting device 78 based on the motion command, a reply to the motion command is transmitted from the dispenser control device 104 to the main central control device 130. An explanation of the operation of each of the work-element performing apparatuses 28, etc., by subsequent motion commands is dispensed with for avoiding redundancy of the description.

In each of the individual control devices 90, etc., of the respective work-element performing apparatuses 26, etc., there is incorporated an IC chip (not shown) in which identification information for identification of each device is stored. Upon startup of the manufacture work machine 12, the identification information stored in the IC chip is transmitted to the main central control device 130 via the LAN cables 140. The main central control device 130 is configured to transmit the motion command only where transmission of the identification information from each of the individual control devices 90, etc., is confirmed. In the present manufacture work machine 12, while the identification information is transmitted via the LAN cables 140, the identification information may be transmitted via the serial communication cables 134 or the I/O cables 160. Further, the identification information may be transmitted in wireless communication instead of wireline communication.

Where there is a risk that the work-element performing apparatus 26, etc., does not operate normally due to abnormality thereof, the corresponding individual control device 90, etc., of the work-element performing apparatus 26, etc., which is suffering from the abnormality transmits information that there is a risk of operation failure, to the main central control device 130 via the serial communication cable 134. More specifically, data in a format shown in FIG. 8 is transmitted from the individual control device 90, etc., of the work-element performing apparatus 26, etc., which may not operate normally, to the main central control device 130. The main central control device 130 which has received the data suspends transmission of the motion commands not only to the individual control device 90, etc., of the work-element performing apparatus 26, etc., which may not operate normally, but also to the individual control devices 90, etc., of all of the work-element performing apparatuses 26, etc., so as to deal with the abnormality of the work-element performing apparatus 26, etc. The main central control device 130 is capable of grasping the abnormality of the work-element performing apparatus 26, etc., by communication through the serial communication cable 134. In view of fail-safe or the like, the individual control device 90, etc., of the work-element performing apparatus 26, etc., which is suffering from the abnormality transmits the information of the abnormality to the main central control device 130 also via the I/O cable 160.

Each of the individual control devices 90, etc., of the work-element performing apparatuses 26, etc., is configured to individually store performable-motion information which is information relating to the motion that can be performed by the corresponding work-element performing apparatus 26, etc. The performable-motion information to be stored includes not only the motion that the work-element performing apparatus can perform and the operation range and the dimensions of the work-element performing apparatus, but also the capability of the work-element performing apparatus and the control gain of the work-element performing apparatus. The capability of the work-element performing apparatus to be stored includes output capability of an electromagnetic motor where the apparatus includes the electromagnetic motor and a speed reduction ratio of a speed reducer where the apparatus includes the speed reducer. The control gain to be stored includes a control gain in determining a supply power to an electromagnetic motor where the apparatus includes the electromagnetic motor.

The performable-motion information stored in the individual control device 90, etc., of the work-element performing apparatus is transmitted from the individual control device 90, etc., to the auxiliary central controller 136 via the LAN cable 140 and stored in the auxiliary central controller 136. The performable-motion information stored in the auxiliary central controller 136 is not only utilized in generating the motion command on the basis of the source data as described above, but also utilized in backup or the like. Where the control gain of the conveyance motor 52 of the conveyor 26 is stored in the auxiliary central controller 136, for instance, the control gain of the conveyance motor 52 of the conveyor 26 can be changed by changing the stored control gain and transmitting information as to the changed control gain to the conveyor control device 112.

The individual control device 90, etc., of the work-element performing apparatus 26 etc., is incorporated in a main body of the work-element performing apparatus 26, etc., namely, the main body that actually operates to perform the work element, or is located in the manufacture work machine 12. Accordingly, it is rather difficult to directly access the individual control device 90, etc., for program change, program version up and so on of the individual control device 90, etc. In the present manufacture system 10, therefore, it is possible to transmit the changed program and so on from the auxiliary central controller 136 to the individual control device 90, etc., of the work-element performing apparatus 26, etc., via the LAN cable 140.

<Functional Structure of Each Control Device>

Figure 9:
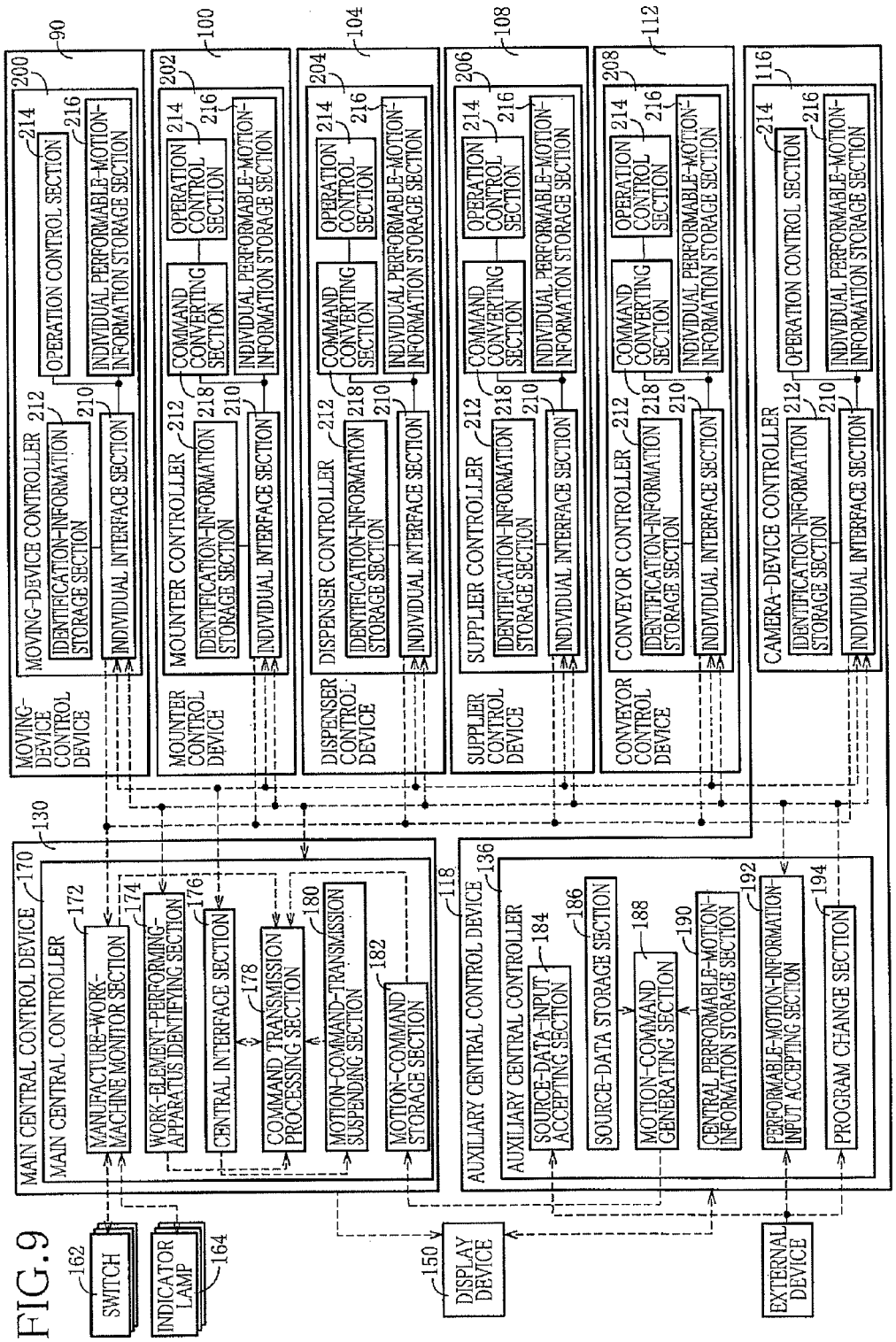
FIG. 9 is a control block diagram of the central control device and the plurality of work-element performing apparatuses of the manufacture system of FIG. 1.

The main central control device 130, the auxiliary central control device 118, and the individual control device 90, etc., of the work-element performing apparatus 26, etc., may be regarded to have functional structures shown in FIG. 9 in view of processing to be performed by each of the same 130, 118, 90, etc. As apparent from FIG. 9, the main central control device 130 has a main central controller 170 constituted principally by a computer equipped with a CPU, a ROM, a RAM and so on. The main central controller 170 includes: a manufacture-work-machine monitor section 172 as a functional section to monitor the operating state of the manufacture work machine 12; a work-element-performing-apparatus identifying section 174 as a functional section to identify the work-element performing apparatuses 26, etc., to which the motion command can be transmitted, by obtaining the identification information from the individual control devices 90, etc., of the work-element performing apparatuses 26, etc.; a central interface section 176 as a functional section to communicate with the individual control devices 90, etc.; a command transmission processing section 178 as a functional section to execute transmission processing of the motion command; a motion-command-transmission suspending section 180 as a functional section to suspend transmission of the motion command when there is a risk that any of the work-element performing apparatuses 26, etc., does not normally operate; and a motion-command storage section 182 as a functional section to store the plurality of motion commands.

The auxiliary central controller 136 of the auxiliary central control device 118 includes: a source-data-input accepting section 184 as a functional section to accept input of the source data from the exterior; a source-data storage section 186 as a functional section to store the source data; a motion-command generating section 188 as a functional section to generate the motion command on the basis of the source data; a central performable-motion-information storage section 190 as a functional section to store the performable-motion information of all of the work-element performing apparatuses 26, etc., in a centralized manner; a performable-motion-information-input accepting section 192 as a functional section to accept input of the performable-motion information from the exterior; and a program change section 194 as a functional section to change programs of the individual control devices 90, etc., of the work-element performing apparatuses 26, etc.

Each of the moving-device control device 90, the mounter control device 100, the dispenser control device 104, the supplier control device 108, and the conveyor control device 112 includes a controller constituted principally by a computer equipped with a CPU, a ROM, a RAM and so on. More specifically, the moving-device control device 90 includes a moving-device controller 200. The mounter control device 100 includes a mounter controller 202. The dispenser control device 104 includes a dispenser controller 204. The supplier control device 108 includes a supplier controller 206. The conveyor control device 112 includes a conveyor controller 208. Each of the moving-device controller 200, the mounter controller 202, the dispenser controller 204, the supplier controller 206, the conveyor controller 208, and the camera-device controller 116 includes: an individual interface section 210 as a functional section to communicate with the main central controller 170 and the auxiliary central controller 136; an identification-information storage section 212 as a storage section to store the identification information of the work-element performing apparatus 26, etc.; an operation control section 214 as a functional section to control the operation of the work-element performing apparatus 26, etc., on the basis of the motion command; and an individual performable-motion-information storage section 216 as a functional section to individually store the performable-motion information of the work-element performing apparatus 26, etc. Further, each of the mounter controller 202, the dispenser controller 204, the supplier controller 206, and the conveyor controller 208 includes a command converting section 218 as a functional section to convert the motion command from the main central control device 130 into a motion command according to a programming language that the individual control device 90, etc., of itself can handle.

The manufacture-work-machine monitor section 172 of the main central controller 170 is configured to receive transmission of information that the work-element performing apparatus 26, etc., is suffering from abnormality from the individual control device 90, etc., via the I/O cable 160 and to receive ON/OFF information of the plurality of switches 162. On the basis of the received information, the manufacture-work-machine monitor section 172 is configured to transmit various commands, the operating state of the work-element performing apparatuses 26, etc., and so on, to the command transmission processing section 178. Further, the manufacture-work-machine monitor section 172 is configured to transmit an ON/OFF command to the plurality of indicator lamps 164. The central interface section 176 is configured to communicate with the individual interface section 210 of each of the individual control devices 90, etc., for communication of the motion command, the reply to the motion command, the abnormality of the work-element performing apparatus 26, etc., and so on, according to one protocol. The central interface section 176 is configured to transmit information as to abnormality of the work-element performing apparatus 26, etc., to the motion-command-transmission suspending section 180 and to transmit the reply to the motion command to the command transmission processing section 178.

The command transmission processing section 178 is configured to sequentially execute the transmission processing of the plurality of motion commands stored in the motion-command storage section 182. In other words, there is executed, in the command transmission processing section 178, a command-transmission processing step in a centralized control method of controlling the work-element performing apparatuses 26, etc., in a centralized manner. The command transmission processing section 178 is configured to execute transmission processing of one motion command and to execute transmission processing of a motion command to be next transmitted subsequent to the one motion command after having received a reply to the one motion command via the central interface section 176. The command transmission processing section 178 is configured to execute the transmission processing of the motion command only to the work-element performing apparatuses 26, etc., that is identified by the work-element-performing-apparatus identifying section 174. The work-element-performing-apparatus identifying section 174 is configured to transmit, to the command transmission processing section 178, information that the work-element performing apparatus is identified where the work-element-performing-apparatus identifying section 174 has obtained the identification information from the work-element performing apparatus 26, etc. Further, the motion-command-transmission suspending section 180 is configured to suspend the transmission processing of the motion command by the command transmission processing section 178 where the motion-command-transmission suspending section 180 receives information of the abnormality of any of the work-element performing apparatuses 26, etc., via the central interface section 176.

The source-data-input accepting section 184 of the auxiliary central controller 136 is configured to be connectable to an external device such as a control device different from each control device 130, etc., of the present manufacture work machine 12 or a storage medium and is configured such that the source data can be inputted thereto from the external device. The source data inputted to the source-data-input accepting section 184 is stored in the source-data storage section 186. The motion-command generating section 188 is configured to generate motion commands according to a specific programming language on the basis of the source data stored in the source-data storage section 186 and is configured to transmit the generated motion commands to the motion-command storage section 182 of the main central controller 170. The central performable-motion-information storage section 190 is configured to receive the performable-motion information of each of the work-element performing apparatuses 26, etc., from the individual control device 90, etc., of each of the work-element performing apparatuses 26, etc., via the performable-motion-information-input accepting section 192 and is configured to store the received information. The motion-command generating section 188 is configured to generate the motion commands by referring to the performable-motion information stored in the central performable-motion-information storage section 190. In other words, a motion-command generating step and a performable-motion-information obtaining step in the centralized control method of controlling the work-element performing apparatuses 26, etc., in the centralized manner are executed in the motion-command generating section 188 and the performable-motion-information-input accepting section 192, respectively. It is noted that the performable-motion-information-input accepting section 192 is also configured to be connectable to the external device, and the performable-motion information can be inputted thereto from the external device. Further, the program change section 194 is also configured to be connectable to the external device. The program change section 194 can receive a program from the external device and can transmit the received program to the main central control device 130 and the individual control device 90, etc., of each of the work-element performing apparatuses 26, etc., via the LAN cables 140.

The individual interface section 210 of each of the controllers 200, 202, 204, 206, 208 (hereinafter collectively referred to as "the controller 200, etc., where appropriate) of the individual control devices 90, etc., can communicate with the central interface section 176 of the main central control device 130 for communication of the motion command, the reply to the motion command, the abnormality of the work-element performing apparatus 26, etc., according to one protocol, and also can communicate with the performable-motion-information-input accepting section 192 of the auxiliary central controller 136 for communication of the performable-motion information stored in the individual performable-motion-information storage section 216. The command converting section 218 is configured to convert the motion command received by the individual interface section 210 into a motion command in a programming language understandable for the individual control device 100, etc., of itself. In other words, in the command converting section 218, there is executed a command converting process in an independent control method of independently controlling the work-element performing apparatuses. In the present manufacture work machine 12, while the command converting section 218 is provided in the individual control device 100, etc., a motion converting device having a function similar to the command converting section 218 may be provided outside the individual control device 100, etc. Where the motion converting device having the function similar to the command converting section 218 is provided outside the individual control device 100, etc., an individual interface section is provided in the motion converting device, and the motion converting device and the central control device communicate with each other for communication of the motion command, the reply to the motion command, the abnormality of the work-element performing apparatus 26, etc., according to one protocol.

The operation control section 214 of each of the mounter controller 202, the dispenser controller 204, the supplier controller 206, and the conveyor controller 208 is configured to control the operation of the operating device on the basis of the motion command converted by the command converting section 218. The operation control section 214 of each of the moving-device controller 200 and the camera-device controller 116 is configured to control the operation of the operating device on the basis of the motion command received by the individual interface section 210. In the identification-information storage section 212, the identification information is stored. The stored identification information is configured to be transmitted to the work-element-performing-apparatus identifying section 174 of the main central controller via the individual interface section 210.

The processing by the main central controller 170, specifically, a transmission program for executing the processing to transmit the motion commands, more specifically, the processing to monitor the operating state of the manufacture work machine so as to transmit the motion commands, is described in a graphic-type programming language. On the other hand, a generation program for executing the processing by the auxiliary central controller 136, more specifically, the processing by the motion-command generating section, is described in a structured-type programming language. The graphic-type programming language is a programming language that is generally easier than the structured-type programming language, and is considered as a high-level programming language. That is, it is possible to comparatively easily change the transmission program. In the present manufacture system 10, the programming language of the transmission program is a ladder language while the programming language of the generation program is a C language.

<Replacement of the Work-Element Performing Apparatus>

Figure 10:
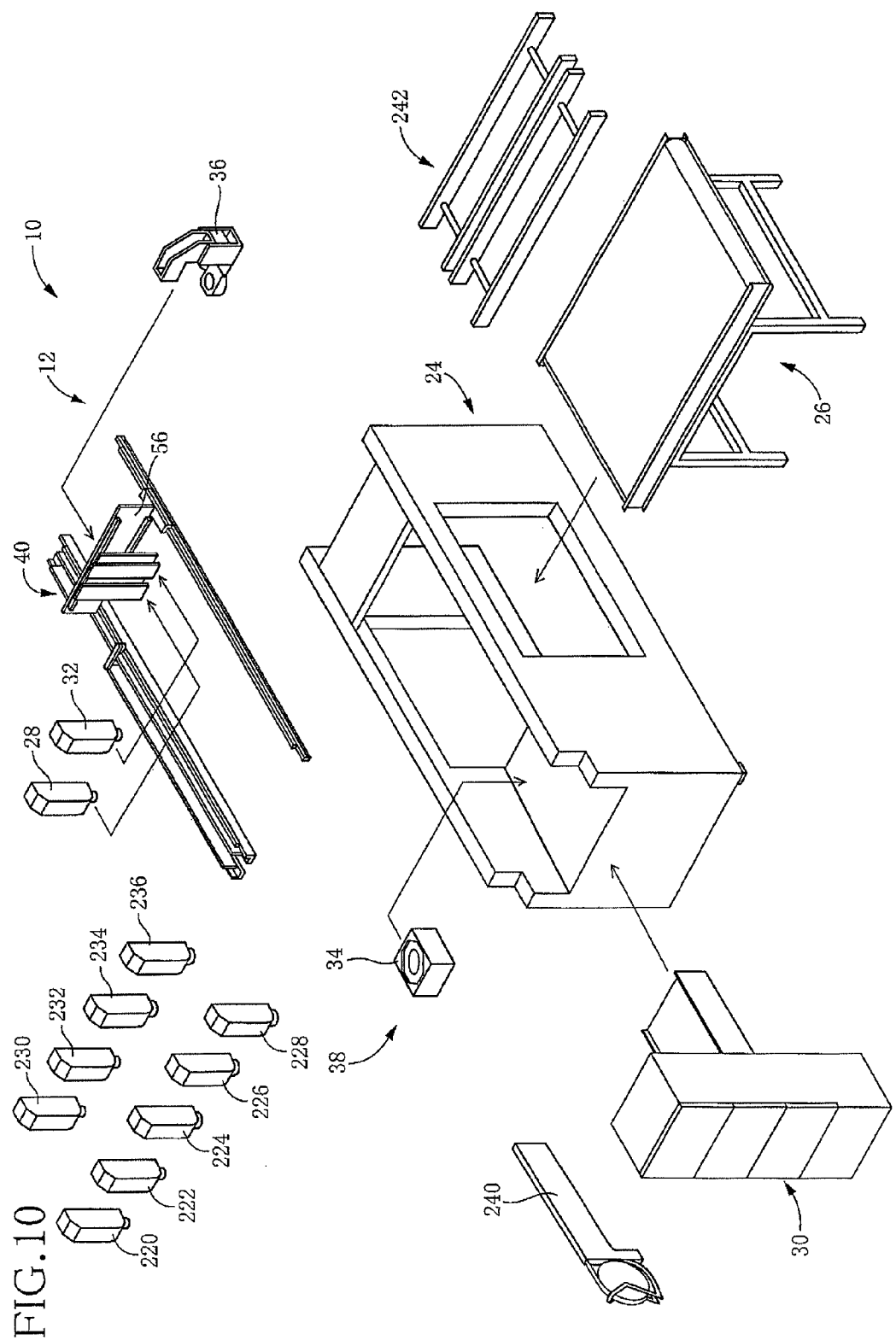
FIG. 10 is a perspective view showing a base of the manufacture system of FIG. 1 and the plurality of work-element performing apparatuses in a state in which the apparatuses are detached from the base.

In the present manufacture system 10, as shown in FIG. 10, the conveyor 26, the supplier 30, the moving device 40, and the base camera 34 of the camera device 38 are attachable to and detachable from the machine main body 24 while the mounter 28, the dispenser 32, and the head camera 36 of the camera device 38 are attachable to and detachable from the slider 56 of the moving device 40. Some of those work-element performing apparatuses 26, etc., are attachable and detachable with one-touch action while the other of those are fixed by several bolts. All of the work-element performing apparatuses 26, etc., are constructed so as to be easily attached to and detached from the machine main body 24 or the slider 56.

To the position at which the mounter 28 or the dispenser 32 is attached, namely, to the slider 56, other work-element performing apparatuses can be attached in place of the mounter 28 or the dispenser 32. To be more specific, the mounter 28 or the dispenser 32 can be exchanged with: a high-frequency welder 220 for performing a heat treatment by a high-frequency wave; a laser generator 222 for performing laser processing; a UV irradiator 224 for performing processing by UV irradiation; a hot-air blower 226 for performing a heat treatment by applying hot air; a screw fastener 228 for performing screw fastening processing; a screw attaching/fastening device 230 for performing screw holding and releasing and screw fastening processing in a state in which a screw is held; a double dispenser 232 having two dispenser nozzles and configured to perform ejection of two kinds of auxiliary agents; a mounter 234 for holding and releasing another component and for performing adjustment of a component hold position; and a solder cream printer 236, for instance. Accordingly, where there arises a need of manufacturing new products and therefore it becomes necessary to perform a work of fixing a component to a base member by screwing, in place of the mounting work performed on the circuit substrate, for instance, the manufacture work can be changed not by changing the manufacture work machine per se, but by replacing the dispenser 32 with the screw attaching/fastening device 230. Moreover, while the manufacture work in the manufacture work machine 12 is the assembling work, the work-element performing apparatus may be changed so as to perform, as the manufacture work, a work in which certain processing, treatment or the like is performed on a work object. More specifically, the work-element performing apparatus may be changed so as to perform various sorts of works such as a work (e.g., a press work) in which the work object is deformed, a work (e.g., a cut-off work) in which a part of the work object is cut off, a work (e.g., a cutting work) in which the work object is shaped, a work (e.g., a surface modification work) in which a surface of the work object is modified by laser, plasma or the like, a work (e.g., a surface finishing work) such as grinding, and a work of irradiating the work object with a light, ultraviolet rays, an electromagnetic wave, etc., for the purpose of fixation, curing, etc. That is, according to the present manufacture system, various manufacture works can be performed by changing the work-element performing apparatuses.

As described above, in the present manufacture work machine 12, two work-element performing apparatuses are attachable to the slider 56, and it is possible to operate the two work-element performing apparatuses in a cooperative manner, depending upon the kind of the two work-element performing apparatuses. The cooperative work by the two work-element performing apparatuses means that, while permitting the work object to be fixed by holding by one of the two work-element performing apparatuses, the processing/treatment is performed by the other of the two work-element performing apparatuses, for instance. When the work is performed as if both hands are used, it is possible to perform, while holding the work object by one hand so as to prevent the work object from moving, the processing/treatment by the other hand. More specifically, where the mounter 28 and the laser generator 222 are attached to the slider 56, for instance, it is possible to perform the laser processing on a base member by the laser generator 222 while permitting the mounter 28 to press the base member. Where the mounter 28 and the screw attaching/fastening device 230 are attached to the slider 56, for instance, it is possible to perform the screw fastening processing by the screw attaching/fastening device 230 while permitting the mounter 28 to press the base member.

Figure 11:
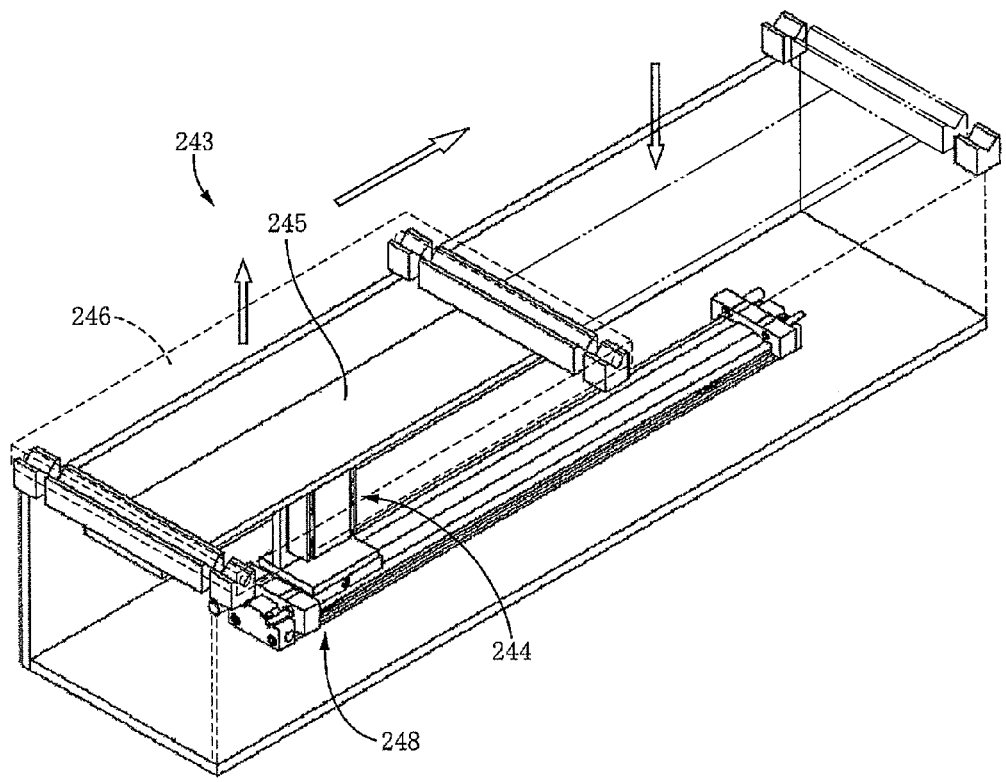
FIG. 11 is a perspective view showing a conveyor of a lift and carry type as one example of the work-element performing apparatus.

In place of the supplier 30, other kinds of suppliers, more specifically, a tape feeder 240, a ball feeder, a screw supplier, a stacking unit (not shown) and the like can be attached, for instance. In place of the conveyor 26, other kinds of conveying apparatuses, more specifically, a double conveyer 242 of a module type, a single conveyor, a conveyor with an elevating and lowering function (not shown) and the like can be attached, for instance. Further, in place of the conveyor 26, a carrier 243 (FIG. 11) that is a conveying apparatus of a lift and carry type is attachable. This carrier 243 is configured to lift a work object 246 by elevating a support table 245 by an elevating and lowering device 244 and to move the thus lifted work object 246 in the conveyance direction by a carrying device 248. That is, the carrier 243 is capable of properly conveying the work object even where the work object is relatively heavy. Moreover, in place of the conveyor 26, a conveying apparatus of a pick and place type (not shown) is attachable. In brief, the conveying apparatus of the pick and place type is configured to lift the work object by suction and to move the sucked work object in the conveyance direction. The conveying apparatus of the pick and place type is capable of properly conveying the work object even where the work object has a relatively fragile structure. Further, the head camera 36 and the base camera 34 are also replaceable with other cameras having different resolutions, different image taking ranges, etc.

Each of the above-described plurality of work-element performing apparatuses 220-236 (hereinafter collectively referred to as the "work-element performing apparatus 220, etc., where appropriate), which are replaceable with the six work-element performing apparatuses 26, etc., including the conveyor 26, the mounter 28 and so on that constitute the present manufacture work machine 12, has an individual control device configured to control an operation of itself, like the six work-element performing apparatuses 26, etc. Some of the individual control devices of the above-described replaceable work-element performing apparatuses 220, etc., can handle the programming language that defines the motion command transmitted by the main central control device 130. Each of other individual control devices which cannot handle the programming language that defines the motion command transmitted by the main central control device 130 has a function of converting the received motion command into a motion command according to a programming language which the individual control device can handle, like the above-described mounter control device 100, etc., so as to control the operation of the work-element performing apparatus on the basis of the motion command converted by itself. That is, even if the work-element performing apparatus 26, etc., of the present manufacture work machine 12 is replaced with another work-element performing apparatus 220, etc., more specifically, even if the dispenser 32 is replaced with the screw attaching/fastening device 230 as described above, the main central control device 130 may transmit the motion command according to the programming language which has been used to the individual control device of the screw attaching/fastening device 230.

Some of the individual control devices of the above-described replaceable work-element performing apparatuses 220, etc., include the individual performable-motion-information storage sections in each of which is stored the performable-motion information of each work-element performing apparatus, and are configured to transmit the performable-motion information stored in the respective individual performable-motion-information storage sections to the central performable-motion-information storage section 190 of the auxiliary central controller 136. For each of other individual control devices of the replaceable work-element performing apparatuses which does not include the individual performable-motion-information storage section, the performable-motion information can be inputted from the external device to the performable-motion-information-input accepting section 192 of the auxiliary central controller 136. Accordingly, it is possible to store the performable-motion information of the work-element performing apparatus which does not include the individual performable-motion-information storage section, in the central performable-motion-information storage section 190. In other words, even where the work-element performing apparatus 26, etc., of the present manufacture work machine 12 is replaced with the other work-element performing apparatuses 220, etc., it is possible to refer to the performable-motion information of each of the other work-element performing apparatuses in generating the motion command.

Further, the performable-motion information of each work-element performing apparatus may be stored in advance in the central performable-motion-information storage section 190 and the motion-command generating section 188 may be configured to generate the motion command on the basis of the performable-motion information while referring to the performable-motion information as needed. To be more specific, the identification information of each work-element performing apparatus that is transmitted therefrom upon its startup may contain a distinction ID, and there may be stored, in the central performable-motion-information storage section 190, a correspondence table indicating a correspondence between the distinction ID and the performable-motion information for each work-element performing apparatus. In this case, the motion-command generating section 188 may be configured to refer to the performable-motion information on the basis of the distinction ID of the work-element performing apparatus. In this arrangement, the performable-motion information of each work-element performing apparatus is stored in the central performable-motion-information storage section 190, and the performable-motion information can be utilized when the motion command is generated. In this respect, even where the distinction ID is not contained in the identification information transmitted from the work-element performing apparatus, the performable-motion information can be referred to on the basis of the distinction ID by inputting, to the central control device, the distinction ID of the work-element performing apparatus utilizing a bar code or the like, for instance. Further, where the manufacture system is constituted by a plurality of manufacture work machines, for instance, there is a possibility of employing a manufacture system having a host computer configured to control the plurality of central control devices altogether. In such a manufacture system, information such as the above-indicated correspondence table may be stored in the host computer, and each central control device may be configured to obtain necessary information from the host computer.

To each of the plurality of work-element performing apparatuses 220, etc., which are attachable in place of the six work-element performing apparatuses 26, etc., that constitute the present manufacture work machine 12, the serial cable 134, the LAN cable 140, and the I/O cable 160 can be connected. Moreover, the individual control device of each of all work-element performing apparatuses 26, 220, etc., except the camera device 38, is incorporated in or attached to the main body which performs the work element. That is, each of all of the work-element performing apparatuses 26, 220, etc., except the camera device 38, is constructed to constitute a unit. Therefore, where the work-element performing apparatus is replaced, more specifically, where the dispenser 32 is replaced with the screw attaching/fastening device 230, the cables 134, 140, 160 are disconnected from the dispenser 32 and connected to the screw attaching/fastening device 230, whereby replacement of the work-element performing apparatus can be completed.

Where the work-element performing apparatus is replaced, there is an instance in which it is desired to change the monitoring manner of the operating state of the manufacture work machine as needed. In such an instance, it may be sometimes desirable to change the transmission program. As described above, the transmission program is described in the graphic language which is comparatively easy, so that it is easily changeable. Accordingly, even where the transmission program of the central control device needs to be changed in association with the replacement of the work-element performing apparatus, the work-element performing apparatus can be replaced without a great deal of load.

<Constructing Method of Manufacture System>

As described above, the manufacture work machine is constituted by one machine main body 24 and the plurality of work-element performing apparatuses installed on the machine main body 24. The plurality of work-element performing apparatuses installed on the machine main body 24 are selectable from among various work-element performing apparatuses. Accordingly, to construct the manufacture work machine, namely, the manufacture system, the plurality of work-element performing apparatuses need to be determined on the basis of details of the manufacture work to be performed by the manufacture work machine, and the determined plurality of work-element performing apparatuses need to be prepared. Thereafter, the prepared plurality of work-element performing apparatuses need to be installed on the machine main body 24, and setting need to be executed with respect to the central control device such that the plurality of work-element performing apparatuses are controlled by the central control device. There will be hereinafter explained concretely a method of constructing the manufacture system 10.

In the manufacture system 10, for permitting the manufacture work machine 12 to perform a manufacture work of fixing the component on the circuit substrate by the adhesive, it is necessary to perform a plurality of work elements, more specifically, conveyance of the circuit substrate, application of the adhesive, supplying of the components, holding and releasing of the component, image taking of the component and the like, and movement of the component hold position, etc. To perform those six work elements, the following six work-element performing apparatuses are required: a conveyor for performing the conveyance of the circuit substrate; a dispenser for performing the application of the adhesive; a supplier for performing the supplying of the components; a mounter for performing the mounting and releasing of the component; a camera device for performing the image taking of the component and the like; and a moving device for moving the mounter and the like. The machine main body of the manufacture work machine is structured such that the six work-element performing apparatuses can be installed. To construct the manufacture system 10, it is necessary to prepare one machine main body and the six work-element performing apparatuses to be installed on the machine main body.

For preparing the work-element performing apparatuses, there are determined work-element performing apparatuses each of which can properly perform the corresponding work element. More specifically, the work-element performing apparatus to perform the conveyance of the circuit substrate is determined on the basis of specifications of the conveyance object such as the dimension, the weight, and the material, in order to properly convey the circuit substrate, namely, the conveyance object. In the manufacture system 10, the conveyor 26 of a belt conveyor type is employed for conveying the substrate tray 167 on which the twenty circuit substrates 166 are placed. In this respect, where the conveyance object is relatively heavy; there may be employed the carrier 243 that is the conveyor of the lift and carry type, for instance. Where the material of the conveyance object is fragile, there may be employed the conveyor of the pick and place type, for instance.

As the work-element performing apparatus to perform the application of the adhesive, the dispenser needs to be employed. However, there exist various dispensers having various capabilities. For instance, there have been illustrated above the dispenser 32 capable of ejecting one kind of the auxiliary agent and the double dispenser 232 capable of ejecting two kinds of the auxiliary agents. Here, the work-element performing apparatus for performing the application of the adhesive is determined by taking the capabilities of the dispenser into account. In the present manufacture system 10, the kind of the adhesive to be used is one. Accordingly, the dispenser 32 capable of ejecting one kind of the auxiliary agent is employed.

The work-element performing apparatus to perform the mounting and releasing of the component is determined on the basis of specifications such as the dimension, the weight, and the material of the component, in order to properly hold and release the component. While the mounter 28 of the suction type is employed in the present manufacture system 10, a mounter of a mechanical chuck type may be employed depending upon the component to be mounted. The work-element performing apparatus to perform the supplying of the components is determined on the basis of specifications such as the dimension, the weight, and the packing type of the components to be supplied. While the supplier 30 of the tray unit type is employed in the present manufacture system 10, the tape feeder 240 that is a supplier of the feeder type may be employed depending upon the components to be supplied. The work-element performing apparatus to perform the image taking of the component and the like is determined in consideration of capabilities of the camera device such as the resolution and the image taking range. In the present manufacture system 10, the camera device 38 including the head camera 36 and the base camera 38 is employed.

In some cases, the head moving device for moving the work head device of the mounter, etc., that is, the moving device 40, is pre-installed on the machine main body 24, and is distributed as a main frame constituted by the moving device 40 and the machine main body 24. Accordingly, as the work-element performing apparatus to perform the movement of the component hold position, etc., there is employed the apparatus that is pre-installed on the machine main body 24. Further, in some cases, the central control device constituted by the main central control device 130 and the auxiliary central control device 118 is set in advance in the main frame, and the main frame and the central control device are distributed as a main apparatus. Accordingly, the manufacture system 10 employs the main apparatus constituted by the moving device 40, the machine main body 24, the main central control device 130, and the auxiliary central control device 118.

After the five work-element performing apparatuses 26, etc., to be installed on the main apparatus is determined as described above, the following steps are carried out so as to construct the present manufacture system 10: a step of preparing one main apparatus (hereinafter referred to as "main-apparatus preparing step" where appropriate); a step of preparing the five work-element performing apparatuses 26, etc., (hereinafter referred to as "work-element-performing-apparatus preparing step" where appropriate); a step of installing the five work-element performing apparatuses 26, etc., on the main frame of the main apparatus (hereinafter referred to as "work-element-performing-apparatus installing step" where appropriate); and a step of executing setting of the assembling work with respect to the central control device of the main apparatus (hereinafter referred to as "central-control-device setting step" where appropriate).

More specifically, in the main-apparatus preparing step, a user of the manufacture system may purchase the main apparatus from a certain maker that produces the main apparatus. Further, another maker different from the certain maker may purchase the main apparatus from the certain maker, and the user may purchase the main apparatus from the third vender. (Hereinafter, the above-indicated another maker may be referred to as "third vender" where appropriate for distinction from the certain maker.) In the work-element-performing-apparatus preparing step, it is possible for the user to purchase the work-element performing apparatuses from the maker that produces the main apparatus or from the third vender. Further, the user himself may produce the work-element performing apparatuses.

As described above, however, for permitting the work-element performing apparatuses to be recognized by the central control device when controlled by the central control device, the IC chip in which is stored the identification information needs to be incorporated in each work-element performing apparatus. Accordingly, where another party other than the certain maker that produces the main apparatus produces the work-element performing apparatuses, another party in question needs to purchase from the certain maker the IC chip in which is stored the identification information and to produce each work-element performing apparatus such that the IC chip is incorporated therein. Further, each of some of the work-element performing apparatuses needs to be configured to communicate, according to the specific protocol, with the central control device for communication of the motion command and to convert the received motion command into the programming language that the individual control device of itself can understand. Therefore, where another party other than the certain maker produces the work-element performing apparatuses, it is required for another maker to obtain disclosure of specifications of each work-element performing apparatus, the communication protocol, and so on. In this connection, the work-element performing apparatuses to be purchased from the certain maker need not be necessarily produced by the certain maker. That is, the work-element performing apparatuses produced by the certain maker may be purchased from the certain maker or the work-element performing apparatuses that the certain maker has purchased from the third vender may be purchased from the certain maker. Thus, various ways are available in the main-apparatus preparing step and the work-element-performing-apparatus preparing step, and various patterns exist in the manufacture system constructing method constituted by the steps described above. Various patterns of the manufacture system constructing method will be explained below.

i) Manufacture System Constructing Method by Purchasing Main Apparatus and Work-element Performing Apparatuses from Maker In this constructing method, the user preparers the main apparatus in the main-apparatus preparing step by purchasing from the maker and prepares the work-element performing apparatuses in the work-element-performing-apparatus preparing step by purchasing from the maker. In other words, in this constructing method, the user purchases, from one party (maker), the main apparatus and the work-element performing apparatuses. In the work-element-performing-apparatus installing step, the prepared work-element performing apparatuses are installed on the main frame of the prepared main apparatus. In the main frame, the specific position (reference position) is predetermined for each work-element performing apparatus, and each work-element performing apparatus is installed on the main frame at the corresponding specific position, whereby the fiducial point of each work-element performing apparatus upon operating is ensured. Each work-element performing apparatus has a size within a certain dimension in accordance with a space at an installation position at which the work-element performing apparatus is installed, whereby the installing step is easily carried out. The space at the installation position of the work-element performing apparatus refers to a space that extends through the frame portion 20 of the machine main body 24 in the left-right direction where the work-element performing apparatus is the conveyor. Where the work-element performing apparatus is the supplier, the space refers to a space located at the front end of the frame portion 20. In the central-control-device setting step, the source data described above is inputted to the central control device. The inputting of the source data has been explained above in detail and is briefly explained here. The basic codes shown in FIG. 4, the unit-work codes shown in FIG. 5, and the motion codes shown in FIG. 6 are inputted to the source-data-input accepting section 184 of the auxiliary central control device 118. Further, in the central-control-device setting step, there may be inputted the performable-motion information of each work-element performing apparatus, the specifications such as the dimension and the packing type of the components to be supplied. The above-indicated four steps are thus carried out, whereby the manufacture system is constructed.

Figure 12A:
FIGS. 12A-12C are views each schematically showing a manufacture system constructing method.

The constructing method described above can be illustrated from the viewpoint of the maker. In the present constructing method with the maker's viewpoint, the maker prepares the main apparatus in the main-apparatus preparing step by producing and prepares the work-element performing apparatuses in the work-element-performing-apparatus preparing step by producing. The maker carries out the work-element-performing-apparatus installing step and the central-control-device setting step with respect to the main apparatus and the work-element performing apparatuses produced by itself, so as to construct the manufacture system 10. That is, where the maker carries out the present constructing method, the user purchases the manufacture system 10 from the maker. Where the manufacture system is constructed according to this method, the entirety of the manufacture system is produced by the maker, thereby ensuring convenience in maintenance or the like. Further, because the maker can obtain know-how for constructing the manufacture system, it is possible to accumulate know-how of the manufacture system constructing method. A conceptual view of this constructing method is illustrated in FIG. 12A.

Figure 12B:
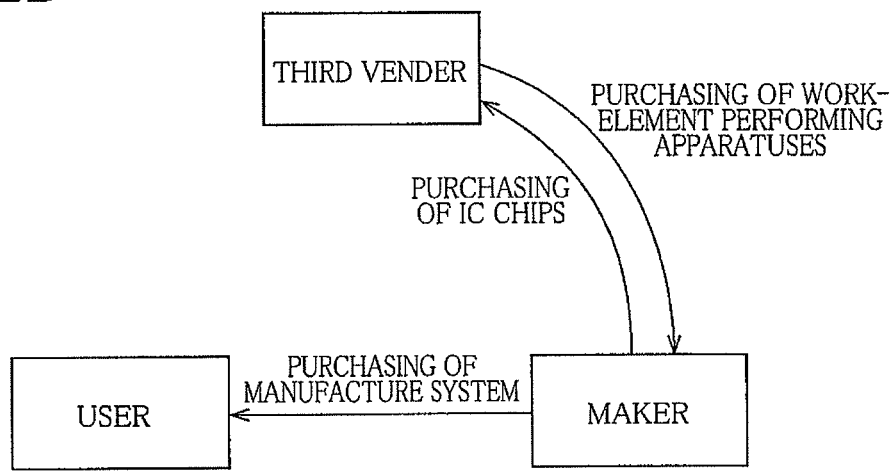

The maker may prepare the work-element performing apparatuses in the work-element-performing-apparatus preparing step by purchasing from the third vender. In this instance, the maker carries out the work-element-performing-apparatus installing step and the central-control-device setting step with respect to the main apparatus produced by itself and the purchased work-element performing apparatuses, so as to construct the manufacture system 10. The user purchases the thus constructed manufacture system 10. Where the manufacture system is constructed according to this method, it is possible to incorporate, into the manufacture system, the work-element performing apparatuses produced by the third vender with high technological skills. Further, it is possible for the third vender to obtain benefits of sales expansion while it is possible for the maker to accumulate know-how of the manufacture system constructing method. A conceptual view of this constructing method is illustrated in FIG. 12B. In this connection, the third vender that produces the work-element performing apparatuses need to purchase the IC chips in which the identification information is stored and to obtain disclosure of the communication protocol and the like.

ii) Manufacture System Constructing Method by Purchasing Main Apparatus and Work-Element Performing Apparatuses from Third Vender In this constructing method, the user prepares the main apparatus in the main-apparatus preparing step by purchasing from the third vender and prepares the work-element performing apparatuses in the work-element-performing-apparatus preparing step by purchasing from the third vender. That is, in the present constructing method, the user purchases the main apparatus and the work-element performing apparatuses from one party. In this connection, the main apparatus to be purchased by the user from the third vender is the one that the third vender has purchased from the maker, and the work-element performing apparatuses to be purchased by the user from the third vender are the ones that the third vender has produced by itself. The work-element-performing-apparatus installing step and the central-control-device setting step are carried out with respect to the thus prepared main apparatus and work-element performing apparatuses, whereby the manufacture system 10 is constructed.

Figure 12C:
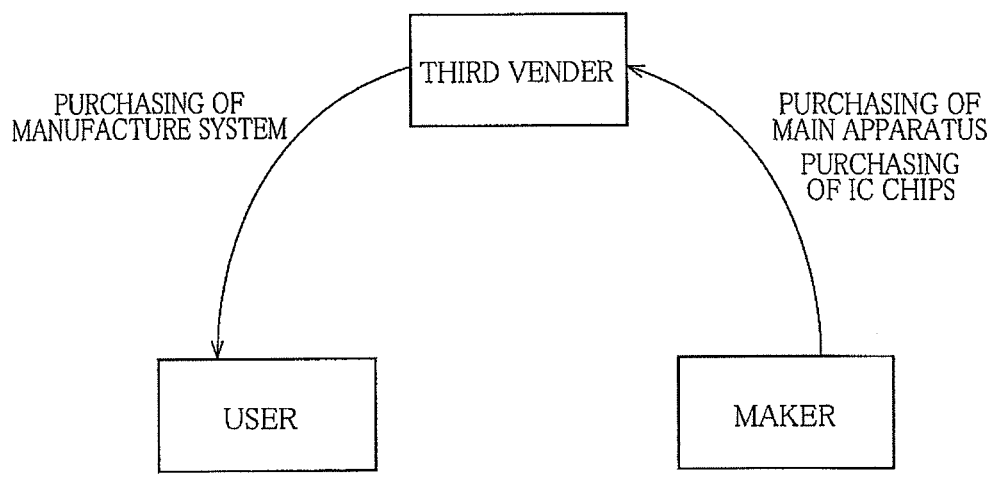
Figure 13A:
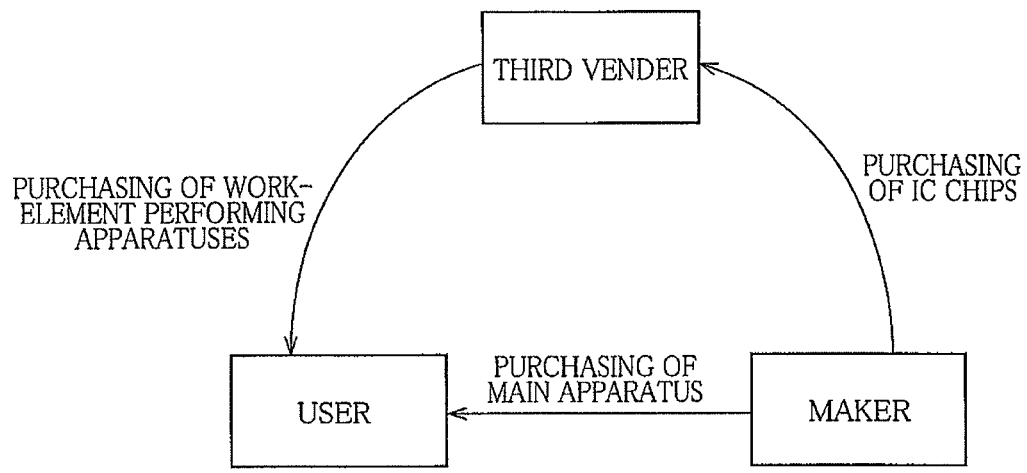
FIGS. 13A and 13B are views each schematically showing a manufacture system constructing method different from the method of FIG. 12.
Figure 13B:
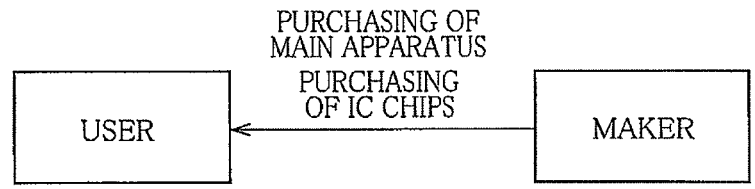

This constructing method can be also illustrated from the third vender's viewpoint. In the present constructing method with the third vender's viewpoint, the third vender prepares the main apparatus in the main-apparatus preparing step by purchasing from the maker and prepares the work-element performing apparatuses in the work-element-performing-apparatus preparing step by producing. The third vender carries out the work-element-performing-apparatus installing step and the central-control-device setting step with respect to the purchased main apparatus and the work-element performing apparatuses produced by itself, so as to construct the manufacture system 10, and the user purchases from the third vender the thus constructed manufacture system 10. Where the manufacture system is constructed according to this method, it is possible to incorporate, into the manufacture system, the work-element performing apparatuses produced by the third vender with high technological skills. For the maker, it is possible to move into an unskilled or unaccustomed field utilizing the high technological skills of the third vender. Further, the maker can entrust the third vender to handle service to users in the unaccustomed field. For the third vender, it is possible to accumulate know-how of the manufacture system constructing method. A conceptual view of this constructing method is illustrated in FIG. 12C.

iii) Manufacture System Constructing Method by Purchasing Main Apparatus from Maker and Work-Element Performing Apparatuses from Third Vender In this constructing method, the user prepares the main apparatus in the main-apparatus preparing step by purchasing from the maker and prepares the work-element performing apparatuses in the work-element-performing-apparatus preparing step by purchasing from the third vender. That is, in the present constructing method, the user purchases the main apparatus from a certain party and purchases the work-element performing apparatuses from another party different from the certain party. The work-element-performing-apparatus installing step and the central-control-device setting step are carried out with respect to the thus prepared main apparatus and work-element performing apparatuses, whereby the manufacture system 10 is constructed. Where the manufacture system is constructed according to this method, it is possible to incorporate, into the manufacture system, the work-element performing apparatuses produced by the third vender with high technological skills. Further, for the maker, it is possible to entrust, to the third vender, the production of the work-element performing apparatuses that tends to be high-variety low-volume production and to sell the main apparatus with high versatility. A conceptual view of this constructing method is illustrated in FIG. 13A.

iv) Manufacture System Constructing Method by Purchasing Main Apparatus from Maker and by Self-Producing Work-element Performing Apparatuses In this constructing method, the user prepares the main apparatus in the main-apparatus preparing step by purchasing from the maker and prepares the work-element performing apparatuses in the work-element-performing-apparatus preparing step by self-producing, namely, the user himself produces the work-element performing apparatuses. The work-element-performing-apparatus installing step and the central-control-device setting step are carried out with respect to the thus prepared main apparatus and work-element performing apparatuses, whereby the manufacture system 10 is constructed. Where the manufacture system is produced according to this method, the user can construct the manufacture system without a risk that information on the product is known to others, ensuring confidentiality of the information on the product. Further, for the maker, it is possible to entrust, to the user, the production of the work-element performing apparatuses that tends to be high-variety low-volume production and to sell the main apparatus with high versatility. A conceptual view of this constructing method is illustrated in FIG. 13B. It is noted that the user needs to purchase the IC chips in which the identification information is stored and to obtain disclosure of the communication protocol and the like.

<Manufacture System Constituted by a Plurality of Manufacture Work Machines>

Because the present manufacture system 10 is constituted by one manufacture work machine, the number of manufacture steps that can be performed is comparatively small. However, a relatively large number of manufacture steps can be performed by constructing a manufacture work system in which the manufacture work machine which is the same as the above-described manufacture work machine 12, or the manufacture work machine in which the work-element performing apparatuses in the above-described manufacture work machine 12 are replaced, etc., is arranged in a plural number and in which the manufacture works by the plurality of manufacture work machines are sequentially performed on a work object while conveying the work object from the upstream-side manufacture work machines toward the downstream-side manufacture work machines. In other words, it is possible to manufacture a product with a certain degree of complexity. Further, it is possible to construct an optimum work process in accordance with a product to be manufactured and to select the manufacture work machine and the plurality of work-element performing apparatuses that constitute each of the manufacture work machines such that the optimum work process can be appropriately performed. In the present description, an assembling system is explained as the thus constructed manufacture system. More specifically, there will be hereinafter explained the systems, namely, a system for performing assembling of an LED lamp, a system for performing assembling of a power module, and a system for performing assembling of a solar cell, by performing an assembling work as the manufacture work in each manufacture work machine.

i) LED-Lamp Assembling System

Figure 14:
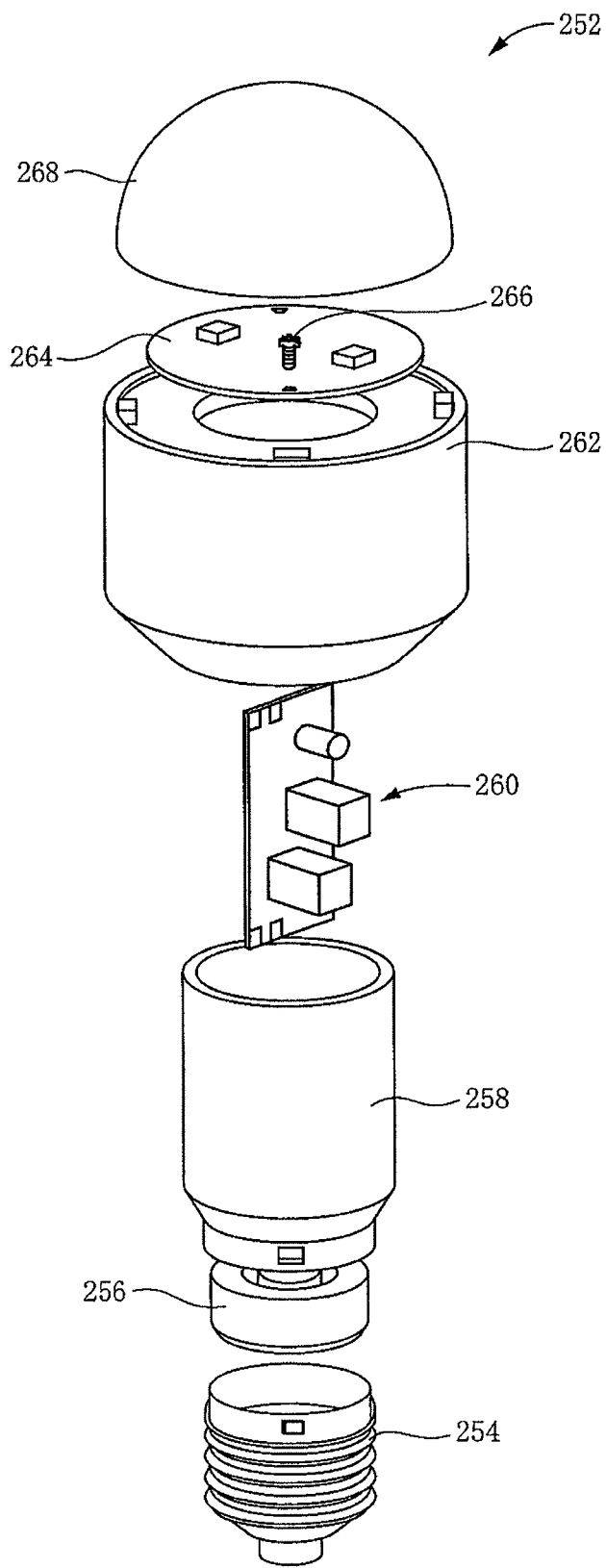
FIG. 14 is an exploded view of an LED lamp.

FIG. 14 is an exploded view of an LED lamp 252. As shown in FIG. 14, the LED lamp 252 includes: a terminal socket 254 having a cylindrical shape with a closed end; a terminal 256 provided in the terminal socket 254; a cylindrical casing 258 fitted onto an upper end of the terminal socket 254; a terminal-attached circuit board 260 provided in the casing 258; a heat sink 262 fixed to an upper end portion of the casing 258 by an adhesive; a terminal-attached LED board 264 disposed on an upper end face of the heat sink 262; a screw 266 for fixing the LED board 264 to the heat sink 262; and a semi-spherical cover 268 fixed to an upper end portion of the heat sink 262 by an adhesive.

Where the system for manufacturing the LED lamp 252 is constructed, the number of the manufacture work machines necessary for the system needs to be determined. In other words, when or before the main-apparatus preparing step is carried out, it is required to carry out a manufacture-machine-number determining step in which the number of the manufacture work machines necessary for the system is determined. This manufacture-machine-number determining step may be included in the main-apparatus preparing step or may be different from the main-apparatus preparing step. In the manufacture-machine-number determining step, a plurality of constituent components that constitute the LED lamp 252 as a product, are arranged in a mounting order, and the work elements to be performed with respect to the respective constituent components are extracted. For each of at least one work element, work details in an instance where each of the at least one work element is performed with respect to the constituent component are determined. When the work details are thus determined for each work element, plural sorts of work details necessary for manufacturing the LED lamp 252 are determined. A series of the plural sorts of work details are sequentially performed, whereby the LED lamp 252 is manufactured. In the series of the plural sorts of work details, at least one successive work details that can be performed by one manufacture work machine are dealt with as one manufacture work, whereby the series of the plural sorts of work details are put together into at least one manufacture work. The number of a plurality of manufacture works, each of which is obtained such that the plural sorts of work details are put together, corresponds to the number of the manufacture work machines necessary for the system. The manufacture system can be constructed by the manufacture work machines in the thus determined number.

In other words, in the manufacture-machine-number determining step, the number of the manufacture work machines is determined by carrying out the following steps: a constituent-component-mounting-order determining step of determining the mounting order of the plurality of constituent components; a constituent-component-associated-work-element extracting step of extracting the work elements to be performed with respect to each constituent component; a work-details determining step of determining the work details when at least one work element is performed with respect to each of the constituent components; and a manufacture-work determining step of determining at least one manufacture work such that the series of the plural sorts of work details are put together into at least one manufacture work. Here, concerning the mounting order of the plurality of constituent components that constitute the product, there is an instance in which only one kind of the mounting order exists or there is an instance in which plural kinds of the mounting orders exist. Where the plural kinds of the mounting orders exist, the order of the plural sorts of work details changes in accordance with each of the mounting orders. Accordingly, in some cases, the details of the manufacture works and the number of manufacture works are changed. That is, by changing the mounting order, it is possible to change the order of the plural sorts of the work details, so that the details of each manufacture work, the number of the manufacture works, etc., can be changed.

Further, the number of the manufacture work machines can be changed. Where at least one successive work details in the plural sorts of work details is dealt with as one manufacture work in the manufacture-work determining step, at least one work details that can be performed by one manufacture work machine to a maximum extent may be dealt with as one manufacture work, or at least one work details may be deals with as one manufacture work so as to include any one of the work details relating to the mounting work and the work details relating to the auxiliary work which is auxiliary relative to the mounting work. Here, the auxiliary work relative to the mounting work includes a work performed prior to the mounting work, a work performed on an article on which the mounting work has been performed.

To be more specific, the LED lamp 252 is constituted by the following eight constituent components: the terminal socket 254, the terminal 256, the casing 258, the circuit board 260, the heat sink 262, the LED board 264, the screw 266, and the cover 268. These eight constituent components are arranged as shown in FIG. 15 when arranged in the mounting order. The work element to be performed on the terminal socket 254 that is to be first mounted includes supplying of the terminal sockets 254 and holding and releasing of the terminal socket 254. The work element to be performed on the terminal 256 that is next mounted includes supplying of the terminals 256 and holding and releasing of the terminal 256. For the other constituent components, the work element to be performed on each of the casing 258, the circuit board 260, and the LED board 264 includes supplying of the constituent components 258, 260, 264 and holding and releasing of the same 258, 260, 264. The work element to be performed on the screw 266 includes supplying of the screws 266 and holding and screwing of the screw 266. The work element to be performed on each of the heat sink 262 and the cover 268 includes application of the adhesive to the position on which the constituent component 262, 268 is mounted, supplying of the same 262, 268, holding and releasing of the same 262, 268, and drying of the adhesive. For each of at least one of the plurality of the work elements, the work details shown in FIG. 15 are determined. It is noted that the conveyance work is necessary for each constituent component. However, because the conveyance work is necessary for all of the constituent components, the conveyance work is not described in FIG. 15.

Next, at least one successive work details in the series of the plural sorts of work details shown in FIG. 15 are dealt with as one manufacture work, whereby the series of the plural sorts of work details are put together into at least one manufacture work. In this instance, in the present assembling system, at least one work details that can be performed by one manufacture work machine to a maximum extent are dealt with as one manufacture work. More specifically, the work details with respect to the terminal socket 254 and the work details with respect to the terminal 256 are successive, and both of the work details include the mounting work. Here, only one mounter can be installed on one manufacture work machine. Where the one mounter is configured to mount only one kind of the component, the work details with respect to the terminal socket 254 and the work details with respect to the terminal 256 cannot be performed by one manufacture work machine. Accordingly, the work details with respect to the terminal socket 254 are dealt with as one manufacture work, and the work details with respect to the terminal 256 are dealt with as one manufacture work. Similarly, the work details with respect to the casing 258 are dealt with as one manufacture work, and the work details with respect to the circuit board 260 are dealt with as one manufacture work.

The work details with respect to the heat sink 262 include the mounting work and two sorts of the auxiliary works relative to the mounting work. Only one auxiliary head device that is capable of performing the auxiliary work relative to the mounting work can be installed on one manufacture work machine. Accordingly, all of the work details with respect to the heat sink 262 cannot be performed by one manufacture work machine. Therefore, three sorts of the work details with respect to the heat sink 262 except the drying work of the adhesive are dealt with as one manufacture work, and the drying work of the adhesive among the work details with respect to the heat sink 262 is performed in next manufacture work. In other words, the drying work of the adhesive among the work details with respect to the heat sink 262 and the work details with respect to the LED board 264 are dealt with as one manufacture work. The work details with respect to the screw 266 that is to be next mounted include the mounting work, but the auxiliary work relative to the mounting work is not included. Accordingly, only the work details with respect to the screw 266 can be dealt with as one manufacture work. However, the work details with respect to the cover 268 that is to be next mounted include the mounting work and two sorts of the auxiliary works relative to the mounting work, and all of the work details with respect to the cover 268 cannot be dealt with as one manufacture work. Therefore, one of the two sorts of the auxiliary works among the work details with respect to the cover 268 and the work details with respect to the screw 266 are dealt with as one manufacture work, and three sorts of the work details with respect to the cover 268 except for the one of the sorts of the auxiliary works are dealt with as one manufacture work.

That is, in the LED-lamp assembling system, one manufacture work machine basically performs the mounting work of one kind of the component. Where the auxiliary work relative to the mounting work is necessary, the series of the plural sorts of the work details are put together into a plurality of manufacture works, such that the mounting work of the one kind of the component and one sort of the auxiliary work are performed. The thus obtained manufacture works are the following eight manufacture works: (i) placing of the terminal sockets 254 on a conveyor; (ii) mounting of the terminal 256 into the terminal socket 254; (iii) fitting of the casing 258 onto the terminal socket 254; (iv) mounting of the circuit board 260 into the casing 258; (v) fixing of the heat sink 262 to the upper end portion of the casing 258 by the adhesive; (vi) drying of the adhesive and mounting of the LED board 264 onto the upper end surface of the heat sink 262; (vii) screw fastening of the LED board 264 and application of the adhesive to the upper end portion of the heat sink 262; and (viii) mounting of the cover 268 onto the upper end portion of the heat sink 262 and drying of the adhesive. Accordingly, the number of the manufacture work machines required for the LED-lamp assembling system is eight.

To construct the LED-lamp assembling system constituted by the eight manufacture work machines, eight main apparatuses are necessary, and the work-element performing apparatuses to be installed on each of the eight main apparatuses are necessary. That is, when or before the work-element-performing-apparatus preparing step in which the work-element performing apparatuses to be installed on the respective main apparatuses are prepared is carried out, it is required to carry out a work-element-performing-apparatus determining step of determining the work-element performing apparatuses necessary for the respective main apparatuses. This work-element-performing-apparatus determining step may be included in the work-element-performing-apparatus preparing step or may be different from the work-element-performing-apparatus preparing step. In the work-element-performing-apparatus determining step, there are carried out: a work-element-performing-apparatus-type determining step in which the type of the work-element performing apparatus is determined; and a specific-work-element-performing-apparatus determining step in which one work-element performing apparatus suitable for the work is determined among the determined type of the work-element performing apparatuses. In the work-element-performing-apparatus-type determining step, the type of the work-element performing apparatus is determined on the basis of the work details to be performed or on the basis of the work element that constitute the work details. To be more specific, where the mounting work needs to be performed, the mounter is employed. Where the supplying work needs to be performed, the supplier is employed. Even where the type of the work-element performing apparatus that is to be employed is determined, one type of the work-element performing apparatus includes a plurality of work-element performing apparatuses. That is, as the supplier, there exist a plurality of suppliers which differ in the supplying manner, the supplying capabilities, the maker of the suppliers, etc. Accordingly, in the specific-work-element-performing-apparatus determining step, the work-element performing apparatus to be installed on the main apparatus is determined from among the plurality of apparatuses. The thus determined specific work-element performing apparatus is prepared in the work-element-performing-apparatus preparing step. However, there may be an instance in which the determined specific work-element performing apparatus is not commercially available. In such an instance, the user himself may produce the determined specific work-element performing apparatus for preparation.

The method of determining the work-element performing apparatuses is already explained in detail. Accordingly, there will be briefly explained a method of determining the work-element performing apparatuses necessary for the manufacture work machine configured to perform a placing work of placing the terminal sockets 254 on the conveyor, as the manufacture work. In the manufacture work machine configured to perform the placing work of the terminal sockets 254 on the conveyor, a supplying work of the terminal sockets and a conveyance work of the terminal sockets are performed. Accordingly, in the work-element-performing-apparatus-type determining step, the supplier, the mounter, and the conveyor are employed as the work-element performing apparatuses to be installed on the first main apparatus. In the specific-work-element-performing-apparatus determining step, the work-element performing apparatus is determined on the basis of the specifications of the constituent component as explained above. More specifically, as the mounter, namely, as the work head device, a specific mounter of the suction type is determined on the basis of the specifications of the terminal socket to be held and released. As the conveyor, a specific double conveyor is determined on the basis of the specifications of the terminal socket to be conveyed. As the supplier, a specific supplier of the tray unit type is determined on the basis of the specifications of the terminal socket to be supplied.

Where the auxiliary work relative to the mounting work is necessary as the work details, for instance, the work-element performing apparatus that is capable of performing the auxiliary work is first determined. That is, the type of the work-element performing apparatus to perform the auxiliary work is determined on the basis of details of the auxiliary work. Where the drying work of the adhesive is necessary, the type of the apparatus is determined to be the one that applies hot air or the like. Where the screw fastening work is necessary; the type of the apparatus is determined to be the one that performs screw fastening. A specific work-element performing apparatus is determined from among the work-element performing apparatuses of the determined type in consideration of the capabilities of the apparatus. As the apparatus capable of performing the drying work by applying the hot-air or the like, a specific blower is determined in consideration of the temperature of the air to be applied, the amount of the air to be applied, etc. As the apparatus capable of performing the screw fastening work, a specific screw fastening apparatus is determined in consideration of the torque upon screw fastening, etc. In determining the work-element performing apparatuses, optimum work-element performing apparatuses can be selected by determining the work-element performing apparatuses to be installed on the main apparatus on the basis of the performable-motion information of each work-element performing apparatus. As the performable-motion information utilized in determining the work-element performing apparatuses, there may be utilized the performable-motion information stored in the central control device or the performable-motion information stored or described in other media.

Figure 16:
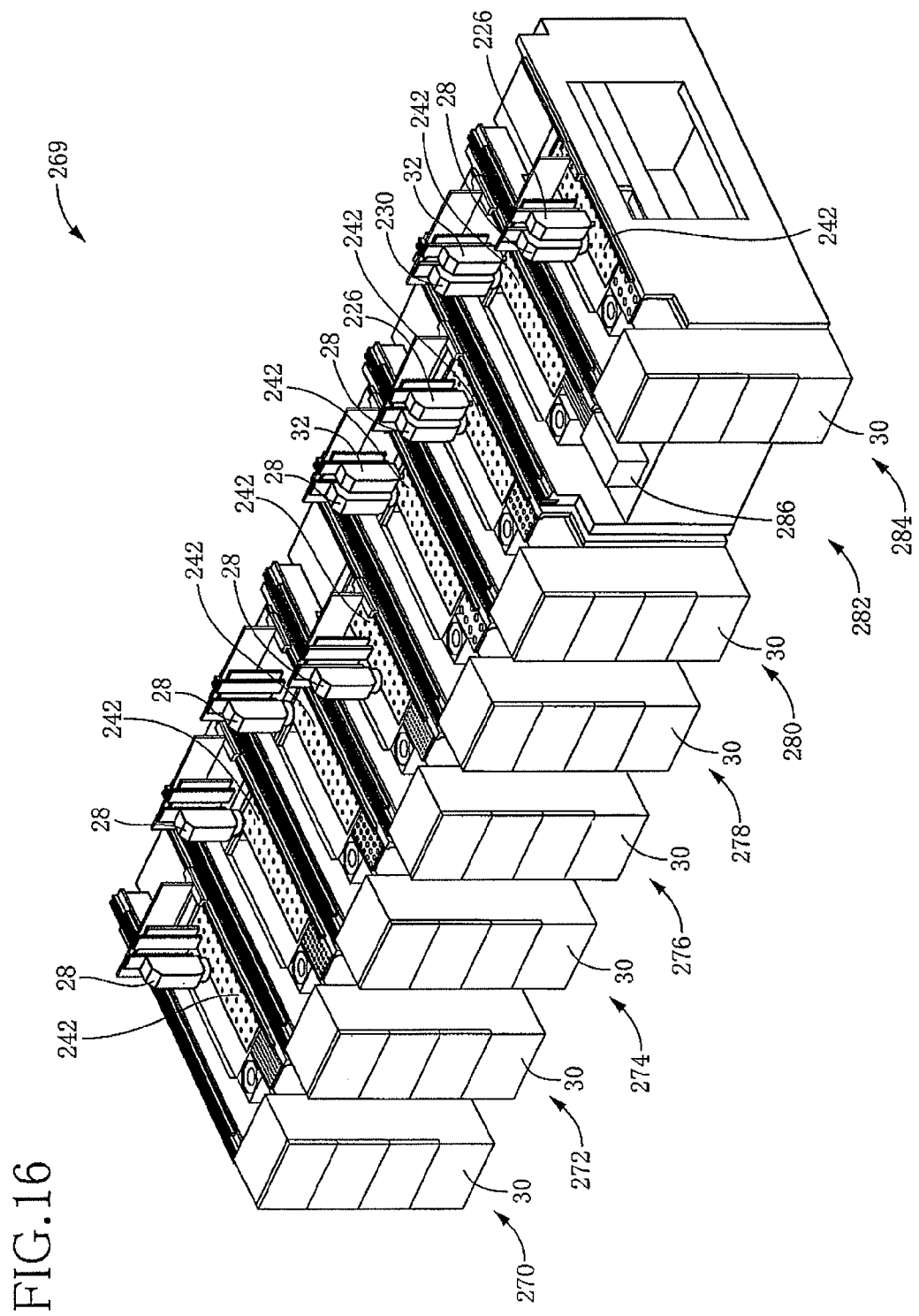
FIG. 16 is a perspective view showing an LED-lamp assembling system for assembling the LED lamp of FIG. 14.

The LED-lamp assembling system 269 shown in FIG. 16 is constructed by preparing, according to various ways described above, the eight main apparatuses and the plurality of work-element performing apparatuses to be installed on each of the eight main apparatuses determined as described above and by carrying out the work-element-performing-apparatus installing step. The eight manufacture work machines that constitute the LED-lamp assembling system 269 are a first manufacture work machine 270, a second manufacture work machine 272, a third manufacture work machine 274, a fourth manufacture work machine 276, a fifth manufacture work machine 278, a sixth manufacture work machine 280, a seventh manufacture work machine 282, and an eighth manufacture work machine 284, which are arranged in this order from the upstream side (the left-hand side in FIG. 16). In each of the first manufacture work machine 270, the second manufacture work machine 272, the third manufacture work machine 274, and the fourth manufacture work machine 276, the double conveyer 242 of the module type is used in place of the conveyor 26 used in the above-described manufacture work machine 12, and the dispenser 32 is detached. In the fifth manufacture work machine 278, the double conveyer 242 of the module type is used in place of the conveyor 26 used in the above-described manufacture work machine 12. In each of the sixth manufacture work machine 280 and the eighth manufacture work machine 284, the double conveyer 242 and the hot-air blower 226 are used in place of the conveyor 26 and the dispenser 32 of the above-described manufacture work machine 12, respectively. In the seventh manufacture work machine 282, the double conveyer 242, the screw attaching/fastening device 230, and a screw supplier 286 are used in place of the conveyor 26, the mounter 28, and the supplier 30 of the above-described manufacture work machine 12, respectively.

The application positions of the adhesive in the manufacture steps of the present LED lamp 252 are the upper end face of the casing 258 and the upper end face of the heat sink 262. Accordingly, as the apparatus to perform the adhesive application work, the dispenser 32 without a function of changing the angle off the dispenser nozzle 76 is employed. However, as the apparatus to perform the adhesive application work, it is possible to employ a dispenser having such a function on the assumption that the adhesive application work of applying the adhesive to the circumferential surface of the casing 258 or the like will be required due to future design changes, etc.

Alternatively, it is possible to employ a conveyor capable of changing the angle of the casing 258, etc., on the conveyor, in expectation of the adhesive application work on the circumferential surface of the casing 258 or the like. That is, in the step of preparing the work-element performing apparatuses, at least one of the auxiliary head device and the conveyor may be prepared by taking account of the position at which the auxiliary head device to perform the auxiliary work operates, the direction in which the auxiliary head device operates, the angle at which the auxiliary head device operates, etc.

To the central control device of each of the manufacture work machines 270-284 (hereinafter the manufacture work machines 270-284 are collectively referred to as "manufacture work machine 270, etc., where appropriate), there is inputted the source data corresponding to the manufacture work to be performed by each manufacture work machine 270, etc. Because the inputting of the source data has been already explained in detail, only the source data relating to the first manufacture work machine 270 among the eight manufacture work machines will be explained here. The source data to be inputted to the first manufacture work machine 270 is composed of the basic codes shown in FIG. 17, the unit-work codes shown in FIG. 18, and the motion codes shown in FIG. 19. The plurality of codes are inputted to the central control device of the first manufacture work machine 270. The plurality of codes are formed based on the manufacture work performed by the first manufacture work machine 270, the plural sorts of work details that constitute the manufacture work, and at least one work element that constitutes each of the plural sorts of work details. The manufacture work of the first manufacture work machine 270 is placing of the terminal socket 254 on the conveyor. According to the source data shown in FIGS. 17-19, twenty terminal sockets are placed. That is, in the LED-lamp assembling system 269, twenty LED lamps can be manufactured in one cycle.

The manufacture work of the first manufacture work machine 270 includes the following three sorts of work details: supplying of the terminal sockets 254 (supplying work); placing of the terminal socket 254 (placing work); and conveyance of the terminal sockets 254 (conveyance work) as explained above. In the three sorts of work details, the supplying work is performed once at the beginning of the manufacture work and the conveyance work is performed once at the end of the manufacture work, but the placement work is repeatedly performed on each of the twenty terminal sockets 254. The work element that constitutes the supplying work is supplying by the supplier, and the work element that constitutes the conveyance work is conveyance by the conveyor. In the placing work, the terminal socket 254 needs to be held and released by the mounter, and a holding position at which the terminal socket 254 is held and a releasing position at which the terminal socket 254 is released need to be changed. Further, information as to holding needs to be obtained. Accordingly, the work element that constitutes the placing work includes the holding and releasing by the mounter, the movement of the holding position and the releasing position by the moving device, and the obtaining of the information as to the holding by the camera device. That is, the placing work includes three kinds of the work elements. The placing work that includes the three kinds of the work elements and that is repeatedly performed twenty times is desirably constituted by unit-work codes constituted by a plurality of motion codes so as to simplify the source data. In view of this, in the first manufacture work machine 270, the unit-work codes include the following three unit-work codes as shown in FIG. 18: a terminal-socket placement code corresponding to the placing work; a terminal-socket supply code corresponding to the supplying work; and a terminal-socket send-out code corresponding to the conveyance work. That is, the plural sorts of work details correspond to the respective unit-work codes.

Each unit-work code includes at least one motion code. Each motion code is constituted by: the work element corresponding to the work details that constitute the unit-work code; and the work-element performing apparatus for performing the work element. More specifically, as shown in FIG. 19, the terminal-socket supply code is constituted by a motion code for supplying, by the supplier 30, the component tray on which the terminal sockets 254 are placed. The terminal-socket send-out code is constituted by a motion code for conveying, by the double conveyor 242, the terminal sockets 254 placed on the conveyor to the second manufacture work machine 272. The terminal-socket placement code is constituted by a motion code for moving, by the moving device 40, the mounter 28 to a supply position at which the terminal socket 254 is supplied, a motion code for holding, by the mounter 28, the terminal socket 254, a motion code for moving, by the moving device 40, the mounter 28 that holds the terminal socket 254 above the base camera 34, a motion code for taking an image of the terminal socket 254 held by the mounter 28 by the base camera 34 and obtaining the information as to the hold state, a motion code for moving, by the moving device 40, the mounter 28 to a position at which the terminal socket 254 is placed on the basis of the information as to the hold state, and a motion code for releasing the terminal socket 254. The process of the manufacture work is divided into a plurality of parts and each of the divided parts is encoded so as to provide the basic code. That is, the manufacture work corresponds to a plurality of basic codes. In the first manufacture work machine 270, one basic code corresponds to one sort of the work details as shown in FIG. 18. The basic codes are formed as shown in FIG. 17. The basic codes may be formed such that one basic code is constituted by plural sorts of the work details.

With respect to each of the thus formed plurality of motion codes, there are inputted: the work-element code in which the work element is encoded; and the apparatus-identifying code by which is identified the work-element performing apparatus capable of performing the work element, as shown in FIG. 19. There are further inputted: the unit-work code constituted by the motion codes as shown in FIG. 18; and the basic code corresponding to each unit-work code as shown in FIG. 17. Thus, the first manufacture work machine 270 is capable of performing the manufacture work in which the terminal sockets 254 are placed on a specific position on the double conveyor 242. That is, the plurality of motion commands are formed on the basis of the source data shown in FIGS. 17-19, and the plurality of work-element performing apparatuses installed on the first manufacture work machine 270 operate by the plurality of motion commands.

More specifically, in the first manufacture work machine 270, there are sequentially transmitted: a motion command for supplying a tray on which the terminal sockets 254 are placed; a motion command for moving the mounter 28 to a position at which the terminal socket 254 is supplied; a motion command for holding the terminal socket 254 placed on the tray; a motion command for moving the mounter 28 that holds the terminal socket 254 above the base camera 34; a motion command for taking, by the base camera 34, an image of the terminal socket 254 held by the mounter 28 and obtaining information as to the hold state of the terminal socket 254; a motion command for moving the mounter 28 to a specific position above the double conveyer 242; a motion command for releasing the terminal socket 254 at the specific position on the double conveyer 242; and a motion command for conveying the terminal socket 254 placed on the double conveyer 242. The work-element performing apparatuses 242, etc., perform their work elements in accordance with the corresponding motion commands, whereby the terminal sockets 254 are placed on the double conveyer 242 and the placed terminal sockets 254 are conveyed to the second manufacture work machine 272. For manufacturing twenty LED lamps in one cycle, some of the motion commands are repeated twenty times. For simplifying the explanation, the motion commands for manufacturing one LED lamp will be explained in the explanation of the motion commands of the first manufacture work machine 270 and the subsequent manufacture work machines. Since the motion commands to the camera device 38, the moving device 40, and the double conveyer 242 are substantially the same in each of the manufacture work machines 270, etc., an explanation of those motion commands are dispensed with.

The second manufacture work machine 272 is configured to perform a manufacture work for mounting the terminal 256 onto the terminal socket 254 as a base member. In the second manufacture work machine 272, there are sequentially transmitted: a motion command for supplying a tray on which the terminal 256 is placed: a motion command for holding the terminal 256 placed on the tray; and a motion command for releasing the terminal 256 in the terminal socket 254, whereby the respective work elements are performed, so that the terminal sockets 254 onto each of which the terminal 256 has been mounted are conveyed to the third manufacture work machine 274. The third manufacture work machine 274 is configured to perform a manufacture work for mounting the casing 258 into the terminal socket 254 onto which the terminal 256 has been mounted. The fourth manufacture work machine 276 is configured to perform a manufacture work for mounting the circuit board 260 into the casing 258. Since the motion commands in each of the third manufacture work machine 274 and the fourth manufacture work machine 276 are similar to the motion commands in the above-described second manufacture work machine 272, an explanation thereof is dispensed with.

The fifth manufacture work machine 278 is configured to perform a manufacture work for fixing the heat sink 262 to the upper end portion of the casing 258 by the adhesive. In the fifth manufacture work machine 278, there are sequentially transmitted: a motion command for applying the adhesive to the upper end portion of the casing 258; a motion command for supplying a tray on which the heat sink 262 is placed; a motion command for holding the heat sink 262 placed on the tray; and a motion command for releasing the heat sink 262 at the upper end portion of the casing 258 to which the adhesive has been applied, whereby the respective work elements are performed, so that the LED lamps 252 in each of which the fixing work of the heat sink 262 by the adhesive has been completed are conveyed to the sixth manufacture work machine 280.

The sixth manufacture work machine 280 is configured to perform a manufacture work for drying the adhesive applied in the fifth manufacture work machine 278 and for placing the LED board 264 onto the upper end face of the heat sink 262. In the sixth manufacture work machine 280, there are sequentially transmitted; a motion command for drying the adhesive by which the casing 258 and the heat sink 262 are bonded; a motion command for supplying a tray on which the LED board 264 is placed; a motion command for holding the LED board 264 placed on the tray; and a motion command for releasing the LED board 264 onto the upper end face of the heat sink 262, whereby the respective work elements are performed, so that the LED lamp 252 in which the drying work and the placing work of the LED board 264 have been completed is conveyed to the seventh manufacture work machine 282. In the motion command for drying the adhesive, the main command is for commanding initiation of application of hot air by the hot-air blower 226 while the associated command is for commanding a blow time. As the associated command, there may be employed various motion parameters such as a blow temperature, a blow direction, and a blow force.

The seventh manufacture work machine 282 is configured to perform a manufacture work for fixing the LED board 264 to the heat sink 262 by the screw 266 and for applying, to the heat sink 262, the adhesive for fixing the cover 268 to be mounted in the eighth manufacture work machine 284. In the seventh manufacture work machine 282, there are sequentially transmitted: a motion command for supplying the screw 266; a motion command for holding the screw 266 supplied by the screw supplier 286; a motion command for performing screw fastening; a motion command for releasing the screw 266; and a motion command for applying the adhesive to the upper end of the heat sink 262, whereby the respective work elements are performed, so that the LED lamp 252 in which the screw fastening work and the adhesive application work have been completed is conveyed to the eighth manufacture work machine 284. In the motion command for performing the screw fastening, the main command is for commanding initiation of the screw fastening while the associated command is for commanding a time of the screw fastening. As the associated command, there may be employed various motion parameters such as a rotation speed, a rotation torque, etc., in the screw fastening.

The eighth manufacture work machine 284 is configured to perform a manufacture work for mounting the cover 268 to the position at which the adhesive has been applied in the seventh manufacture work machine 278 and for drying the adhesive. In the eighth manufacture work machine 284, there are sequentially transmitted: a motion command for supplying a tray on which the cover 268 is placed; a motion command for holding the cover 268 placed on the tray: a motion command for releasing the cover 268 at the position on the heat sink 262 to which the adhesive has been applied; and a motion command for drying the adhesive, whereby the respective work elements are performed, so that the finished LED lamp 252 is conveyed out of the eighth manufacture work machine 284.

ii) Power-Module Assembling System

Figure 20:
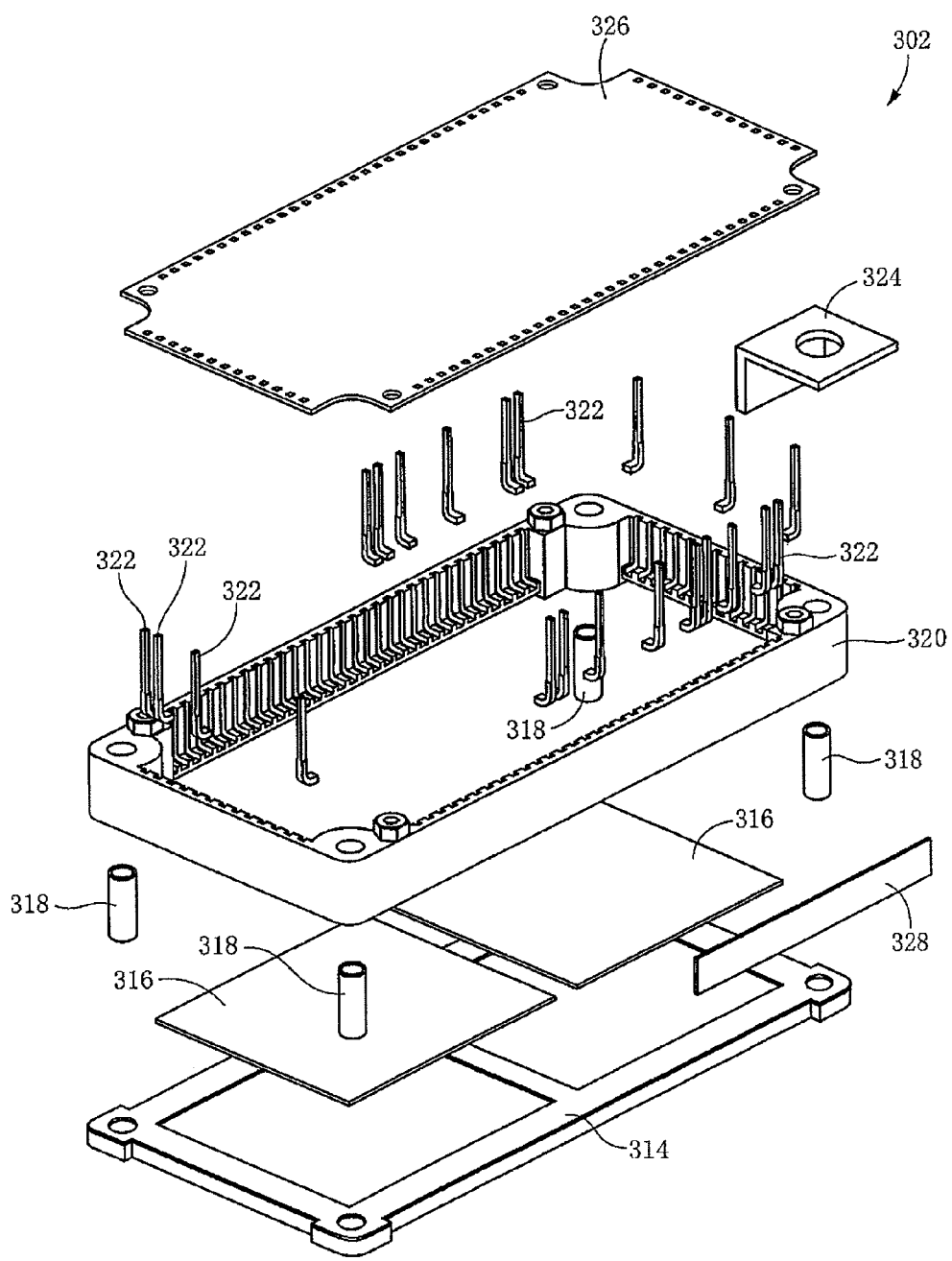
FIG. 20 is an exploded view of a power module.

FIG. 20 is an exploded view of a power module 302. As shown in FIG. 20, the power module 302 is constituted by: a base plate 314; an insulation substrate 316 soldered to the base plate 314; four bushings 318 fitted into respective four holes formed at respective four corners of the base plate 314; a casing 320 fixed onto the base plate 314 by the four bushings 318; a plurality of pin terminals 322 attached to the casing 320; a terminal 324 mounted into the casing 320; a lid 326 covering an upper portion of the casing 320; and a seal 328 attached to a side surface of the casing 320. While not shown, two kinds of auxiliary agents, i.e., silicone gel and epoxy resin, are poured in the casing. In the present system, the insulation substrate 316 is attached to the base plate 314 by soldering in advance, and the manufacture work is performed on the base plate 314 to which the insulation substrate 316 is attached.

As in the above described LED lamp 252, the constituent components of the power module 302 are arranged in the mounting order. The work elements to be performed on the respective constituent components are extracted, and the work details are determined for each work element, as shown in FIG. 21. A series of the plural of sorts of the work details are put together into the following seven manufacture works as shown in FIG. 21, so as to permit one manufacture work machine to perform the mounting work of one kind of the component or the auxiliary work: (i) mounting of the bushings 318 onto the base plate 314 to which the insulation substrate is attached; (ii) mounting of the casing 320 onto the base plate 314 to which the insulation substrate is attached; (iii) mounting of the pin terminals 322 into the casing 320; (iv) mounting of the terminal 324 into the casing 320; (v) ejection of the two kinds of the auxiliary agents into the casing 320; (vi) mounting of the lid 326 onto the casing 320; and (vii) attachment of the seal 328 to the casing 320. Accordingly, to construct a power-module assembling system, seven manufacture work machines are required.

To construct the power-module assembling system constituted by the seven manufacture work machines, there are prepared seven main apparatuses and work-element performing apparatuses to be installed on the respective seven main apparatuses. The method of determining the work-element performing apparatuses necessary for each main apparatus has been already explained in detail, and its explanation is dispensed with. The work-element performing apparatuses necessary for each main apparatus are indicated in FIG. 21. By carrying out the work-element-performing-apparatus installing step and the central-control-device setting step with respect to the thus prepared main apparatuses and work-element performing apparatuses, there is constructed a power-module assembling system 329 shown in FIG. 22. In the manufacture process of the power module 302, it is necessary to perform wire bonding processing on the terminal 324 mounted into the casing 320. Accordingly, the power-module assembling system 329 is constituted by seven manufacture work machines 330-342 and a wire bonding machine 344.

Figure 22:
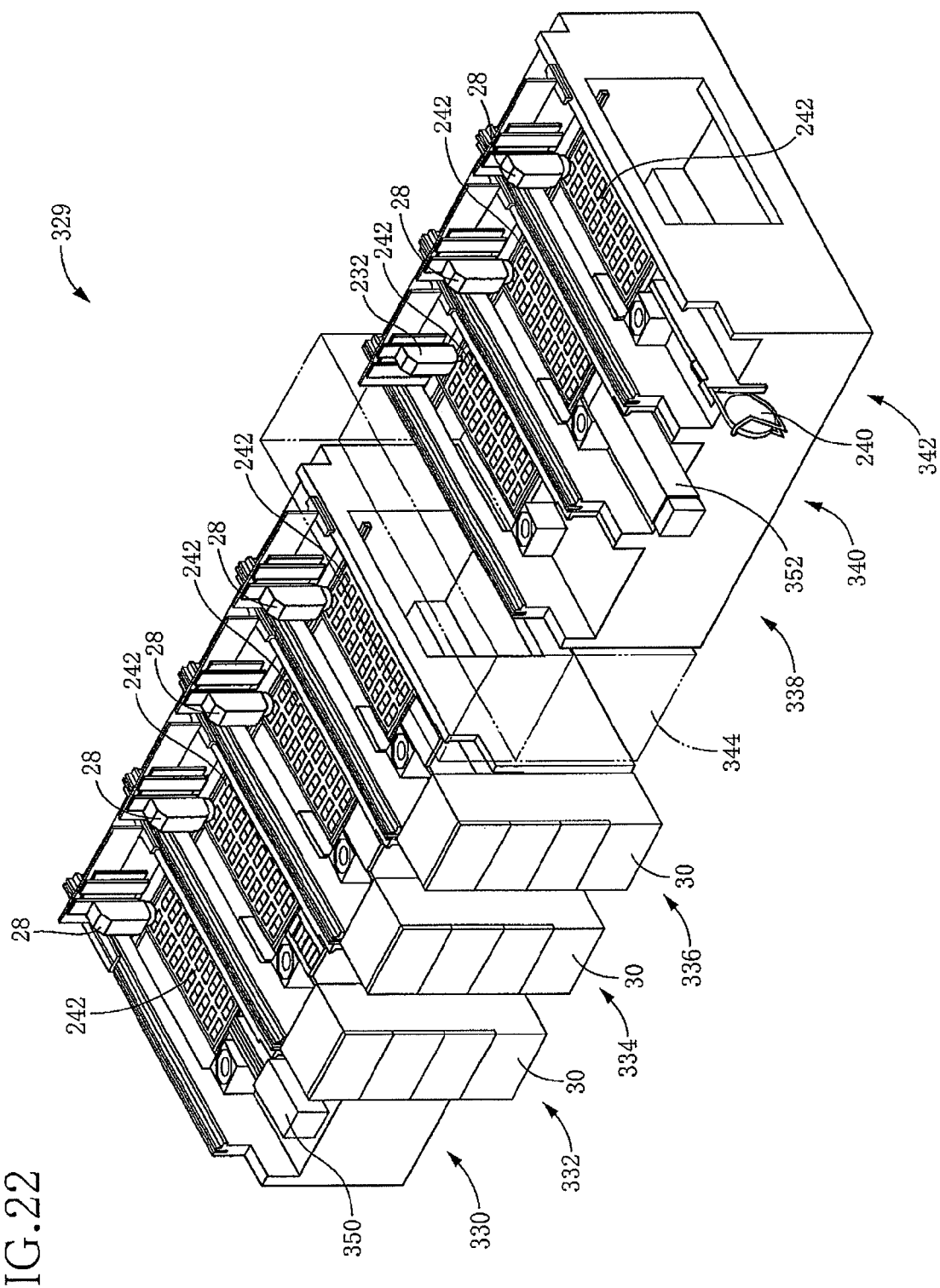
FIG. 22 is a perspective view showing a power-module assembling system for assembling the power module of FIG. 20.

The seven manufacture work machines 330-342 are a first manufacture work machine 330, a second manufacture work machine 332, a third manufacture work machine 334, a fourth manufacture work machine 336, a fifth manufacture work machine 338, a sixth manufacture work machine 340, and a seventh manufacture work machine 342, which are arranged in this order from the upstream side (the left-hand side in FIG. 22). The wire bonding machine 344 which is disposed between the fourth manufacture work machine 336 and the fifth manufacture work machine 338 is not relevant to the present invention and is illustrated by the long dashed double-short dashed line in FIG. 22. In the first manufacture work machine 330, the double conveyer 242 of the module type and a bushing supplier 350 for supplying the bushings 318 are used in place of the conveyor 26 and the supplier 30 of the manufacture work machine 12, respectively, and the dispenser 32 is detached. In each of the second manufacture work machine 332, the third manufacture work machine 334, and the fourth manufacture work machine 336, the double conveyer 242 is used in place of the conveyor 26 of the manufacture work machine 12, and the dispenser 32 is detached. In the fifth manufacture work machine 338, the double conveyer 242 and the double dispenser 232 are used in place of the conveyor 26 and the dispenser 32 of the manufacture work machine 12, respectively, and the mounter 28 and the supplier 30 are detached. In the sixth manufacture work machine 340, the double conveyer 242 and a lid supplier 352 for supplying the lid 326 are used in place of the conveyor 26 and the supplier 30 of the manufacture work machine 12, respectively, and the dispenser 32 is detached. In the seventh manufacture work machine 342, the double conveyer 242 and the tape feeder 240 are used in place of the conveyor 26 and the supplier 30 of the manufacture work machine 12, respectively, and the dispenser 32 is detached.

In the power-module assembling system 329, the base plate 314 to which the insulation substrate 316 is attached is initially fed into the first manufacture work machine 330, and the first manufacture work machine 330 performs a manufacture work for mounting the four bushings 318 into the respective four corners of the base plate 314 to which the insulation substrate 316 is attached. The second manufacture work machine 332 performs a manufacture work for mounting the casing 320 onto the base plate 314 such that the four bushings 318 are fitted into the respective four holes formed at the four corners of the casing 320. The third manufacture work machine 334 performs a manufacture work for attaching the plurality of pin terminals 322 into the casing 320. The fourth manufacture work machine 336 performs a manufacture work for mounting the terminal 324 into the casing 320. When the manufacture work by the fourth manufacture work machine 336 is completed, the wire bonding machine 344 performs the wire bonding processing.

The power module 302 which has been subjected to the wire bonding processing is fed into the fifth manufacture work machine 338. The fifth manufacture work machine 338 is configured to perform a manufacture work for ejecting the two kinds of auxiliary agents, i.e., silicone gel and epoxy resin, into the casing 320. The sixth manufacture work machine 340 is configured to perform a manufacture work for mounting the lid 326 onto the upper portion of the casing 320. The seventh manufacture work machine 342 is configured to perform a manufacture work for attaching the seal 328 to the side surface of the casing 320. When the manufacture work by the seventh manufacture work machine 342 is completed, the finished power module 302 is conveyed out of the seventh manufacture work machine 342. Since the motion commands in the manufacture work machines 330-342 of the present system 329 are similar to the motion commands in the manufacture work machines 270-284 of the above-described LED-lamp assembling system 269, an explanation relating to the motion commands in the present system 329 is dispensed with.

Where there arises a need to manufacture, for some reasons, the power modules 302 in place of the LED lamps 252 in a factory in which the LED lamps 252 are manufactured by the LED-lamp assembling system 269 as explained above, the power-module assembling system 329 can be constructed utilizing most of the manufacture work machines 270-284 that constitute the LED-lamp assembling system 269 without discarding the same 269. To put it concretely, since the second through fourth manufacture work machines 272-276 in the LED-lamp assembling system 269 are the same as the second through fourth manufacture work machines 332-336 in the power-module assembling system 329, the second through fourth manufacture work machines 272-276 can be utilized as they are, in the power-module assembling system 329. The first manufacture work machine 270 in the LED-lamp assembling system 269 is the same as the first manufacture work machine 330 in the power-module assembling system 329 except for the supplier 30. Accordingly, by newly preparing the bushing supplier 350, the first manufacture work machine 270 can be utilized in the power-module assembling system 329. The fifth manufacture work machine 278 in the LED-lamp assembling system 269 is the same as the sixth manufacture work machine 340 in the power-module assembling system 329 except for the dispenser 32 and the supplier 30. Accordingly, by newly preparing the lid supplier 352, the fifth manufacture work machine 278 can be utilized in the power-module assembling system 329. The dispenser 32 is detached. The sixth manufacture work machine 280 in the LED-lamp assembling system 269 is the same as the seventh manufacture work machine 342 in the power-module assembling system 329 except for the supplier 30 and the hot-air blower 226. Accordingly, by newly preparing the tape feeder 240, the sixth manufacture work machine 280 can be utilized in the power-module assembling system 329. The hot-air blower 226 is detached. As the fifth manufacture work machine 338 of the power-module assembling system 329, the main apparatus of the seventh manufacture work machine 282 in the LED-lamp assembling system 269 may be utilized, and the double dispenser 232 is newly prepared. In short, the LED-lamp assembling system 269 can be utilized as the power-module assembling system 329 simply by newly preparing the bushing supplier 350, the lid supplier 352, the double dispenser 232, and the tape feeder 240.

As explained above, in the manufacture system in the present description, the source data can be easily rewritten, and the rewritten source data can be inputted into the central control device, so that it is possible to easily deal with the change of the manufacture work. Moreover, the work-element performing apparatuses 350, etc., to be newly prepared can be easily installed on the main apparatus of the corresponding manufacture work machine owing to employment of the commonly used interfaces. Thus, the manufacture system in the present description can suitably deal with the change of the manufacture work in terms of the cost, the environment, ease, and so on.

iii) Solar-Cell Assembling System

Figure 23:
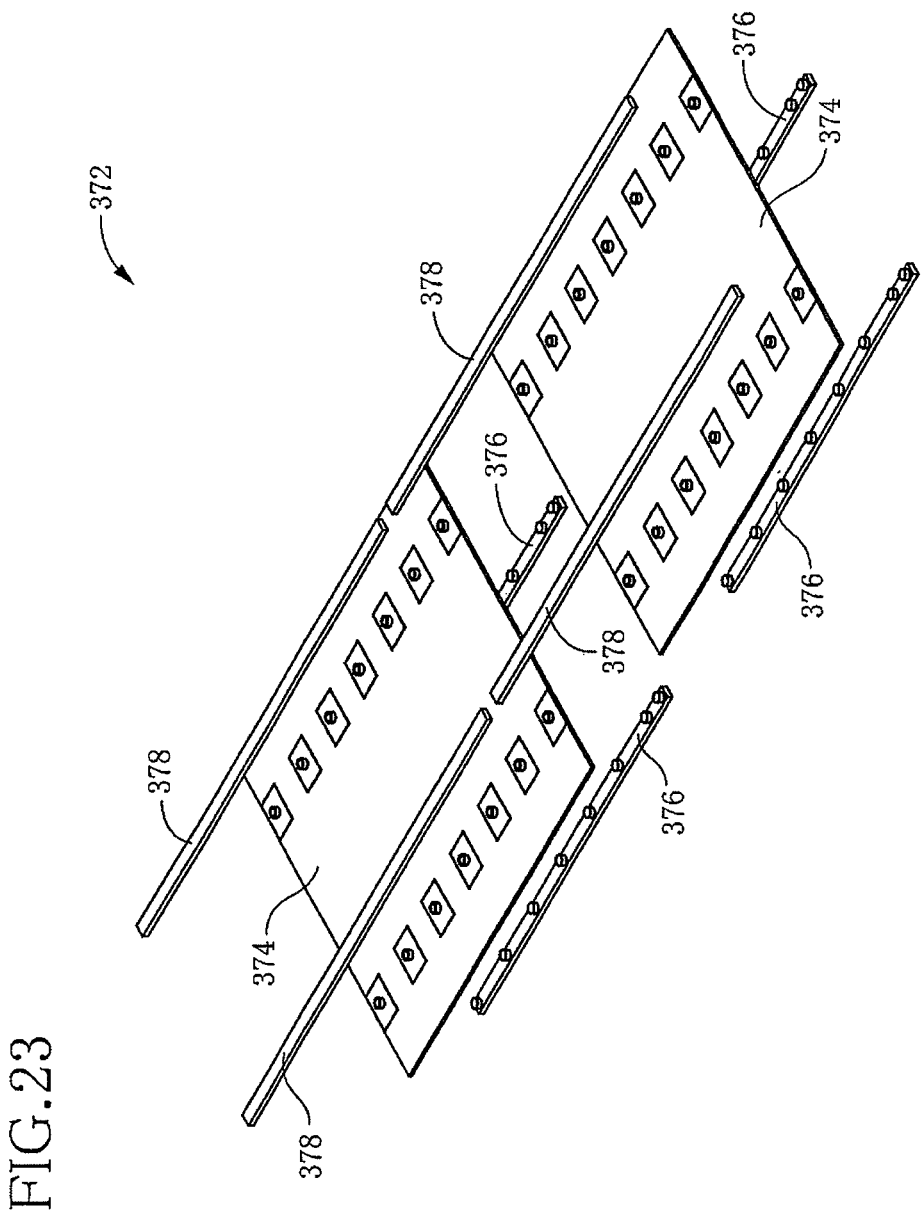
FIG. 23 is an exploded view of a solar cell.

FIG. 23 is an exploded view of a solar cell 372. The solar cell 372 is constituted by: a silicon cell 374; lower interconnectors 376 soldered to a lower surface of the silicon cell 374; and upper interconnectors 378 soldered to an upper surface of the silicon cell 374. As in the LED lamp 252 described above, the constituent components of the solar cell 372 are arranged in the mounting order. The work elements for the respective constituent components are extracted, and the work details for each work element are determined, as shown in FIG. 24. A series of the plural sorts of the work details are put together into the following three manufacture works for permitting one manufacture work machine to perform the mounting work of one kind of the component and the auxiliary work: (i) placing of the lower interconnectors 376 on the conveyor and application of a solder cream onto the lower interconnectors 376; (ii) mounting of the silicon cell 374 onto the lower interconnectors 376 and application of the solder cream onto the silicon cell 374; and (iii) application of the solder cream onto the silicon cell 374 and mounting of the upper interconnectors 378 onto the silicon cell 374. That is, a solar-cell assembling system is constituted by three manufacture work machines. In the present system, the application work of applying the solder cream onto the silicon cell 374 is performed by a second manufacture work machine and a third manufacture work machine for enhancing the throughput.

Figure 25:
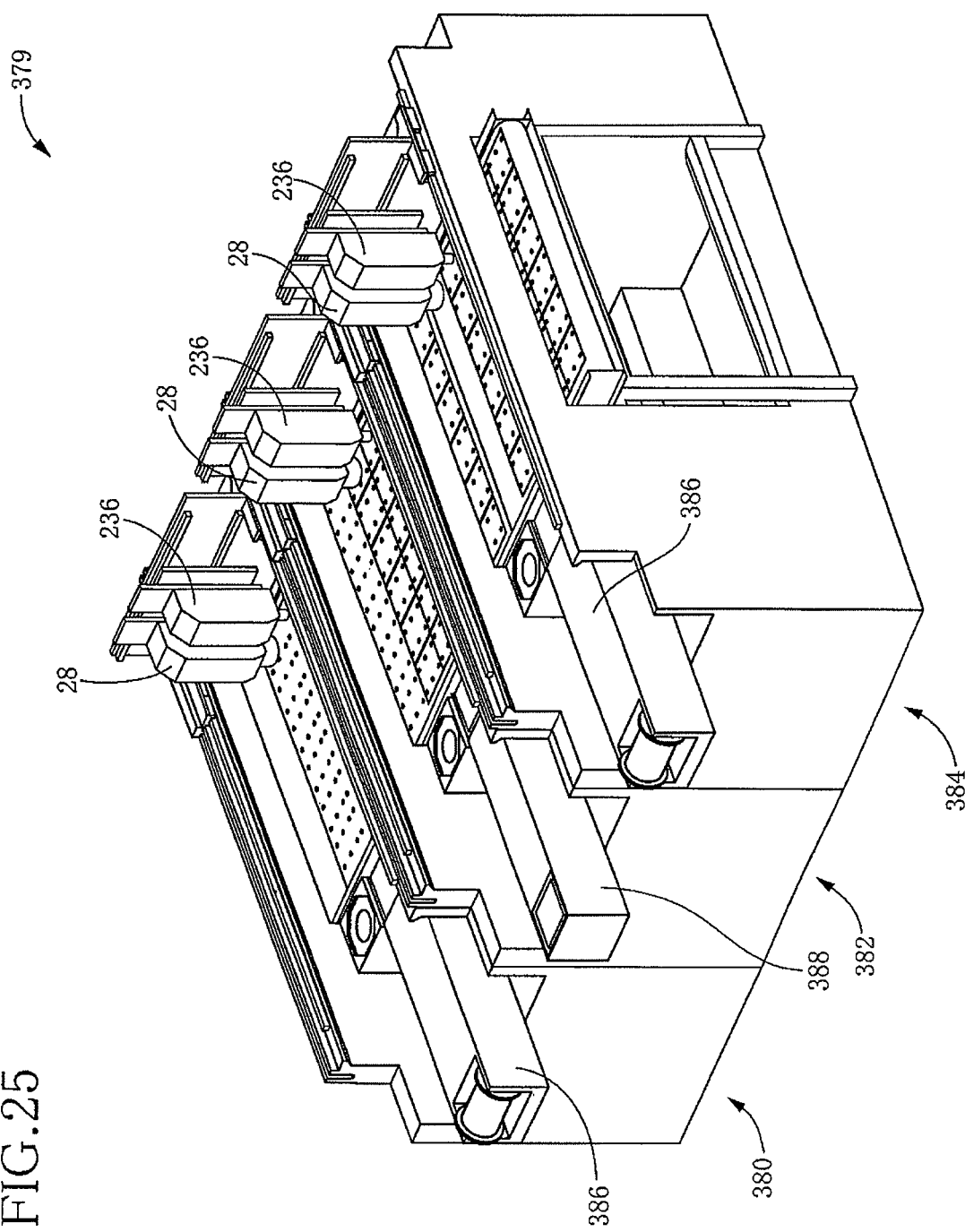
FIG. 25 is a perspective view showing a solar-cell assembling system for assembling the solar cell of FIG. 23.

A solar-cell assembling system 379 is constituted by three manufacture work machines, as shown in FIG. 25. The three manufacture work machines are a first manufacture work machine 380, a second manufacture work machine 382, and a third manufacture work machine 384, which are arranged in this order from the upstream side (the left-hand side in FIG. 25). In the first manufacture work machine 380 and the third manufacture work machine 384, a solder cream printer 236 and an interconnector supplier 386 for supplying interconnectors are used in place of the dispenser 32 and the supplier 30 of the manufacture work machine 12, respectively. In the second manufacture work machine 382, the solder cream printer 236 and a silicon-cell supplier 388 for supplying the silicon cell 374 are used in place of the dispenser 32 and the supplier 30 of the manufacture work machine 12, respectively.

The first manufacture work machine 380 is configured to perform a manufacture work for placing the lower interconnectors 376 to respective specific positions on the conveyor belt 50 of the mounter 26 and for printing solder cream on all portions on the upper surface of each lower interconnector 376 to which the solder cream should be applied. The second manufacture work machine 382 is configured to perform a manufacture work for mounting the silicon cell 374 on the lower interconnectors 376 to which the solder cream has been printed and for printing the solder cream on a part of portions of the upper surface of the silicon cell 374 on which the solder cream should be printed. The third manufacture work machine 384 is configured to perform a manufacture work for printing the solder cream on the rest of the portions of the upper surface of the silicon cell 374 on which the solder cream should be printed and for mounting the upper interconnectors 378 onto the portions on the silicon cell 374 on which the solder cream has been printed. When the manufacture work by the third manufacture work machine 384 is completed, the produced solar cell 372 is conveyed out of the third manufacture work machine 384. Since the motion commands in the manufacture work machines 380-384 in the present system 379 are similar to the motion commands in the manufacture work machines 270-284 in the above-described LED-lamp assembling system 269, an explanation relating to the motion commands in the present solar-cell assembling system 379 is dispensed with.

While the solar-cell assembling system 379 is constituted by the three manufacture work machines 380-384, it is possible to assemble the solar cell 372 by one manufacture work machine. In this instance, the silicon-cell supplier 388 may be installed on the first manufacture work machine 380, for instance. While production capability is low in one manufacture work machine, one manufacture work machine is sufficient at a development stage, for instance, since mass production is not necessary. Where marketing of the solar cell becomes successful and a large number of solar cells are desired to be assembled, the production capability of the solar cell can be increased by establishing the solar-cell assembling system in which three or more manufacture work machines are used. Thus, it is possible to determine the number of the manufacture work machines required in the assembling system in consideration of the production capability of the assembling system.

DESCRIPTION OF REFERENCE SIGNS

10: manufacture system 12: manufacture work machine (assembling work machine) 24: machine main body (main frame)(main apparatus) 26: conveyor (work-element performing apparatus) 28: mounter (work head device)(holding and releasing head device)(work-element performing apparatus) 30: supplier (component supplier)(work-element performing apparatus) 32: dispenser (work head device)(auxiliary head device)(work-element performing apparatus) 38: camera device (work-element performing apparatus) 40: moving device (head moving device)(main frame)(main apparatus) 52: conveyance motor (operating device) 54: tray moving device (operating device) 72: positive/negative pressure supplier (operating device) 78: ejecting device (operating device) 100: mounter control device (individual control device) 104: dispenser control device (individual control device) 108: supplier control device (individual control device) 112: conveyor control device (individual control device) 116: camera-device controller (individual control device) 130: main central control device (central control device)(main apparatus) 136: auxiliary controller (central control device)(main apparatus) 166: circuit substrate (first component) 169: electronic circuit component (second component) 174: work-element-performing-apparatus identifying section 176: central interface section 178: command-transmission processing section 184: source-data-input accepting section 186: source-data storage section 188: motion-command generating section 210: individual interface section 212: identification information storage section (identification information) 218: command converting section 220: high-frequency welder (work-element performing apparatus) 222: laser generator (work-element performing apparatus) 224: UV irradiator (work-element performing apparatus) 226: hot-air blower (work-element performing apparatus) 228: screw fastening device (work-element performing apparatus) 230: screw attaching/fastening device (work-element performing apparatus) 232: double dispenser (work-element performing apparatus) 234: mounter (work-element performing apparatus) 236: solder cream printer (work-element performing apparatus) 240: tape feeder (work-element performing apparatus) 242: double conveyor (work-element performing apparatus) 243: carrier (work-element performing apparatus) 252: LED lamp (product) 269: LED-lamp assembling system (manufacture system) 270: first manufacture work machine 272: second manufacture work machine 274: third manufacture work machine 276: fourth manufacture work machine 278: fifth manufacture work machine 280: sixth manufacture work machine 282: seventh manufacture work machine 284: eighth manufacture work machine 286: screw supplier (work-element performing apparatus) 302: power module (product) 329: power-module assembling system (manufacture system) 330: first manufacture work machine 332: second manufacture work machine 334: third manufacture work machine 336: fourth manufacture work machine 338: fifth manufacture work machine 340: sixth manufacture work machine 342: seventh manufacture work machine 350: bushing supplier (work-element performing apparatus) 352: lid supplier (work-element performing apparatus) 372: solar cell (product) 379: solar-cell assembling system (manufacture work system) 380: first manufacture work machine 382: second manufacture work machine 384: third manufacture work machine

The invention claimed is:

1. A method of constructing a manufacture system for manufacturing one product by sequential manufacture works each of which is performed by each of at least one manufacture work machine, the method comprising:

preparing, for said each of the at least one manufacture work machine, a main apparatus including: (a) a main frame on which are to be installed a plurality of work-element performing apparatuses each of which is configured to perform a corresponding one of a plurality of work elements that constitute a manufacture work as one of the sequential manufacture works, wherein the plurality of work-element performing apparatuses comprises a work head device, a conveyor, and a component supplier; and (b) a central control device configured to control the plurality of work-element performing apparatuses in a centralized manner;

preparing, for said each of the at least one manufacture work machine, the plurality of work-element performing apparatuses;

installing the plurality of work-element performing apparatuses prepared for said each of the at least one manufacture work machine, on the main frame of the main apparatus prepared for said each of the at least one manufacture work machine;

executing setting, via the central control device of the main apparatus prepared for said each of the at least one manufacture work machine, for controlling the plurality of work-element performing apparatuses prepared for said each of the at least one manufacture work machine in the centralized manner and for inputting source data, wherein the source data comprises a plurality of motion codes, and a format of each motion code is common to the work tread device, the conveyor, and the component supplier.

2. The method according to claim 1, wherein preparing the main apparatus includes preparing the main apparatus by a number corresponding to a required number of the at least one manufacture work machine that is determined based on details of an overall work required in manufacturing the one product.

3. The method according to claim 1, wherein preparing the plurality of work-element performing apparatus includes preparing, for said each of the at least one manufacture work machine, the plurality of work-element performing apparatuses that are required for said each of the at least one manufacture work machine and that are determined based on details of the manufacture work which is to be performed by said each of the at least one manufacture work machine.

4. The method according to claim 1,
wherein at least one of the at least one manufacture work machine is an assembling work machine configured to perform, as the manufacture work by the at least one of the at least one manufacture work machine, an assembling work of assembling a plurality of components into an assembled article, the assembling work machine being configured to perform, as at least a part of the assembling work, a work of mounting, onto a first component that is one of the plurality of components, a second component that is another one of the plurality of components,
wherein the plurality of work-element performing apparatuses of each of the at least one of the at least one manufacture work machine that is the assembling work machine includes a conveyor configured to perform, as one of the plurality of work elements, conveyance of at least one of the first component and the assembled article, and
wherein preparing the plurality of work-element performing apparatuses includes preparing, for said each of the at least one of the at least one manufacture work machine that is the assembling work machine, the conveyor determined on the basis of specifications of the at least one of the first component and the assembled article, as one of the plurality of work element performing apparatuses.

5. The method according to claim 1,
wherein at least one of the at least one manufacture work machine is an assembling work machine configured to perform, as the manufacture work by the at least one of the at least one manufacture work machine, an assembling work of assembling a plurality of components into an assembled article and configured to perform, as at least a part of the assembling work, a work of mounting, onto a first component that is one of the plurality of components, a second component that is another one of the plurality of components,
wherein the plurality of work-element performing apparatuses of each of the at least one of the at least one manufacture work machine that is the assembling work machine include at least one work head device for the assembling work each of which is a work head device and each of which is configured to perform a work necessary for mounting the second component onto the first component as one of the plurality of work elements, wherein at least one of the at least one work head device for the assembling work is a holding and releasing head device configured to perform holding and releasing of the second component as the work necessary for mounting the second component onto the first component, and wherein preparing the plurality of work-element performing apparatuses includes preparing, for said each of the at least one of the at least one manufacture work machine that is the assembling work machine, the holding and releasing head device determined on the basis of specifications of the second component, as one of the plurality of work-element performing apparatuses.

6. The method according to claim 1, wherein the central control device of the main apparatus of said each of the at least one manufacture work machine is configured to control the plurality of work-element performing apparatuses in the centralized manner, by sequentially transmitting a plurality of motion commands each of which is a command for one motion to be performed by one of the plurality of work-element performing apparatuses, wherein the central control device of the main apparatus of said each of the at least one manufacture work machine includes: (a) a source-data storage section configured to store source data in which is encoded details of each of the plurality of work elements that is to be performed by each of the plurality of work-element performing apparatuses to perform the manufacture work; (b) a motion-command generating section configured to generate the plurality of motion commands on the basis of the source data; (c) a command-transmission processing section configured to perform transmission processing to transmit the plurality of motion commands generated by the motion-command generating section to said each of the plurality of work-element performing apparatuses; and (d) a source-data-input accepting section configured to accept input of the source data to be stored in the source-data storage section, and wherein executing setting includes inputting the source data to the source-data-input accepting section of the central control device of the main apparatus prepared for said each of the at least one manufacture work machine.

7. The method according to claim 6, wherein the manufacture work performed by said each of the at least one manufacture work machine is constituted by a plurality of unit works each composed of a series of plurality of motions to be performed by at least one of the plurality of work-element performing apparatuses, and wherein the source data to be inputted to the source-data-input accepting section has a hierarchical structure in which are hierarchically arranged: a plurality of unit-work codes which correspond to the plurality of unit works and each of which indicates one of the plurality of unit works; and a plurality of motion-code groups including a plurality of motion codes each of which is associated with one of the plurality of unit-work codes and each of which indicates the series of plurality of motions that are to be performed by the at least one of the plurality of work-element performing apparatuses, the series of plurality of motions constituting one of the plurality of unit works indicated by the associated one of the plurality of unit-work codes.

8. The method according to claim 7, wherein each of the plurality of motion codes includes: an apparatus-identifying code for identifying one of the plurality of work-element performing apparatuses that performs a motion indicated by each of the plurality of motion codes; and a work-element code in which is encoded one of the plurality of work elements to be performed by the one of the plurality of work-element performing apparatuses that is identified by the apparatus-identifying code, and wherein inputting the source data to the source-data-input accepting section includes inputting, for said each of plurality of motion codes, at least the apparatus-identifying code and the work-element code.

9. The method according to claim 7, wherein one of the plurality of motion-code groups that is associated with one of the plurality of unit-work codes and another one of the plurality of motion-code groups that is associated with another one of the plurality of unit-work codes are made common except motion parameters for the series of plurality of motions which are indicated by the plurality of motion codes included in the one and said another one of the plurality of motion-code groups and which are to be performed by the at least one of the plurality of work-element performing apparatuses.

10. A method of constructing a manufacture system for manufacturing one product by sequential manufacture works each of which is performed by each of at least one manufacture work machine, wherein the manufacture system includes a plurality of manufacture machines at the at least one manufacture work machine, wherein in the manufacture system manufacture works by the plurality of manufacture work machines are sequentially performed on a work object while conveying the work object from upstream-side manufacture work machines toward downstream-side manufacture work machines, the method comprising:

preparing, for said each of the at least one manufacture work machine, which includes determining a number of manufacture work machines necessary for the manufacture system, a main apparatus including:

(a) a main frame on which are to be installed a plurality of work-element performing apparatuses each of which is configured to perform a corresponding one of a plurality of work elements that constitute a manufacture work as one of the sequential manufacture works; and (b) a central control device configured to control the plurality of work-element performing apparatuses in a centralized manner;

preparing, for said each of the at least one manufacture work machine, the plurality of work-element performing apparatuses;

installing the plurality of work-element performing apparatuses prepared for said each of the at least one manufacture work machine, on the main frame of the main apparatus prepared for said each of the at least one manufacture work machine; and executing setting, with respect to the central control device of the main apparatus prepared for said each of the at least one manufacture work machine, for controlling the plurality of work-element performing apparatuses prepared for said each of the at least one manufacture work machine in the centralized manner and for inputting source data, wherein the source data comprises a plurality of motion codes, and a format of each motion code is common to the plurality of manufacture machines.

11. The method according to claim 10, wherein determining the number of manufacture work machines includes determining a mounting order of a plurality of constituent components, extracting work elements to be performed with respect to each of the plurality of constituent components, determining work details when at least one work element is performed with respect to each of the plurality of constituent components, and determining at least one manufacture work such that series of the work details are put together into at least one manufacture work.

12. The method according to claim 10, wherein preparing the plurality of work-element performing apparatuses includes determining a work element performing apparatus necessary for each of the manufacture work machines whose number is determined in the manufacture-machine-number determining step.

13. A method of constructing a manufacture system for manufacturing one product by sequential manufacture works each of which is performed by each of at least one manufacture work machine, the method comprising:

preparing, for said each of the at least one manufacture work machine, a main apparatus including: (a) a main frame on which are to be installed a plurality of work-element performing apparatuses each of which is configured to perform a corresponding one of a plurality of work elements that constitute a manufacture work as one of the sequential manufacture works, wherein the plurality of work-element performing apparatuses comprise a work head device, a conveyor, and a component supplier; and (b) a central control device configured to control the plurality of work-element performing apparatuses in a centralized manner;

preparing, for said each of the at least one manufacture work machine, the plurality of work-element performing apparatuses;

installing the plurality of work-element performing apparatuses prepared for said each of the at least one manufacture work machine, on the main frame of the main apparatus prepared for said each of the at least one manufacture work machine;

executing setting, via the central control device of the main apparatus prepared for said each of the at least one manufacture work machine, for controlling the plurality of work-element performing apparatuses prepared for said each of the at least one manufacture work machine in the centralized manner, wherein the central control device of the main apparatus of said each of the at least one manufacture work machine controls the plurality of work-element performing apparatuses in the centralized manner, by sequentially transmitting a plurality of motion commands each of which is a command for one motion to be performed by one of the plurality of work-element performing apparatuses, wherein the central control device of the main apparatus of said each of the at least one manufacture work machine includes: (a) a source-data storage section configured to store source data in which is encoded details of each of the plurality of work elements that is to be performed by each of the plurality of work-element performing apparatuses to perform the manufacture work; (b) a motion-command generating section configured to generate the plurality of motion commands on the basis of the source data; (c) a command-transmission processing section configured to perform transmission processing to transmit the plurality of motion commands generated by the motion-command generating section to said each of the plurality of work-element performing apparatuses; and (d) a source-data-input accepting section configured to accept input of the source data to be stored in the source-data storage section, and wherein executing setting includes inputting the source data to the source-data-input accepting section of the central control device of the main apparatus prepared for said each of the at least one manufacture work machine.

\* \* \* \* \*